United States Patent [19]
Yoshiki et al.

[11] Patent Number: 5,843,236
[45] Date of Patent: Dec. 1, 1998

[54] PLASMA PROCESSING APPARATUS FOR RADIATING MICROWAVE FROM RECTANGULAR WAVEGUIDE THROUGH LONG SLOT TO PLASMA CHAMBER

[75] Inventors: Hiroyuki Yoshiki, Toyonaka; Kazuki Kondo, Izumiohtsu; Akira Ishii, Kawabe-Gun; Shigeki Amadatsu, Ibaraki; Tatsuya Saijo, Osaka-Sayama; Koji Itadani, Amagasaki; Takahiro Aoyama, Suita, all of Japan

[73] Assignee: Daihen Corporation, Japan

[21] Appl. No.: 529,282

[22] Filed: Sep. 15, 1995

[30] Foreign Application Priority Data

Sep. 16, 1994 [JP] Japan ................................ 6-248408

[51] Int. Cl.$^6$ .................................................. C23C 16/00
[52] U.S. Cl. ........................... 118/723 MR; 118/723 ME; 156/345
[58] Field of Search .................. 333/99 PL; 315/111.21, 315/111.41, 111.51, 111.71; 156/345; 118/50.1, 620, 623, 717, 705, 706, 723 MP, 723 MW, 723 ME, 723 MR, 723 MA; 204/298.02, 298.08, 298.16, 298.17, 298.35, 298.37, 298.38; 216/69, 70; 427/571, 575; 438/726, 727, 728, 772

[56] References Cited

U.S. PATENT DOCUMENTS

| | | | |
|---|---|---|---|
| 3,577,207 | 5/1971 | Kirjushin | 315/111.21 |
| 5,292,371 | 3/1994 | Yasui et al. | 118/723 MW |
| 5,315,212 | 5/1994 | Ishii et al. | 118/719 |
| 5,324,553 | 6/1994 | Ovshinsky et al. | 427/571 |
| 5,487,875 | 1/1996 | Suzuki | 422/186.05 |
| 5,517,085 | 5/1996 | Engemann et al. | 315/111.21 |

FOREIGN PATENT DOCUMENTS

| | | |
|---|---|---|
| 0 183 561 | 6/1986 | European Pat. Off. . |
| 0 326 998 A2 | 8/1989 | European Pat. Off. . |
| 0 480 273 | 4/1992 | European Pat. Off. . |
| 0 564 082 A1 | 10/1993 | European Pat. Off. . |
| 0 578 580 A1 | 1/1994 | European Pat. Off. . |
| 42 35 410 A1 | 4/1994 | Germany . |
| 94 05 808.3 | 7/1994 | Germany . |
| 5-335095 | 12/1993 | Japan . |
| 07170122 A | 7/1995 | Japan . |
| 2 142 476 | 1/1985 | United Kingdom . |

*Primary Examiner*—Jeffrey E. Russel
*Attorney, Agent, or Firm*—Scully, Scott, Murphy and Presser

[57] ABSTRACT

In a plasma processing apparatus including a plasma chamber having a narrow window, and a rectangular waveguide for coupling with the plasma chamber, the rectangular waveguide has a long slot disposed in an E-plane thereof so as to oppose the narrow window of the plasma chamber and to extend along a waveguide-axis direction of the rectangular waveguide. There is further provided at least two long slots disposed in at least one rectangular waveguide, and the longitudinal length of each long slot is set to ½ or more of a free-space wavelength of the microwave. Further, the long slots are disposed so as to be parallel to each other such that adjacent long slots are shifted from each other by (2n-1)/4 of the free-space wavelength of the microwave in the waveguide-axis direction of the rectangular waveguide, where n is a natural number.

13 Claims, 39 Drawing Sheets

Fig. 4  Second Preferred Embodiment

Fig. 7  Third Preferred Embodiment

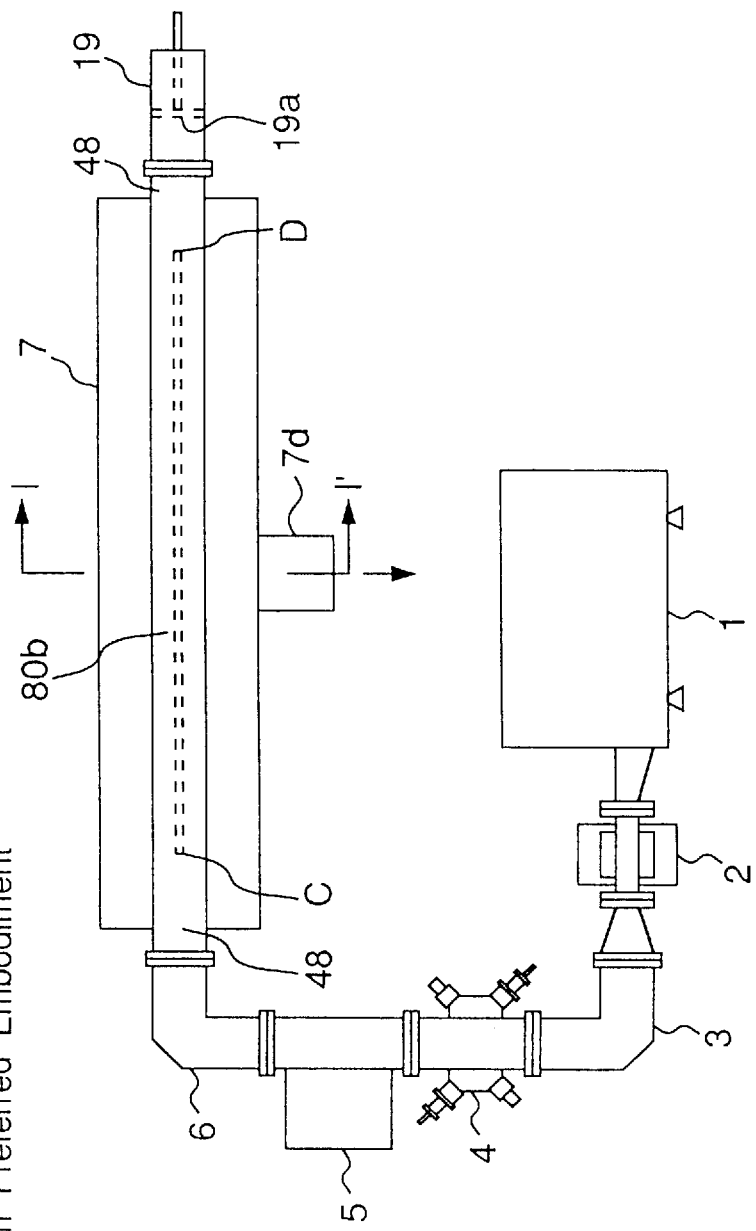

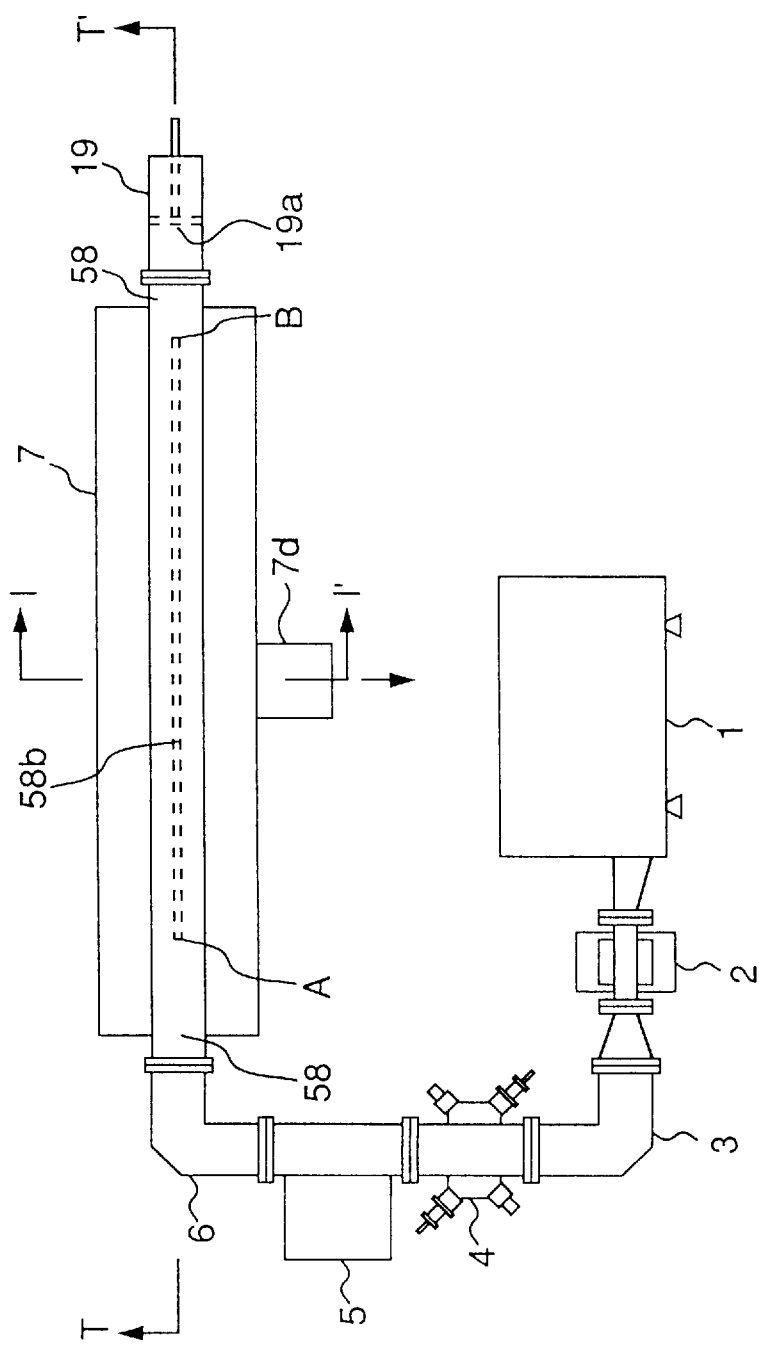
Fig.12 Fifth Preferred Embodiment

Thickness L2 of Dielectric Body 27c

Sixth Preferred Embodiment

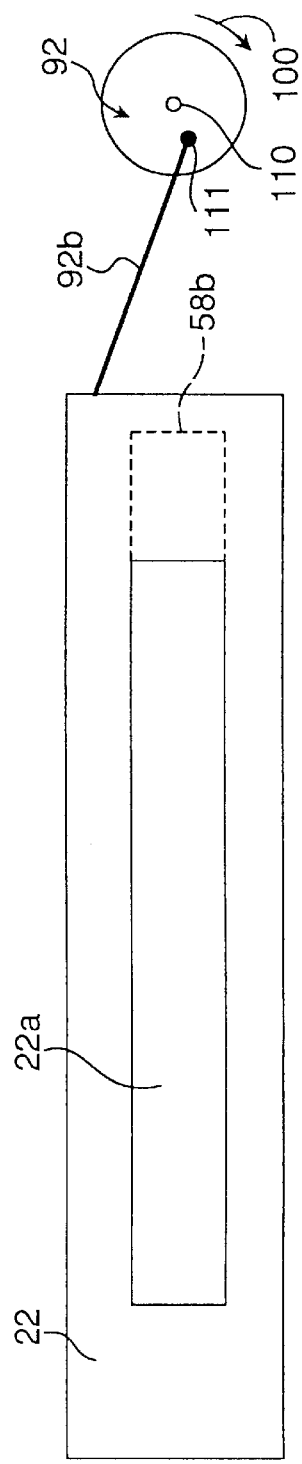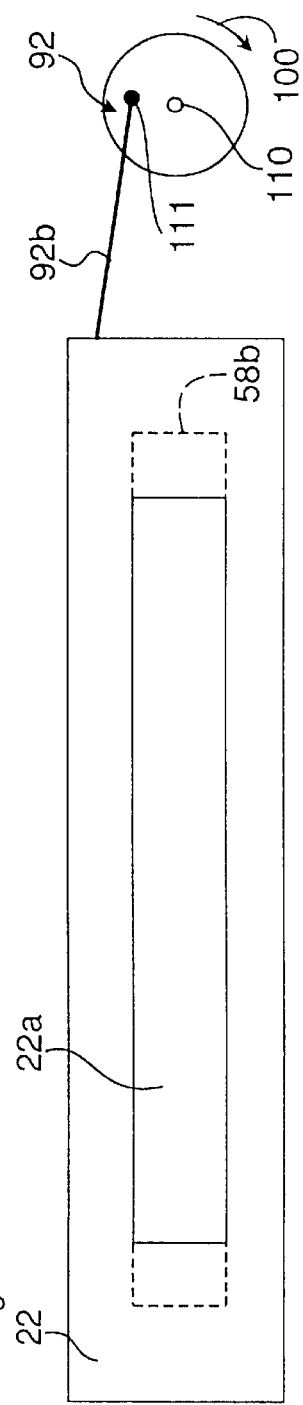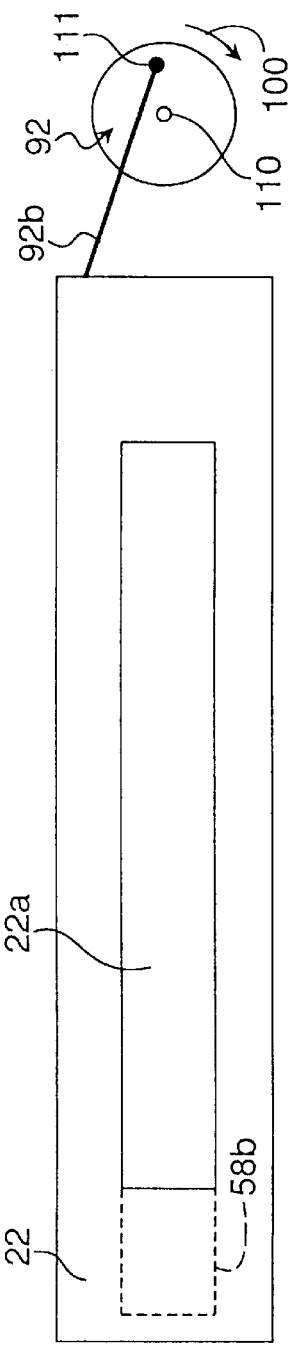

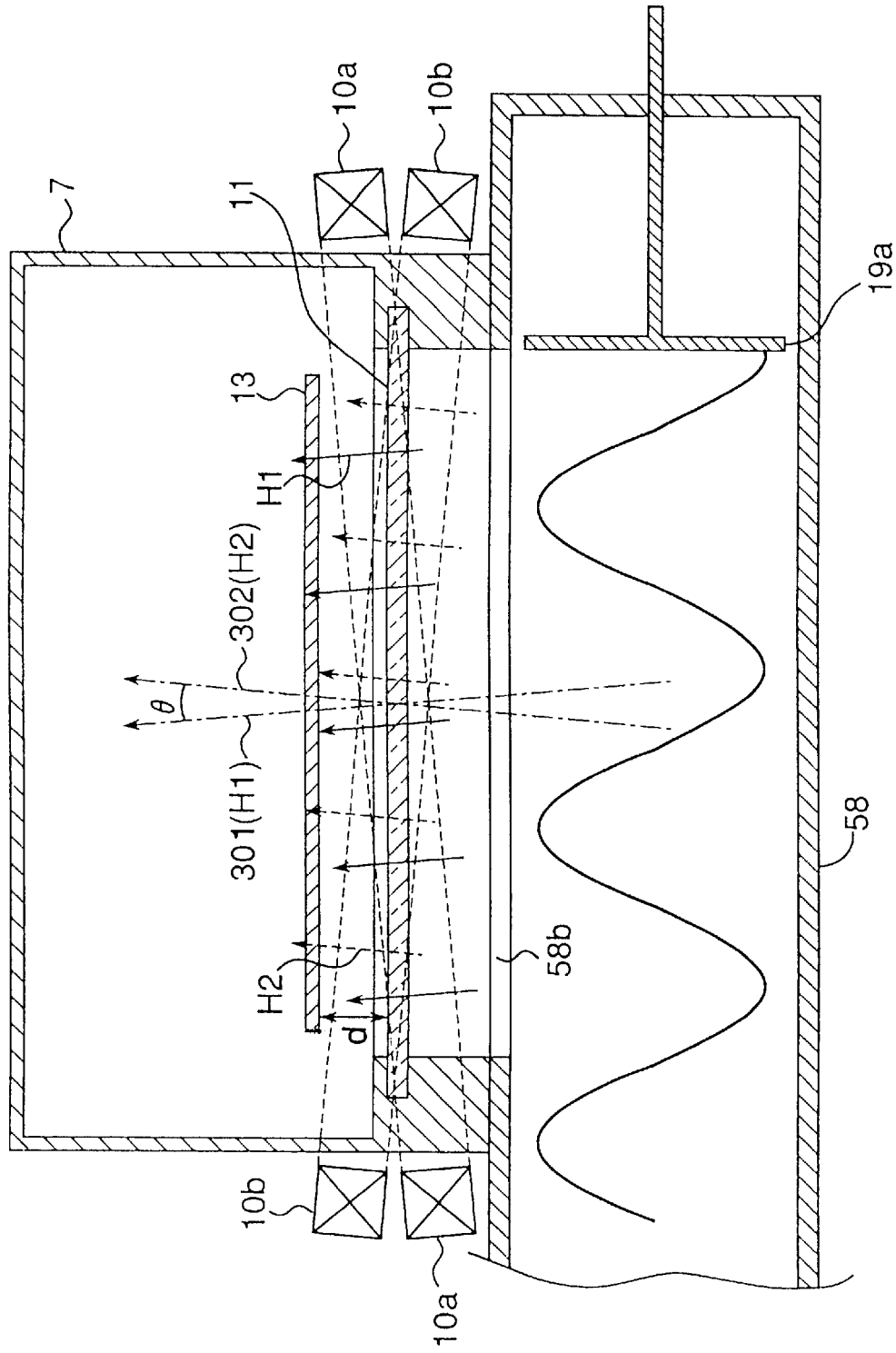

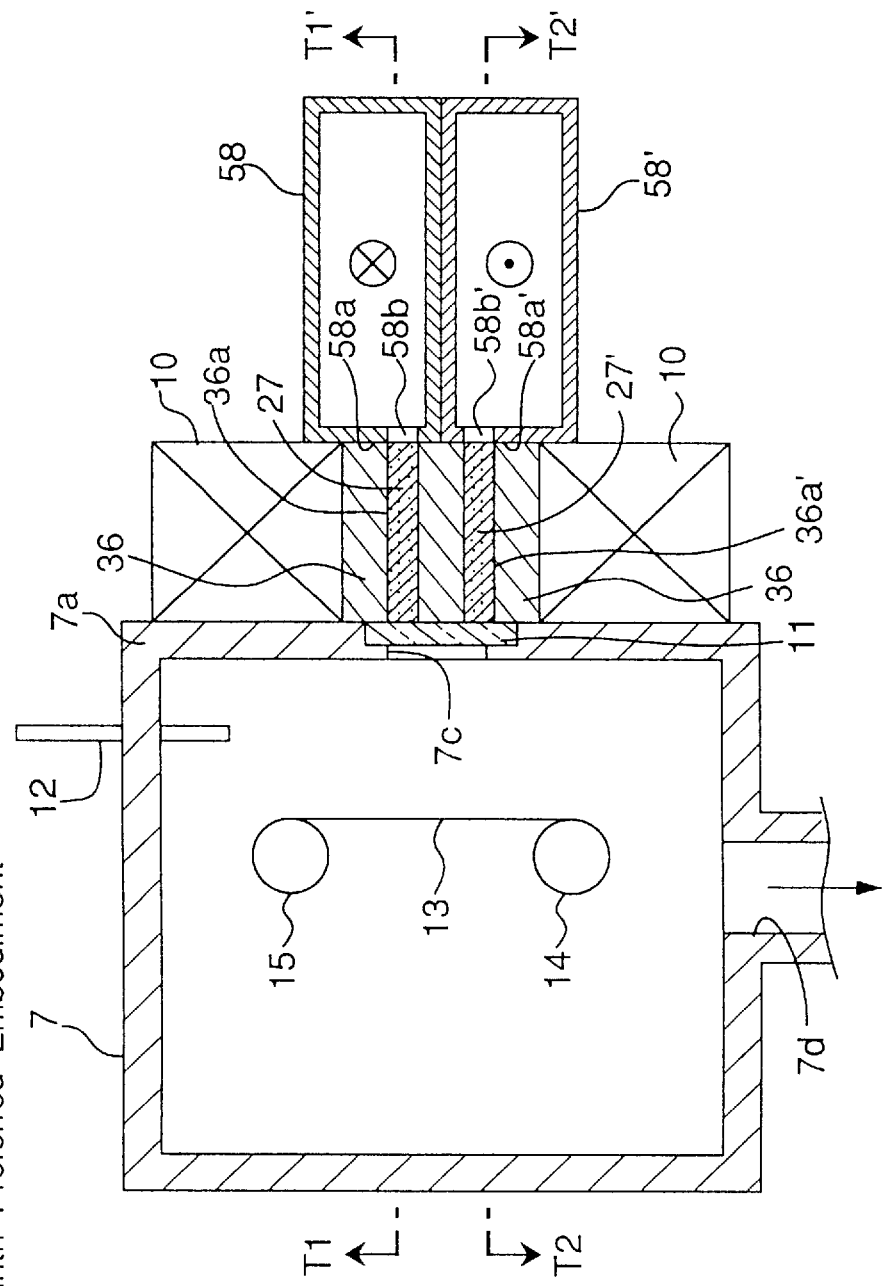
Fig. 27 Ninth Preferred Embodiment

Fig.36 Twelfth Preferred Embodiment

PLASMA PROCESSING APPARATUS FOR RADIATING MICROWAVE FROM RECTANGULAR WAVEGUIDE THROUGH LONG SLOT TO PLASMA CHAMBER

BACKGROUND OF THE INVENTION

1. Field of the Invention

The present invention relates to a plasma processing apparatus, and in particular, to a plasma processing apparatus for radiating a microwave from at least one rectangular waveguide through at least one long slot to a plasma chamber, the above-mentioned plasma processing apparatus being provided for, uniformly and at a high speed, performing a plasma processing, such as thin film formation, surface refining, etching or the like, toward an object to be processed having a large area.

2. Description of the Related Art

In recent years, plasma systems utilizing microwaves have been used for a processing, such as etching, ashing, CVD or the like, in processes for manufacturing semiconductors, LCDs or the like. FIG. 40 is a plan view showing a general construction of a prior art plasma processing apparatus which is disclosed in the Japanese Patent Laid-Open Publication No. 5-335095, and FIG. 41 is a cross-sectional view taken along a line I—I' of FIG. 40.

Referring to FIGS. 40 and 41, this prior art plasma processing apparatus comprises:

(a) a microwave power supply 1 for generating a microwave;
(b) an isolator 2;
(c) a corner rectangular waveguide 3;
(d) a directional coupler 4;
(e) an automatic impedance matching device 5 for automatically setting a predetermined impedance;
(f) a corner rectangular waveguide 6;
(g) a rectangular waveguide 8 for coupling with a rectangular-parallelopiped-shaped plasma chamber 7 wherein the plasma chamber 7 is attached onto a wall surface (hereinafter, referred to as an E-plane) of the rectangular waveguide 8 parallel to an electric field vector of the microwave propagating in the waveguide 8; and
(h) a terminating unit 9, wherein those components 1 to 9 are connected to one another in series. In this arrangement, the plasma chamber 7 is provided for plasma processing of a sheet-shaped object 13 to be processed.

In the plasma chamber 7, as shown in FIG. 41, a long projection 7b for communicating with the inside of the plasma chamber 7 is provided on a side wall 7a of the plasma chamber 7 formed on the rectangular waveguide 8 side of the plasma chamber 7, and the projection 7b is opposed to one E-plane 8a of the rectangular waveguide 8. In the projection 7b, an electromagnet 10 used as first magnetic-field generating means is provided on the outer periphery of the projection 7b, and a narrow rectangular window 7c is formed on the rectangular waveguide 8 side of the projection 7b so as to extend along the waveguide-axis direction of the rectangular waveguide 8. The window 7c is sealed under vacuum by a microwave transmitting window 11 made of a silica glass plate, and then, the plasma chamber 7 is sealed under vacuum. Furthermore, in the plasma chamber 7, an exhaust port 7d is formed and connected to a vacuum pump (not shown), and a gas introducing pipe 12 for introducing a process gas into the plasma chamber 7 is attached to one wall of the plasma chamber 7 so as to penetrate or pass through the wall of the plasma chamber 7 in airtight fashion. Within the plasma chamber 7, there are provided the following:

(a) a roll 14 around which the sheet-shaped object 13 to be processed is wound; and
(b) a wind-up roll 15 for winding up the object 13, which has been completely processed, wherein the rolls 14 and 15 are placed opposite to each other such that the object 13 to be processed is placed so that the front surface of the object 13 opposes to the window 7c.

In the rectangular waveguide 8 provided for coupling with the plasma chamber 7, long slots or longitudinal slots 8b and 8c are formed in the E-plane 8a of the rectangular waveguide 8 so as to extend in the waveguide-axis direction of the rectangular waveguide 8. Each of these long slots 8b and 8c has a length substantially equal to the longitudinal length of the window 7c of the plasma chamber 7, however, the width of each of the long slots 8b and 8c is set to a value shorter than the width of the window 7c. The rectangular waveguide 8 is electrically connected to the plasma chamber 7 with the long slots 8b and 8c so as to oppose to the window 7c of the plasma chamber 7.

In the plasma processing apparatus with the above-mentioned constitution, a microwave generated by the microwave power supply 1 is introduced or radiated into the rectangular waveguide 8 through the isolator 2, the corner rectangular waveguide 3, the directional coupler 4, the automatic impedance matching device 5, and the corner rectangular waveguide 6. Then, the microwave is radiated or projected into the plasma chamber 7 from the long slots 8b and 8c through the window 7c.

Between the plasma chamber 7 and the rectangular waveguide 8, a permanent magnet 10c used as a second magnetic-field generating means is disposed at a widthwise center portion of the E-plane 8a along the long slots 8b and 8c. Furthermore, a rectangular-cylindrical-shaped microwave waveguide forming member 16 made of aluminum, copper, stainless, or the like is placed longitudinally around the permanent magnet 10c so as to support the permanent magnet 10c and moreover to form microwave waveguides 8. The microwave waveguide forming member 16 is fixed between the plasma chamber 7 and the rectangular waveguides 16a and 16a' by appropriate means.

The terminating unit 9 is provided with a microwave absorber for absorbing excess microwave which have not been supplied into the plasma chamber 7 side, wherein water is used as the microwave absorber in this case. The excess microwave which has not propagated to the plasma chamber 7 are absorbed by water introduced through an inlet port 9a, and the water heated by the microwave is drained through a drain port 9b.

In order to carry out the plasma processing with the above plasma processing apparatus, the object 13 to be processed is provided and set in the plasma chamber 7, and then, the interior of the plasma chamber 7 is evacuated to a high vacuum. Thereafter, a predetermined process gas is supplied through the gas introducing pipe 12 into the plasma chamber 7 until the plasma chamber interior is pressurized to a predetermined pressure. In this state, when the microwave is supplied from the microwave power supply 1 through the isolator 2, the corner rectangular waveguide 3, the directional coupler 4, the automatic impedance matching device 5, and the corner waveguide 6 to one end of the rectangular waveguide 8, then the microwave which enters into the rectangular waveguide 8 is radiated from the long slots 8b and 8c, and propagates into the plasma chamber 7 through the window 7c of the plasma chamber 7. Thereafter, the microwave excites the process gas within the plasma chamber 7 into the plasma, then a strip-shaped plasma is generated along the window 7c of the plasma chamber 7. Under radiation of this plasma, the object 13 to be processed is wound and moved by the roll 15. Thus, the processing in a larger area can be implemented in continuous fashion onto the object 13.

In particular, since a magnetic field is developed in a space between the window 7c of the plasma chamber 7 and the object 13 to be processed by provision of the permanent magnet 10c used as the second magnetic-field generating means, electrons in the plasma are put into a spiral movement under a force by the magnetic field. As a result, the process gas is acceleratedly ionized, so that the density of plasma radiated onto the object 13 to be processed is enhanced. Further, if the intensity of the magnetic field to be generated by the magnetic-field generating means is so set as to develop electron cyclotron resonance in the space, then the plasma density can be enhanced at a high speed.

Further, by providing the electromagnet 10, which is divergent magnetic field generating means for forming a divergent magnetic field, in such a way that the abovementioned magnetic field is directed toward the plasma chamber 7 in a widthwise center portion of the window 7c of the plasma chamber 7, the plasma can be radiated to the object 13 to be processed, with a high efficiency and besides the plasma density can be enhanced at a higher speed, it is well known to those skilled in the art that a plasma can be generated without providing the electromagnet 10, which is the first magnetic-field generating means, and the permanent magnet 10c, which is the second magnetic-field generating means.

In the prior art plasma processing apparatus, due to the fact that the microwave propagates in an inclined or skew direction while being repeatedly reflected by the internal side wall of the rectangular waveguide 8, the microwave radiated from the long slot 8b having a length AB into the plasma chamber 7 propagates in such a fashion as to be skewed toward one side of the plasma chamber 7, as shown by microwaves W1, W2 and W3 in FIG. 42 showing a cross-sectional view taken along a line T3—T3' of FIG. 40. The resulting electric field intensity is non-uniform along the longitudinal direction of the plasma chamber 7, as shown in FIG. 43.

Further, an electric field of the microwave radiated into the plasma chamber 7 from the long slot 8b of length $\overline{AB}$ provided in the rectangular waveguide 8 have peaks and valleys of standing waves due to reflected waves generated with the long slots 8b and 8c provided, regardless of the fact that the terminating unit 9 is provided comprising the microwave absorber. The resulting electric field intensity is of a non-uniform distribution having peaks and valleys as shown in FIG. 43. Accordingly, there is such a disadvantage that the distribution of the plasma generated is non-uniform, such that plasma processing could not be attained over larger areas of the object 13 to be processed.

Further, among the microwave power inputted to the rectangular waveguide 8, the power which has not been radiated to the plasma chamber 7 from the long slot 8b passes through the rectangular waveguide 8 is consumed by the microwave absorber of the terminating unit 9, and therefore, this results in power loss. Accordingly, there is such a further disadvantage that the use efficiency of the microwave power is relatively poor and the density of the generated plasma is relatively low.

SUMMARY OF THE INVENTION

An essential object of the present invention is therefore to provide a plasma processing apparatus capable of performing a plasma processing uniformly over a larger area of an object to be processed.

Another object of the present invention is to provide a plasma processing apparatus capable of improving the use efficiency of the microwave power as compared with that of the prior art apparatus.

In order to achieve the above-mentioned objective, according to one aspect of the present invention, there is provided a plasma processing apparatus comprising:

a plasma chamber having a narrow window formed in a side wall thereof, an object to be processed being provided inside said narrow window;

a rectangular waveguide for coupling with said plasma chamber, said rectangular waveguide having a long slot disposed in an E-plane thereof so as to oppose to said narrow window of said plasma chamber and to extend along a waveguide-axis direction of said rectangular waveguide, said rectangular waveguide being provided so that the waveguide-axis direction of said rectangular waveguide is parallel to a longitudinal direction of said narrow window of said plasma chamber; and microwave power supply means for supplying a microwave to said rectangular waveguide, wherein the microwave is radiated from said rectangular waveguide to said plasma chamber through said long slot, said plasma processing apparatus being characterized in further comprising:

at least two said long slots disposed in at least one said rectangular waveguide;

wherein the longitudinal length of said each long slot is set to ½ or more of a free-space wavelength of the microwave; and wherein said long slots are disposed so as to be parallel to each other such that adjacent said long slots are shifted from each other by (2n-1)/4 of the free-space wavelength of the microwave in the waveguide-axis direction of said rectangular waveguide, where n is a natural number.

The above-mentioned plasma processing apparatus comprises:

at least two said rectangular waveguides each having at least one said long slot; and further microwave power supply means for supplying a microwave to another one of said rectangular waveguides in a direction different from the direction of one of said rectangular waveguides adjacent to another one of said rectangular waveguides.

In the above-mentioned plasma processing apparatus, each of said long slots is a slot array composed of a plurality of sub-slots disposed by equally dividing said long slot in the waveguide-axis direction of said rectangular waveguide, said plasma processing apparatus further comprising:

a terminating unit provided at a terminating end of said rectangular waveguides and having a movable short-circuit plate provided so as to move along the waveguide-axis direction of said rectangular waveguide, wherein said movable short-circuit plate is positioned so that center portions of peaks of a voltage standing wave generated in said rectangular waveguides are coincident with longitudinal center portions of said sub-slots, respectively.

The above-mentioned plasma processing apparatus further comprises:

one said rectangular waveguide having one long slot, said long slot being a slot array composed of a plurality of sub-slots disposed by equally dividing said long slot in the waveguide-axis direction of said rectangular waveguide; and a terminating unit provided at a terminating end of said rectangular waveguide and having a movable short-circuit plate provided so as to move along the waveguide-axis direction of said rectangular waveguide, wherein said movable short-circuit plate is positioned so that center portions of peaks of a voltage standing wave generated in said rectangular waveguide are coincident with longitudinal center portions of said sub-slots, respectively.

According to another aspect of the present invention, there is provided a plasma processing apparatus comprising:

a plasma chamber having a narrow window disposed in a side wall thereof, an object to be processed being provided inside said narrow window;

a rectangular waveguide for coupling with said plasma chamber, said rectangular waveguide having a long slot disposed in an E-plane thereof so as to oppose to said narrow window of said plasma chamber and to extend along a waveguide-axis direction of said rectangular waveguide, said rectangular waveguide being provided so that the waveguide-axis direction of said rectangular waveguide is parallel to a longitudinal direction of said narrow window of said plasma chamber; and microwave power supply means for supplying a microwave to said rectangular waveguide, wherein the microwave is radiated from the rectangular waveguide to said plasma chamber through said long slot, said plasma processing apparatus being characterized in that:

a longitudinal length of said long slot is set to ½ or more of a free-space wavelength of the microwave, said plasma processing apparatus further comprising:

a microwave waveguide forming member provided between said long slot and said narrow window of said plasma chamber, said microwave waveguide forming member having a microwave waveguide having a cross section identical to an opening shape of said long slot; and a dielectric made of a material that does not absorb any microwave, said dielectric being inserted into said microwave waveguide at a position near a terminating end of said rectangular waveguide along the waveguide-axis direction of said rectangular waveguide, said dielectric reflecting a part of the microwave and transmitting another part of the microwave.

In the above-mentioned plasma processing apparatus, the length of said dielectric in the longitudinal direction of said long slot is set to n/2 of a free-space wavelength of the microwave where n is a natural number, and wherein an insertion length of said dielectric into said microwave waveguide is set by adjusting a microwave transmittance coefficient of said dielectric so that an electric field intensity of the microwave along the longitudinal direction of said plasma chamber becomes substantially uniform.

According to a further aspect of the present invention, there is provided a plasma processing apparatus comprising:

a plasma chamber having a narrow window disposed in a side wall thereof, an object to be processed being provided inside said narrow window;

a rectangular waveguide for coupling with said plasma chamber, said rectangular waveguide having a long slot disposed in an E-plane thereof so as to oppose to said narrow window of said plasma chamber and to extend along a waveguide-axis direction of said rectangular waveguide, said rectangular waveguide being provided so that the waveguide-axis direction of said rectangular waveguide is parallel to a longitudinal direction of said narrow window of said plasma chamber; and microwave power supply means for supplying a microwave to said rectangular waveguide, wherein the microwave is radiated from the rectangular waveguide to said plasma chamber through said long slot, said plasma processing apparatus being characterized in that:

a longitudinal length of said long slot is set to ½ or more of a free-space wavelength of the microwave, said plasma processing apparatus further comprising:

a movable short-circuit plate provided at a terminating end of said rectangular waveguide so as to move along the waveguide-axis direction of said rectangular waveguide over a length of ½ or more of a guide wavelength of the microwave; and movement driving means for moving said movable short-circuit plate periodically or non-periodically along the waveguide-axis direction of said rectangular waveguide.

According to a still further aspect of the present invention, there is provided a plasma processing apparatus comprising:

a plasma chamber having a narrow window disposed in a side wall thereof, an object to be processed being provided inside said narrow window;

a rectangular waveguide for coupling with said plasma chamber, said rectangular waveguide having a long slot disposed in an E-plane thereof so as to oppose to said narrow window of said plasma chamber and to extend along a waveguide-axis direction of said rectangular waveguide, said rectangular waveguide being provided so that the waveguide-axis direction of said rectangular waveguide is parallel to a longitudinal direction of said narrow window of said plasma chamber; and microwave power supply means for supplying a microwave to said rectangular waveguide, wherein the microwave is radiated from the rectangular waveguide to said plasma chamber through said long slot, said plasma processing apparatus being characterized in that:

a longitudinal length of said long slot is set to ½ or more of a free-space wavelength of the microwave, said plasma processing apparatus further comprising:

a movable slot plate having an opening having a length shorter than a longitudinal length of said long slot in the waveguide-axis direction and having a width equal to a width of said long slot, said movable slot plate being disposed in a space between said long slot of said rectangular waveguide and said narrow window of said plasma chamber so as to move along the waveguide-axis direction of said rectangular waveguide so that said opening opposes to said long slot; and movement driving means for moving said movable slot plate periodically or non-periodically over a length of ½ or more of the free-space wavelength of the microwave.

According to a still more further aspect of the present invention, there is provided a plasma processing apparatus comprising:

a plasma chamber having a narrow window disposed in a side wall thereof, an object to be processed being provided inside said narrow window;

a rectangular waveguide for coupling with said plasma chamber, said rectangular waveguide having a long slot disposed in an E-plane thereof so as to oppose to said narrow window of said plasma chamber and to extend along a waveguide-axis direction of said rectangular waveguide, said rectangular waveguide being provided so that the waveguide-axis direction of said rectangular waveguide is parallel to a longitudinal direction of said narrow window of said plasma chamber; and microwave power supply means for supplying a microwave to said rectangular waveguide, wherein the microwave is radiated from the rectangular waveguide to said plasma chamber through said long slot, said plasma processing apparatus being characterized in that:
a longitudinal length of said long slot is set to ½ or more of a free-space wavelength of the microwave,
said plasma processing apparatus further comprising:
magnetic-field generating means for generating a magnetic field in a space between said object provided in said plasma chamber and said narrow window, and for changing a direction and an intensity of the generated magnetic field.

The above-mentioned plasma processing apparatus further comprises:

at least two microwave waveguide forming members provided between each said long slot and said narrow window of said plasma chamber and having a microwave waveguide having a cross section identical to an opening shape of each said long slot; and at least two dielectrics each made of a material that does not absorb any microwave, and said dielectrics being inserted into said microwave waveguides at a position near a terminating end of said rectangular waveguides along the waveguide-axis direction of said rectangular waveguide, said dielectrics reflecting a part of the microwave and transmit another part of the microwave, wherein the length of each said dielectric in the longitudinal direction of each said long slot is set to n/2 of a free-space wavelength of the microwave where n is a natural number, and wherein an insertion length of each said dielectric into each said microwave waveguide is set by adjusting a microwave transmittance coefficient of each said dielectric so that an electric field intensity of the microwave along the longitudinal direction of said plasma chamber becomes substantially uniform.

The above-mentioned plasma processing apparatus further comprises:

at least two said rectangular waveguides each having at least one said long slot; and further microwave power supply means for supplying a microwave to another one of said rectangular waveguides in a direction different from the direction of one of said rectangular waveguides adjacent to another one of said rectangular waveguides, and wherein said long slots are disposed so as to be parallel to each other such that adjacent said long slots are shifted from each other by (2n-1)/4 of the free-space wavelength of the microwave in the waveguide-axis direction of said rectangular waveguide, where n is a natural number.

The above-mentioned plasma processing apparatus further comprises:

a microwave waveguide forming member provided between said long slot and said narrow window of said plasma chamber, said microwave waveguide forming member having a microwave waveguide having a cross section identical to an opening shape of said long slot; and a dielectric made of a material that does not absorb any microwave, said dielectric being inserted into said microwave waveguide at a position near a terminating end of said rectangular waveguide along the waveguide-axis direction of said rectangular waveguide, said dielectric reflecting a part of the microwave and transmitting another part of the microwave.

In the above-mentioned plasma processing apparatus, a length of said dielectric in the longitudinal direction of said long slot is set to n/2 of a free-space wavelength of the microwave where n is a natural number, and wherein an insertion length of said dielectric into said microwave waveguide is set by adjusting a microwave transmittance coefficient of said dielectric so that an electric field intensity of the microwave along the longitudinal direction of said plasma chamber becomes substantially uniform.

According to the plasma processing apparatus of one aspect of the present invention, at least two long slots are provided in at least one rectangular waveguide, and the longitudinal length of each long slot is set to ½ or more of the free-space wavelength of the microwaves, wherein the long slots are arranged so as to be shifted from each other by (2n-1)/4 (where n is a natural number) of the free-space wavelength of the microwave in the waveguide-axis direction of the rectangular waveguide. Therefore, even if the microwave electric field radiated from the long slots to the plasma chamber has peaks and valleys with a cycle corresponding to the free-space wavelength of the microwaves, the strong portions and weak portions of the electric field of the microwave can be superimposed on each other by shifting the positions of the individual long slots by a phase of (2n-1)/4 of the free-space wavelength of the microwaves. Thus, the power of the microwave radiated to the plasma chamber can be made uniform along the longitudinal direction of the window of the plasma chamber, so that a uniform plasma density can be obtained over a wider range or area.

Further, according to the plasma processing apparatus of another aspect of the present invention, the above-mentioned plasma processing apparatus further comprises at least two said rectangular waveguides each having at least one long slot, and further microwave power supply means for supplying the microwaves to the rectangular waveguides in directions different from each other between adjacent rectangular waveguides. Therefore, regions where the electric field intensity of the microwave radiated from one rectangular waveguide through one long slot is relatively weak receive a relatively strong electric field of the microwave radiated from the further rectangular waveguide through the other long slot, and then the strong portions and the weak portions of the electric field of microwave can be superimposed on each other. Thus, the power of the microwaves radiated to the plasma chamber can be made uniform along the longitudinal direction of the window of the plasma chamber, so that a uniform plasma density can be obtained over a wider range or area.

Further, according to the plasma processing apparatus of a further aspect of the present invention, in the abovementioned plasma processing apparatus, each of the long slots is a slot array composed of a plurality of sub-slots formed by equally dividing the long slot in the waveguide-axis direction. The above-mentioned plasma processing apparatus further comprises: a terminating unit provided at a terminating end of the rectangular waveguides and having a movable short-circuit plate provided so as to move along the waveguide-axis direction, the movable short-circuit plate being positioned so that center portions of peaks of a voltage standing wave generated in the rectangular waveguides are coincident with longitudinal center portions of the sub-slots, respectively. In this case, the peaks of the electric field intensity of the microwave radiated from each sub-slot of the slot array become substantially a constant, so that the magnitude of the strong portions and the weak portions of the electric field intensity of the microwave is reduced over the entire length of the slot array. Thus, when a plasma is generated with a relatively low gas pressure by using the resulting combined microwave electric field, a plasma with a highly uniform plasma density distribution can be generated despite the presence of the strong portions and the weak portions of the electric field.

According to the plasma processing apparatus of a still further aspect of the present invention, the abovementioned plasma processing apparatus further comprises: one said rectangular waveguide having one long slot, the long slot being a slot array composed of a plurality of sub-slots formed by equally dividing the long slot in the waveguide-axis direction; a terminating unit provided at a terminating end of said rectangular waveguide and having a movable short-circuit plate provided so as to move along the waveguide-axis direction, the movable short-circuit plate being positioned so that center portions of peaks of a voltage standing wave generated in the rectangular waveguide are coincident with longitudinal center portions of the sub-slots, respectively. In this case, the peaks of the microwave electric field intensities of the microwave radiated from each sub-slot of the slot array become substantially a constant, so that the magnitude of the strong portions and the weak portions of the electric field intensities of the microwaves is reduced over the entire longitudinal length of the slot array. Thus, when a plasma is generated with a relatively low gas pressure by using the resulting combined microwave electric field, a plasma with a highly uniform plasma density distribution can be generated despite the presence of the strong portions and the weak portions of the electric field of the microwave.

According to the plasma processing apparatus of a still more further aspect of the present invention, the abovementioned plasma processing apparatus further comprises: a microwave waveguide forming member provided between the long slot and the window of the plasma chamber and having a microwave waveguide having a cross section identical to an opening shape of the long slot; and a dielectric composed of a material that does not absorb the microwaves, and inserted into the microwave waveguide at a position near a terminating end of the rectangular waveguide along the waveguide-axis direction, the dielectric reflecting a part of the microwave and transmitting another part of the microwave. By providing the dielectric which reflects a part of the microwave and transmits another part of the microwave and that does not absorb any microwave, at a portion where the electric field intensity of the microwaves is relatively high, the strong portions of the electric field are weakened while the weak portions of the electric field are conversely reinforced by power reflected by the dielectric. Thus, the power of the microwaves radiated to the plasma chamber can be made more uniform along the longitudinal direction of the window of the plasma chamber, so that a uniform plasma density can be obtained over a wide range.

According to the plasma processing apparatus of a still further more aspect of the present invention, in the abovementioned plasma processing apparatus, the longitudinal length of the dielectric along the longitudinal direction of the long slot is set to n/2 (where n is a natural number) of a free-space wavelength of the microwaves, and an insertion length of the dielectric into the microwave waveguide is set by adjusting the microwave transmittance coefficient of the dielectric so that an electric field intensity of the microwaves along the longitudinal direction of the plasma chamber becomes substantially uniform. Thus, the power of the microwaves radiated to the plasma chamber can be made more uniform along the longitudinal direction of the window of the plasma chamber, as compared with that of the abovementioned plasma processing apparatus.

According to the plasma processing apparatus of another aspect of the present invention, in the abovementioned plasma processing apparatus, a longitudinal length of the long slot is set to ½ or more of a free-space wavelength of the microwaves. The above-mentioned plasma processing apparatus further comprises: a movable short-circuit plate provided at a terminating end of the rectangular waveguide so as to move along the waveguide-axis direction over a longitudinal length of ½ or more of a guide wavelength of the microwaves; and movement driving means for moving the movable short-circuit plate periodically or non-periodically along the waveguide-axis direction. Therefore, even if the plasma generated has spatial non-uniformities or irregularities due to the strong portions and the weak portions of the electric field intensity of the microwaves radiated from the long slot to the plasma chamber, the non-uniformity of plasma can be complemented by changing the irradiation of plasma to the object to be processed in time and space. Thus, a plasma processing with apparently good uniformity can be accomplished.

According to the plasma processing apparatus of a further aspect of the present invention, in the abovementioned plasma processing apparatus, a longitudinal length of the long slots is set to ½ or more of a free-space wavelength of the microwaves. The above-mentioned plasma processing apparatus further comprises: a movable slot plate having an opening in a space between the long slot of the rectangular waveguide, and the narrow window of the plasma chamber, the movable slot plate having a longitudinal length shorter than the length of the long slot in the waveguide-axis direction and a width equal to the width of the long slot, the movable slot plate disposed so as to move along the waveguide-axis direction so that the long slot and the opening are opposed to each other; and movement driving means for moving the movable slot plate periodically or non-periodically over a longitudinal length of ½ or more of the free-space wavelength of the microwaves. Therefore, even if the plasma generated has spatial non-uniformities or irregularities due to the strong portions and the weak portions of the electric field of the microwaves radiated from the long slots to the plasma chamber, the non-uniformity of plasma can be complemented by varying the irradiation of plasma to the object to be processed in time and space. Thus, a plasma processing with apparently good uniformity can be accomplished.

According to the plasma processing apparatus of a further aspect of the present invention, in the abovementioned plasma processing apparatus, a longitudinal length of the long slot is set to ½ or more of a free-space wavelength of the microwaves. The above-mentioned plasma processing apparatus further comprises: magnetic-field generating means for generating a magnetic field in a space between the object set in the plasma chamber and the window, and for changing a direction and an intensity of the magnetic field. Therefore, even if the plasma generated has spatial non-uniformities or irregularities due to the strong portions and the weak portions of the electric field of the microwaves radiated from the long slots to the plasma chamber, the non-uniformity of plasma can be complemented by varying the irradiation of plasma to the object to be processed in time and space. Thus, the plasma processing with apparently good uniformity can be accomplished.

According to the plasma processing apparatus of a still further aspect of the present invention, the abovementioned plasma processing apparatus further comprises: at least two microwave waveguide forming members provided between each long slot and the narrow window of the plasma chamber and having a microwave waveguide having a cross section identical to an opening shape of the each long slot; and at least two dielectrics each composed of a material that does not absorb any microwave, and inserted in said microwave waveguides at a position near a terminating end of the rectangular waveguides along the waveguide-axis direction, the dielectrics reflecting a part of the microwave and transmitting another part of the microwave, wherein the longitudinal length of said each dielectric in the longitudinal direction of said each long slot is set to n/2 (where n is a natural number) of a free-space wavelength of the microwaves, and an insertion length of each dielectric into each microwave waveguide is set by adjusting the microwave transmittance coefficient of said each dielectric so that an electric field intensity of the microwaves along the longitudinal direction of the plasma chamber becomes substantially uniform. Therefore, by providing the dielectric that reflects a part of the microwave and transmits another part of the microwave and that does not absorb any microwaves, at a portion where the electric field intensity of the microwaves is relatively high, the strong portions of the electric field are weakened while the weak portions of the electric field are conversely reinforced by power reflected by the dielectric. Thus, the power of the microwaves radiated to the plasma chamber can be made uniform along the longitudinal direction of the window of the plasma chamber, so that a uniform plasma density can be obtained over a wide range.

According to the plasma processing apparatus of a still more further aspect of the present invention, the above-mentioned plasma processing apparatus further comprises: at least two said rectangular waveguides each having at least one long slot; and further microwave power supply means for supplying the microwave to the rectangular waveguides in directions different between adjacent rectangular waveguides, wherein the long slots are formed so as to be parallel to each other in such a way that adjacent the long slots are shifted from each other by (2n-1)/4(where n is a natural number) in the waveguide-axis direction of the rectangular waveguide. Therefore, regions where the electric field intensity of the microwave radiated from one rectangular waveguide through one long slot is relatively weak receive a relatively strong electric field of the microwave radiated from the other rectangular waveguide through the other long slot, and then the strong portions and the weak portions of the electric field of the microwave can be superimposed on each other. Thus, the power of the microwave radiated to the plasma chamber can be made uniform along the longitudinal direction of the window of the plasma chamber, so that a uniform plasma density can be obtained over a wide range.

According to the plasma processing apparatus of a still further more aspect of the present invention, the above-mentioned plasma processing apparatus further comprises: a microwave waveguide forming member provided between the long slot and the window of the plasma chamber and having a microwave waveguide having a cross section identical to an opening shape of the long slot; and a dielectric composed of a material that does not absorb any microwave, and inserted into the microwave waveguide at a position near a terminating end of the rectangular waveguide along the waveguide-axis direction, the dielectric reflecting a part of the microwave and transmitting another part of the microwave. Therefore, by providing the dielectric that reflects a part of the microwave and transmits another part of the microwave and that does not absorb any microwave, at a portion where the electric field intensity of the microwave is relatively high, the strong portions of the electric field are weakened while the weak portions of the electric field are conversely reinforced by power reflected by the dielectric. Thus, the power of the microwave radiated to the plasma chamber can be made uniform along the longitudinal direction of the window of the plasma chamber, so that a uniform plasma density can be obtained over a wide range.

According to the plasma processing apparatus of a still more further aspect of the present invention, the above-mentioned plasma processing apparatus further comprises: a microwave waveguide forming member provided between the long slot and the window of the plasma chamber and having a microwave waveguide whose cross section is identical to an opening shape of the long slot; and a dielectric composed of a material that does not absorb any microwave, and inserted into the microwave waveguide at a position near a terminating end of the rectangular waveguide along the waveguide-axis direction, the dielectric reflecting a part of the microwave and transmitting another part of the microwave, wherein the length of the dielectric along the longitudinal direction of the long slot is set to n/2 (where n is a natural number) of a free-space wavelength of the microwave, and an insertion length of the dielectric into the microwave waveguide is set by adjusting the microwave transmittance coefficient of the dielectric so that an electric field intensity of the microwave along the longitudinal direction of the plasma chamber becomes substantially uniform. Therefore, by providing the dielectric that reflects a part of the microwave and transmits another part of the microwave and that does not absorb any microwave, at a portion where the electric field intensity of the microwave is relatively high, the strong portions of the electric field are weakened while the weak portions of the electric field are conversely reinforced by power reflected by the dielectric. Thus, the power of the microwave radiated to the plasma chamber can be made uniform along the longitudinal direction of the window of the plasma chamber, so that a uniform plasma density can be obtained over a wider range or area.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 10 is a plan view showing a general construction of a plasma processing apparatus of a fourth preferred embodiment according to the present invention;

FIG. 12 is a plan view showing a general construction of a plasma processing apparatus of a fifth preferred embodiment according to the present invention;

FIGS. 25A, 25B and 25C are front views each showing a relationship between a movable slot plate and an opening in the plasma processing apparatus of FIG. 23 when the movable slot plate is moved, wherein FIG. 25A is the front view at a timing t1, FIG. 25B is the front view at a timing t2, and FIG. 25C is the front view at a timing t3;

FIG. 26 is a cross-sectional view corresponding to FIG. 24, showing a plasma processing apparatus of an eighth preferred embodiment according to the present invention;

FIG. 27 is a cross-sectional view corresponding to FIG. 23, showing a plasma processing apparatus of a ninth preferred embodiment according to the present invention;

DETAILED DESCRIPTION OF THE PREFERRED EMBODIMENTS

Preferred embodiments according to the present invention will be described below with reference to the attached drawings.

<First Preferred embodiment>

Figure 1:
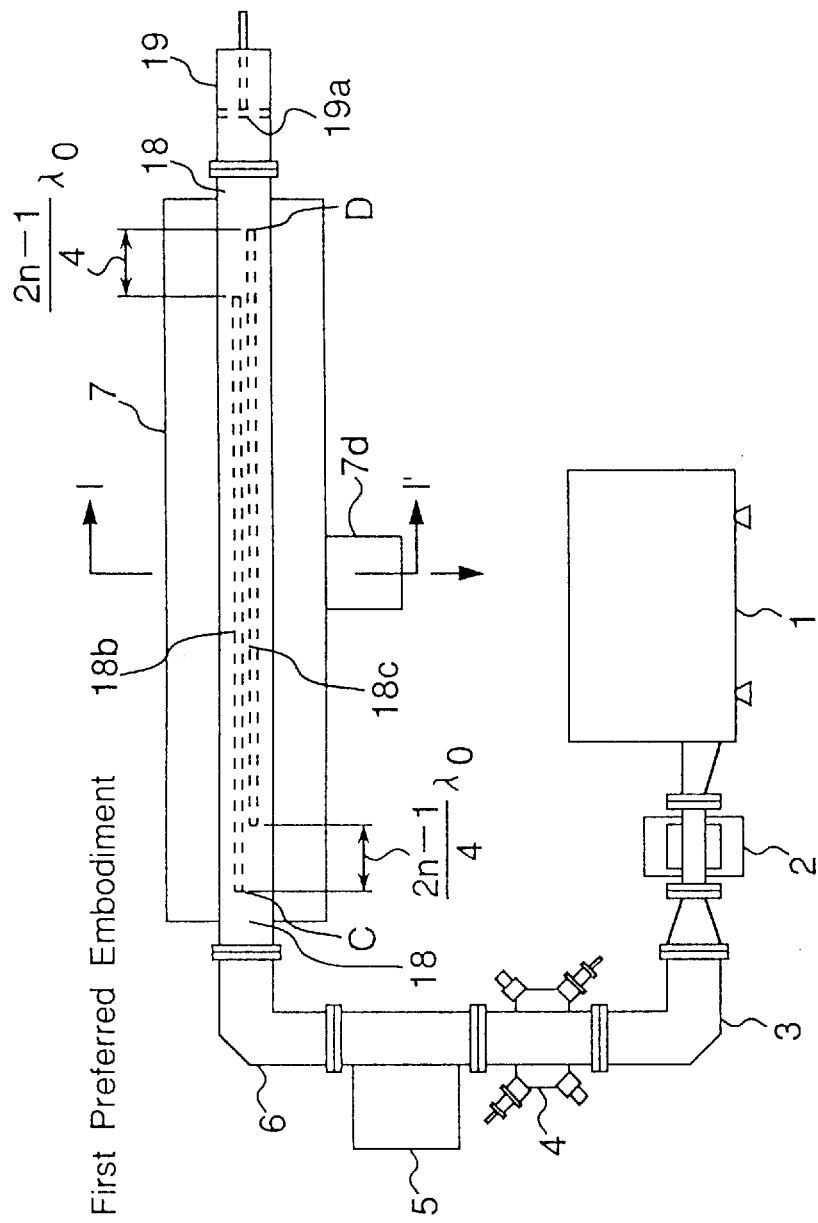
FIG. 1 is a plan view showing a general construction of a plasma processing apparatus of a first preferred embodiment according to the present invention.
Figure 2:
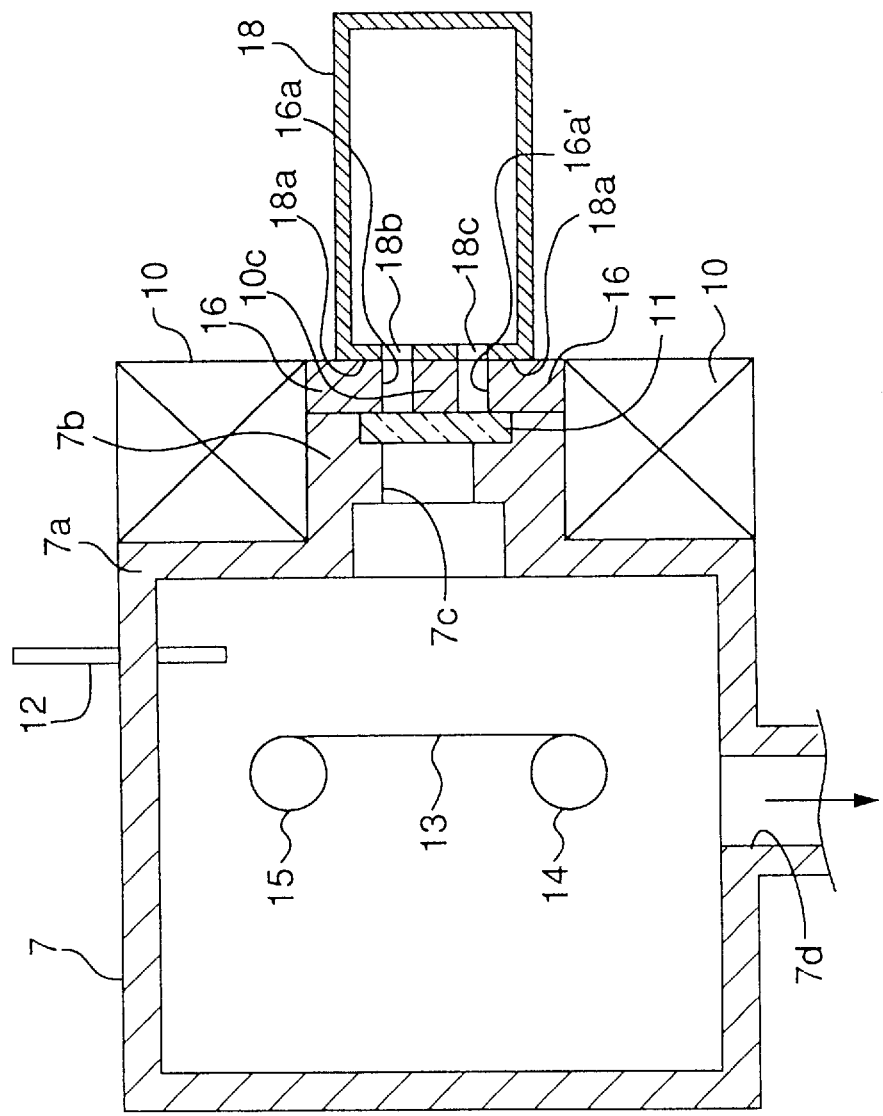
FIG. 2 is a cross-sectional view taken along a line I—I' of FIG. 1.
Figure 40:
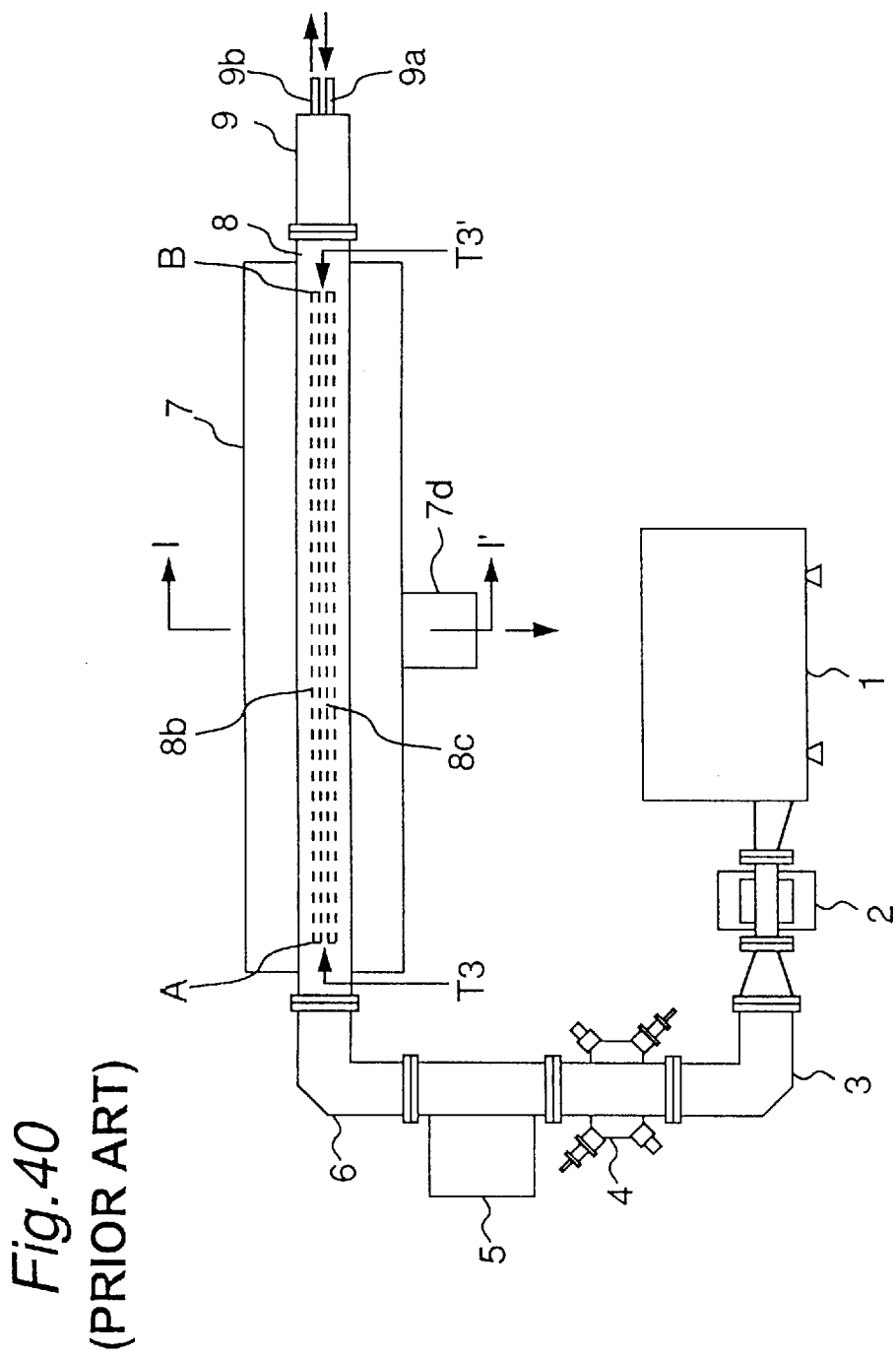
FIG. 40 is a plan view showing a general construction of a prior art plasma processing apparatus.
Figure 41:
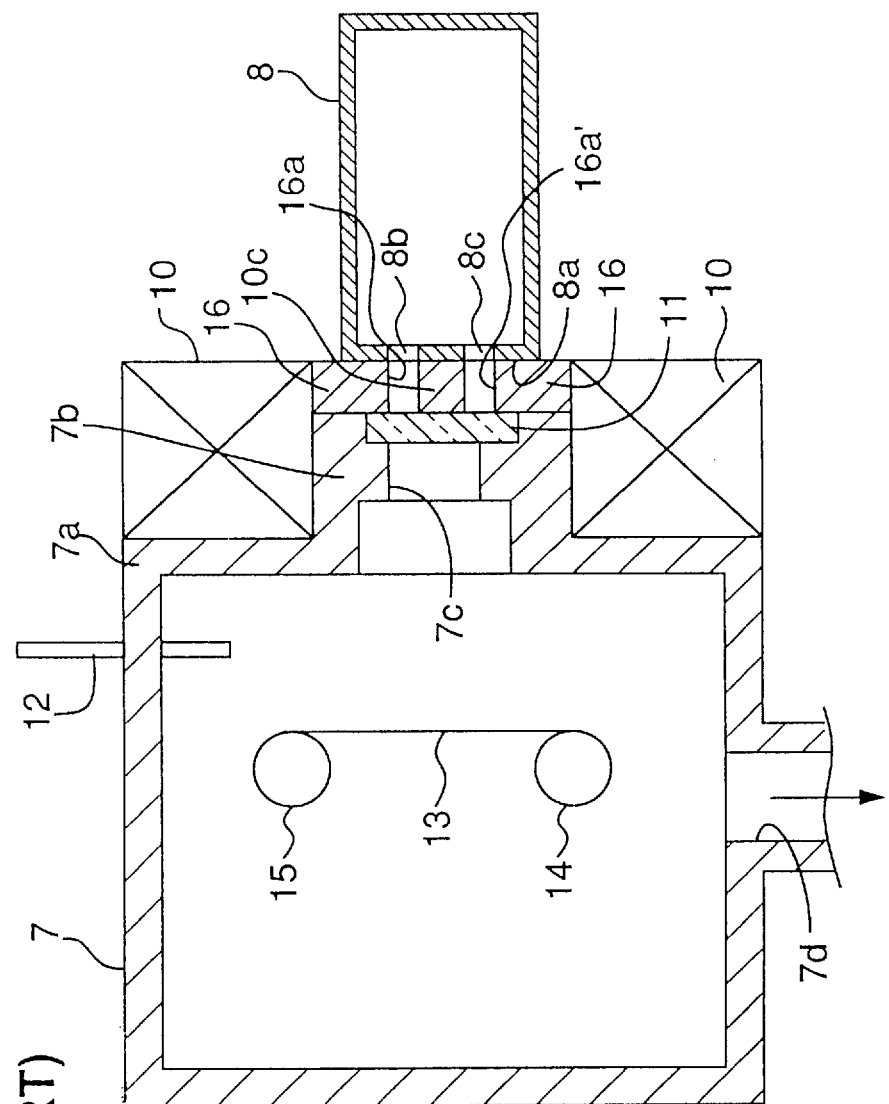
FIG. 41 is a cross-sectional view taken along a line I—I' of FIG. 40.
Figure 42:
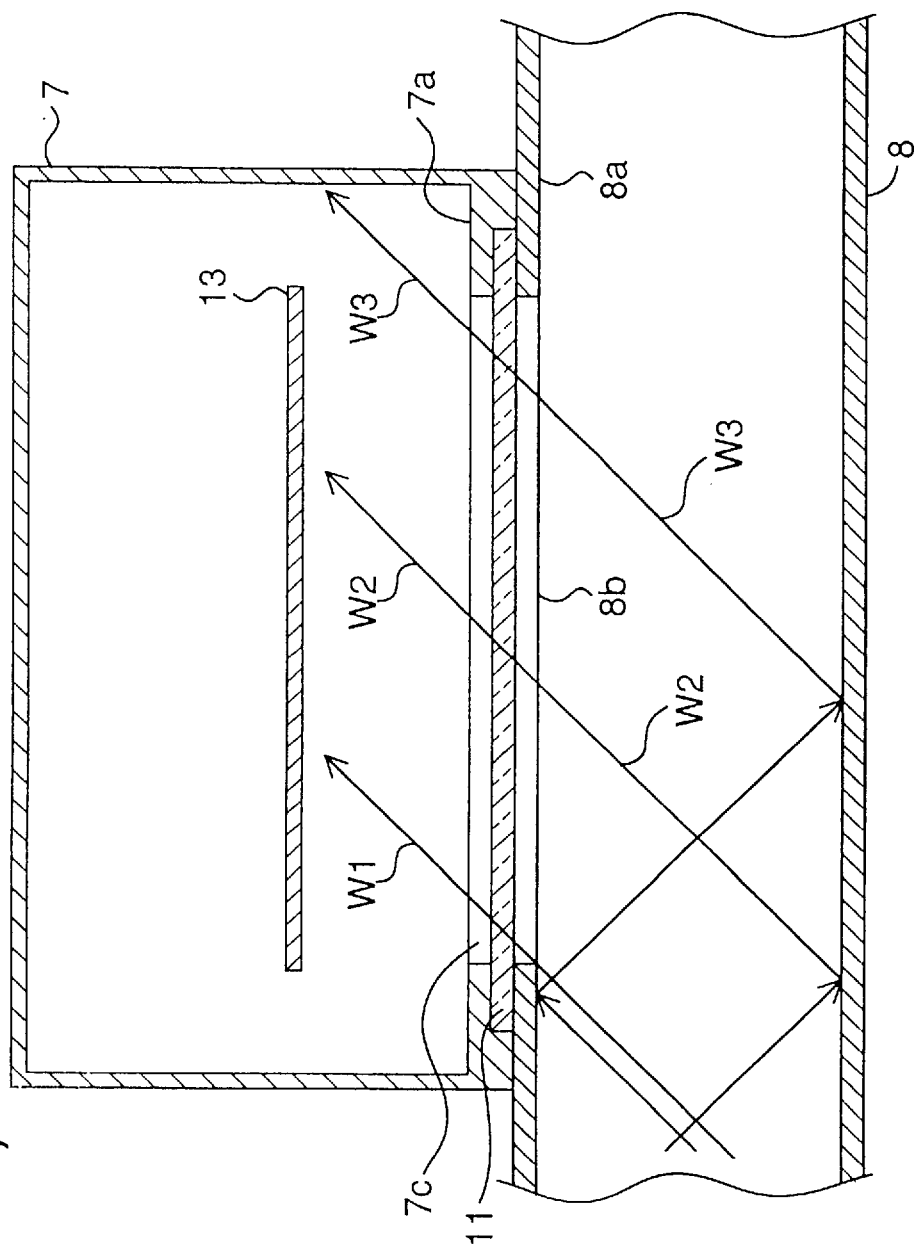
FIG. 42 is a cross-sectional view taken along a line T3—T3' of FIG. 40.

FIG. 1 is a general construction view of a plasma processing apparatus showing a first preferred embodiment according to the present invention. FIG. 2 is a cross-sectional view taken along a line I—I' of FIG. 1. In FIGS. 1 and 2, there are shown the followings:

(a) a microwave power supply 1;

(b) an isolator 2;

(c) corner rectangular waveguides 3 and 6;

(d) a directional coupler 4;

(e) an automatic impedance matching device 5, and;

(f) a plasma chamber 7, wherein these components are arranged in the same way as that of the prior art apparatus shown in FIG. 40. Further, there are shown the followings in FIG. 1:

(g) a rectangular waveguide 18 for coupling with the plasma chamber 7 wherein the rectangular waveguide 18 has long slots or longitudinal long slots 18b and 18c formed in an E-plane 18a of the rectangular waveguide 18; and (h) a terminating unit 19 provided with a movable short-circuit plate 19a. It is noted that FIG. 2 is similar to FIG. 41, and in FIGS. 1 and 2, the components similar to those shown in FIGS. 40 and 41 are designated the same numerals as those shown in FIGS. 40 and 41.

The plasma processing apparatus of the first preferred embodiment according to the present invention is characterized in that the long slots 18b and 18c are located so as to be shifted from each other in the waveguide-axis direction by $(2n-1)/4$ (where n is a natural number) of the free-space wavelength $\lambda_0$ of the microwave, and so as to be both parallel to the waveguide-axis direction of the rectangular waveguide 18 with an appropriate spacing.

As shown in FIG. 2, in the plasma chamber 7, a long projection 7b for communicating with the inside of the plasma chamber 7 is provided onto a side wall 7a of the plasma chamber 7 on the rectangular waveguide 18 side of the plasma chamber 7, and the projection 7b is formed so as to oppose to one E-plane 18a of the rectangular waveguide 18. In the projection 7b, an electromagnet 10 used as first magnetic-field generating means is provided on the outer periphery of the projection 7b, and a narrow rectangular window 7c is provided on the rectangular waveguide 18 side of the projection 7b so as to extend along the waveguide-axis direction of the rectangular waveguide 18. The window 7c is sealed under vacuum by a microwave transmitting window 11 made of a silica glass plate, and then the plasma chamber 7 is sealed under vacuum. Further, in the plasma chamber 7, an exhaust port 7d is provided and connected to a vacuum pump (not shown), and a gas introducing pipe 12 for introducing a process gas into the plasma chamber 7 is attached so as to pass through one wall of the plasma chamber 7 in airtight fashion. Within the plasma chamber 7, there are provided the followings:

(a) a roll 14 around which a sheet-shaped object 13 to be processed is wound; and (b) a wind-up roll 15 for winding up the object 13, which has been completely processed, wherein the rolls 14 and 15 are placed so as to be opposite to each other such that the object 13 to be processed is placed so that the front surface of the object 13 opposes to the window 7c.

In the rectangular waveguide 18 provided for coupling the plasma chamber 7, long slots 18b and 18c are formed in the E-plane 18a of the rectangular waveguide 18 so as to extend in the waveguide-axis direction of the rectangular waveguide 18. The long slots 18b and 18c are located so as to be shifted from each other in the waveguide-axis direction thereof by $(2n-1)/4$ (where n is a natural number) of the free-space wavelength $\lambda_0$ of the microwave and, besides, so as to be both parallel to each other with an appropriate spacing. Further, in the plasma chamber 7, a window 7c is formed in the side wall 7a of the plasma chamber 7 on the rectangular waveguide 18 side thereof so as to extend in the waveguide-axis direction of the rectangular waveguide 18, and the longitudinal length of the window 7c is set to a value approximately or substantially equal to a longitudinal length resulting by adding $\lambda_0(2n-1)/4$ to the longitudinal length of one long slot 18b or 18c, as described above. The rectangular waveguide 18 is electrically connected to the plasma chamber 7 with the long slots 18b, 18c opposed to the window 7c of the plasma chamber 7.

Between the plasma chamber 7 and the rectangular waveguide 18, a permanent magnet 10c used as second magnetic-field generating means is disposed at the width-wise center portion of the E-plane 18a of the rectangular waveguide 18 along the long slots 18b and 18c. Further, a rectangular-cylindrical-shaped microwave waveguide forming member 16 made of aluminum, copper, stainless, or the like is placed longitudinally around the permanent magnet 10c so as to support the permanent magnet 10c and moreover so as to form microwave waveguides 16a and 16a'. The microwave waveguide forming member 16 is fixed between the plasma chamber 7a and the rectangular waveguide 18 by appropriate means.

The terminating unit 19 is provided the movable short-circuit plate 19a instead of a terminating unit consisting of a microwave absorber as shown in FIG. 40 of the prior art. Accordingly, by respectively adjusting the position of the movable short-circuit plate 19a and the automatic impedance matching device 5 to predetermined impedances as required, the microwave to be introduced into the rectangular waveguide 18 can be supplied to the plasma chamber 7 with a higher efficiency.

In the plasma processing apparatus with the above-mentioned constitution, a microwave generated by the microwave power supply 1 is introduced to the rectangular waveguide 18 through the isolator 2, the corner rectangular waveguide 3, the directional coupler 4, the automatic impedance matching device 5, and the corner rectangular waveguide 6. Then, the microwave is radiated or projected into the plasma chamber 7 from the long slots 18b and 18c through the microwave waveguides 16a and 16a', the microwave transmitting window 11, and the window 7c.

Figure 43:
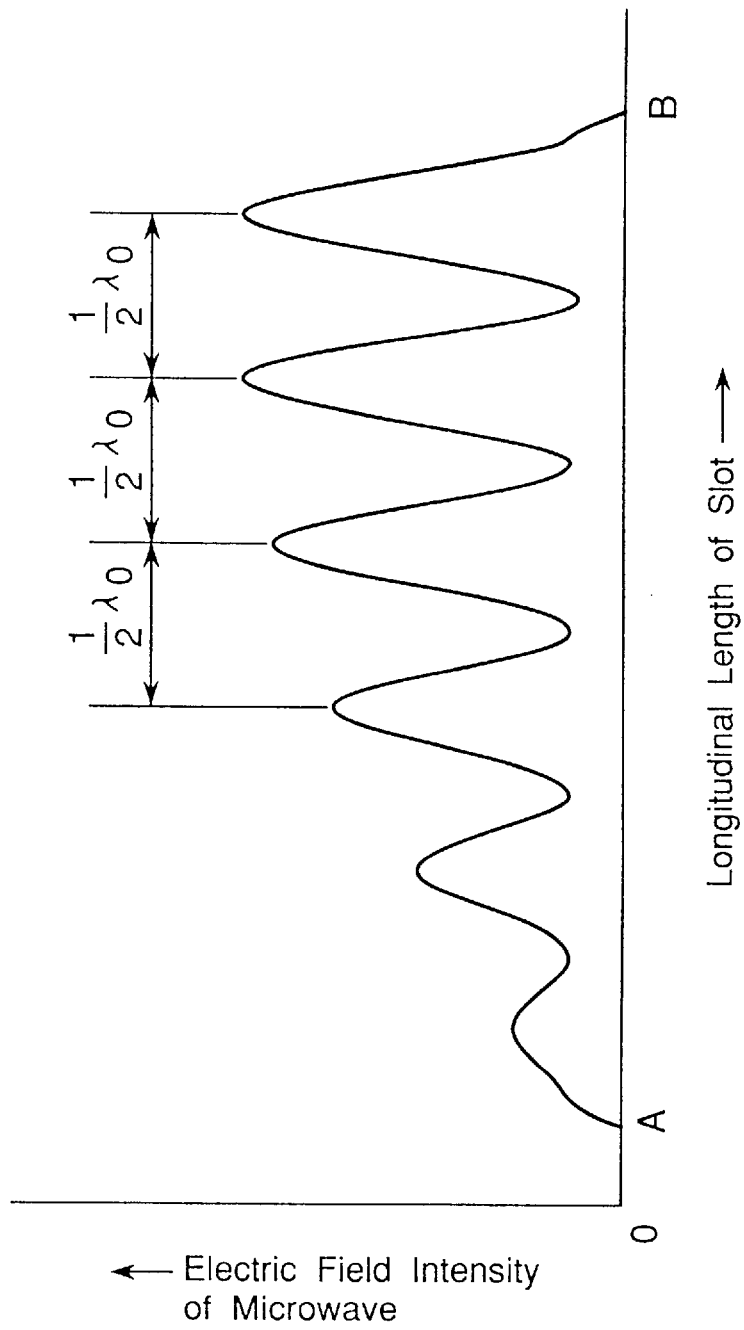
FIG. 43 is a graph showing an electric field intensity of a microwave relative to a longitudinal length of each of long slots in the plasma processing apparatus of FIG. 40.

In the plasma processing apparatus of the present preferred embodiment, since the electric field intensity of the microwave radiated from the long slots 18b and 18c has strong portions and weak portions alternately every halves of the free-space wavelength $\lambda_0$ of the microwave as shown in FIG. 43, shifting the long slots 18b and 18c from each other by ¼ of the free-space wavelength $\lambda_0$ of the microwave along the longitudinal direction of the long slots 18b and 18c, that is, in the waveguide-axis direction of the rectangular waveguide 18 causes two microwave electric fields to be combined or synthesized so that the strong and weak portions of the electric field intensity are superimposed on each other. Preferably, the longitudinal length to which the long slots 18b and 18c are shifted from each other is set to a value of ($\frac{1}{4}$)$\lambda_0$ or ($\frac{3}{4}$)$\lambda_0$. If the long slots 18b and 18c are further shifted in excess of those, the electric field intensity of the microwave generated by one long slot 18b or 18c alone would result in a wider distribution. That is, a distribution of the electric field intensity having the strong portions and the weak portions would result at longitudinal both ends of the long slots 18b and 18c without combining the electric field intensities of the microwaves thereof. In addition, the longitudinal length of each of the long slots 18b and 18c is set to a longitudinal length n($\lambda_0$/2), where n is preferably a natural number equal to or greater than 1, and further, n is more preferably a natural number equal to or greater than 2. However, if n is set to a large number, for example, in excess of 4 to the length of the object 13 to be processed, the attenuation of microwave electric fields becomes larger in the longitudinal direction of the long slots 18b and 18c.

Figure 3:
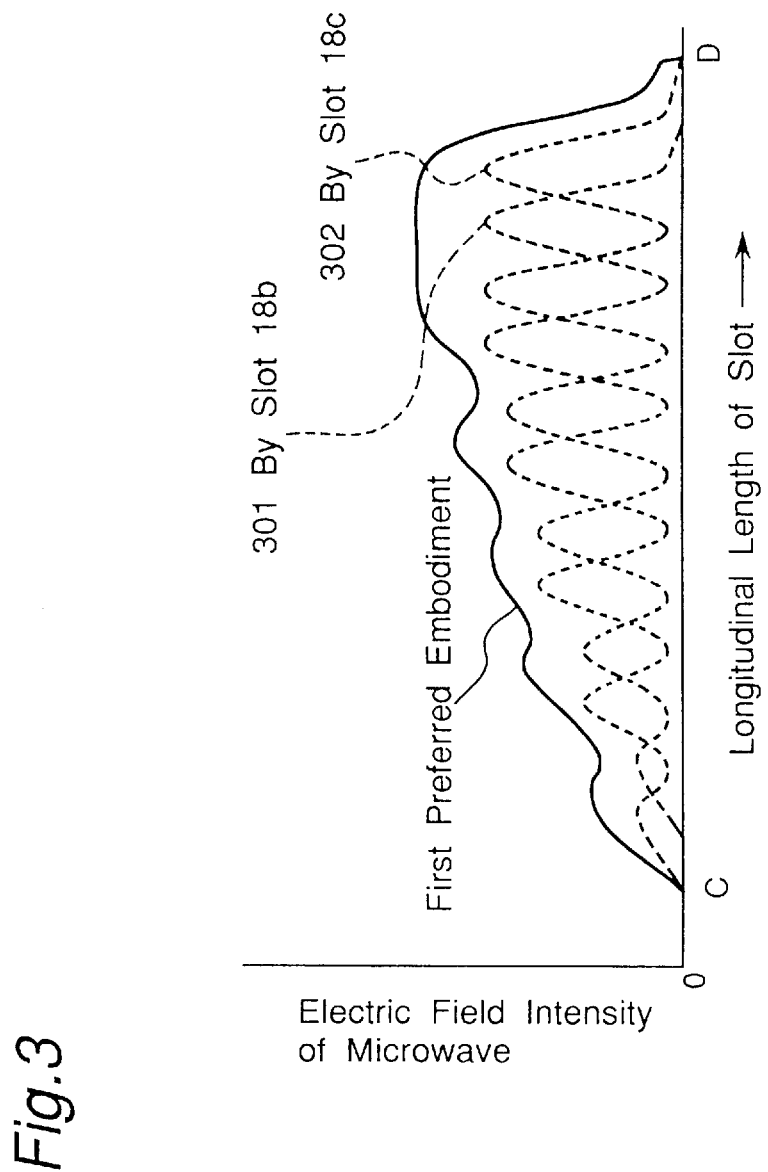
FIG. 3 is a graph showing an electric field intensity of a microwave relative to a longitudinal length of each of long slots in the plasma processing apparatus of FIG. 1.

The distribution of the electric field intensities of the microwaves radiated from slots of a longitudinal length CD given by the long slots 18b and 18c is shown by a solid line of FIG. 3, wherein the magnitudes of the strong portion and the weak portion of the electric field intensities are reduced so that substantially a constant electric field intensity can be obtained. It is noted that broken lines 301 and 302 in FIG. 3 show distributions of the electric field intensities of the microwaves radiated from the long slots 18b and 18c, respectively. Further, in the present preferred embodiment using the terminating unit 19 which can adjust the impedance, the microwave reflected by the terminating unit 19 can be also introduced to the plasma chamber 7. Thus, a greater electric field intensity can be obtained as compared with that of the prior art apparatus using the terminating unit 9 which is a dummy load. Accordingly, the electric field intensity of the microwaves can be improved. Consequently, a plasma with more uniformity and higher density can be generated. Furthermore, the use efficiency of the microwave power can be improved as compared with that of the prior art apparatus.

<Second Preferred embodiment>

Figure 4:
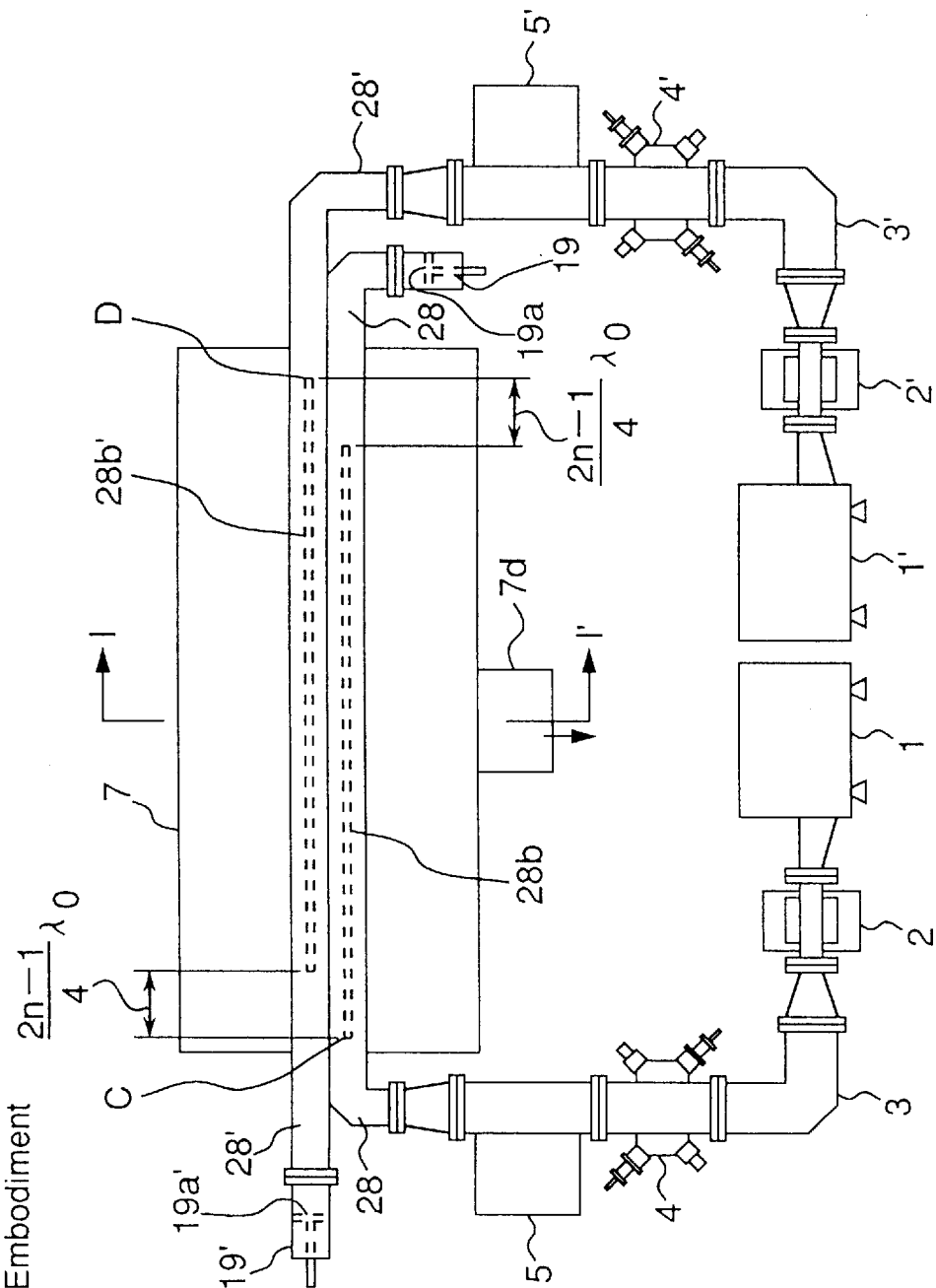
FIG. 4 is a plan view showing a general construction of a plasma processing apparatus of a second preferred embodiment according to the present invention.
Figure 5:
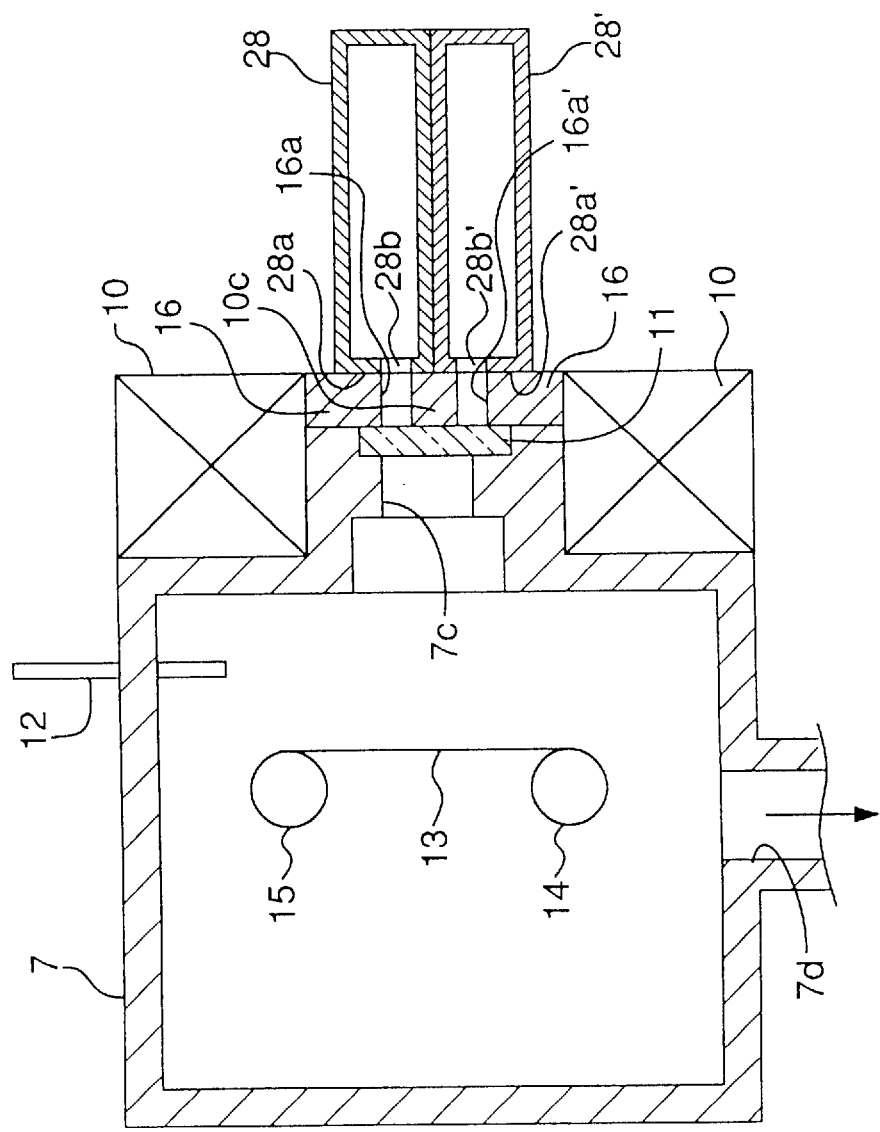
FIG. 5 is a cross-sectional view taken along a line I—I' of FIG. 4.

FIG. 4 is a general construction view of a plasma processing apparatus showing a second preferred embodiment according to the present invention. FIG. 5 is a cross-sectional view taken along a line I—I' of FIG. 4. In FIG. 4, there are shown the followings:

(a) microwave power supplies 1 and 1';

(b) isolators 2 and 2';

(c) corner rectangular waveguides 3 and 3';

(d) directional couplers 4 and 4';

(e) automatic impedance matching devices 5 and 5'; and (f) a plasma chamber 7, wherein these components are constructed in a manner similar to that shown in FIGS. 1 and 40. Further, there are shown are the followings:

(g) terminating units 19 and 19';

(h) rectangular waveguides 28 and 28' each provided for coupling with the plasma chamber 7, wherein the rectangular waveguides 28 and 28' have long slots 28b and 28b', respectively. Furthermore, FIG. 5 is similar to FIG. 41, except the rectangular waveguides 28 and 28'. In FIGS. 4 and 5, the components similar to those shown in the above-mentioned Figures are designated by the same numerals as those therein.

Referring to FIGS. 4 and 5, the microwave power supply 1', the isolator 2', the corner rectangular waveguide 3', the directional coupler 4', the automatic impedance matching device 5', the rectangular waveguide 28', and the terminating unit 19' are connected in series, in a manner similar to that of the microwave power supply 1, the isolator 2, the corner rectangular waveguide 3, the directional coupler 4, the automatic impedance matching device 5, the rectangular waveguide 28, and the terminating unit 19.

The rectangular waveguides 28 and 28' are respectively arranged so as to be juxtaposed and have long slots 28b and 28b' provided in the E-planes 28a and 28a' of the rectangular waveguides 28 and 28' along the waveguide-axis direction. The long slots 28b and 28b' are located so as to be shifted from each other in the waveguide-axis direction of the rectangular waveguides 28 and 28' by pb $\frac{1}{4}$ or $\frac{3}{4}$ of a free-space wavelength $\lambda_0$ of the microwave, and in parallel to each other with an appropriate spacing. Further, to one end of the rectangular waveguides 28 and 28' are connected, the microwave power supplies 1 and 1', the isolators 2 and 2', the corner rectangular waveguides 3 and 3', the directional couplers 4 and 4', the automatic impedance matching devices 5 and 5' provided symmetrical with respect to the line I—I' so that the microwaves propagating within the rectangular waveguides 28 and 28' are supplied in directions different from each other and parallel to each other. That is, the rectangular waveguide 28 has a microwave supplied thereto from the left side end portion of FIG. 4, while the rectangular waveguide 28' has a microwave supplied thereto from the right side end portion of FIG. 4.

In the plasma processing apparatus of the present preferred embodiment, the distribution of the electric field intensity of the microwave radiated from the long slot 28b is shown by the pattern of FIG. 43, while the distribution of the electric field intensity of the microwave radiated from the long slot 28b' has a pattern reverse to that shown in FIG. 43. Therefore, by shifting the long slots 28b and 28b' by a longitudinal length of $\frac{1}{4}$ or $\frac{3}{4}$ of the free-space wavelength $\lambda_0$ of the microwave, two electric field intensities of the microwaves are combined or synthesized so that strong portions and weak portions of electric field intensities are superimposed on each other as that in the first preferred embodiment.

Figure 6:
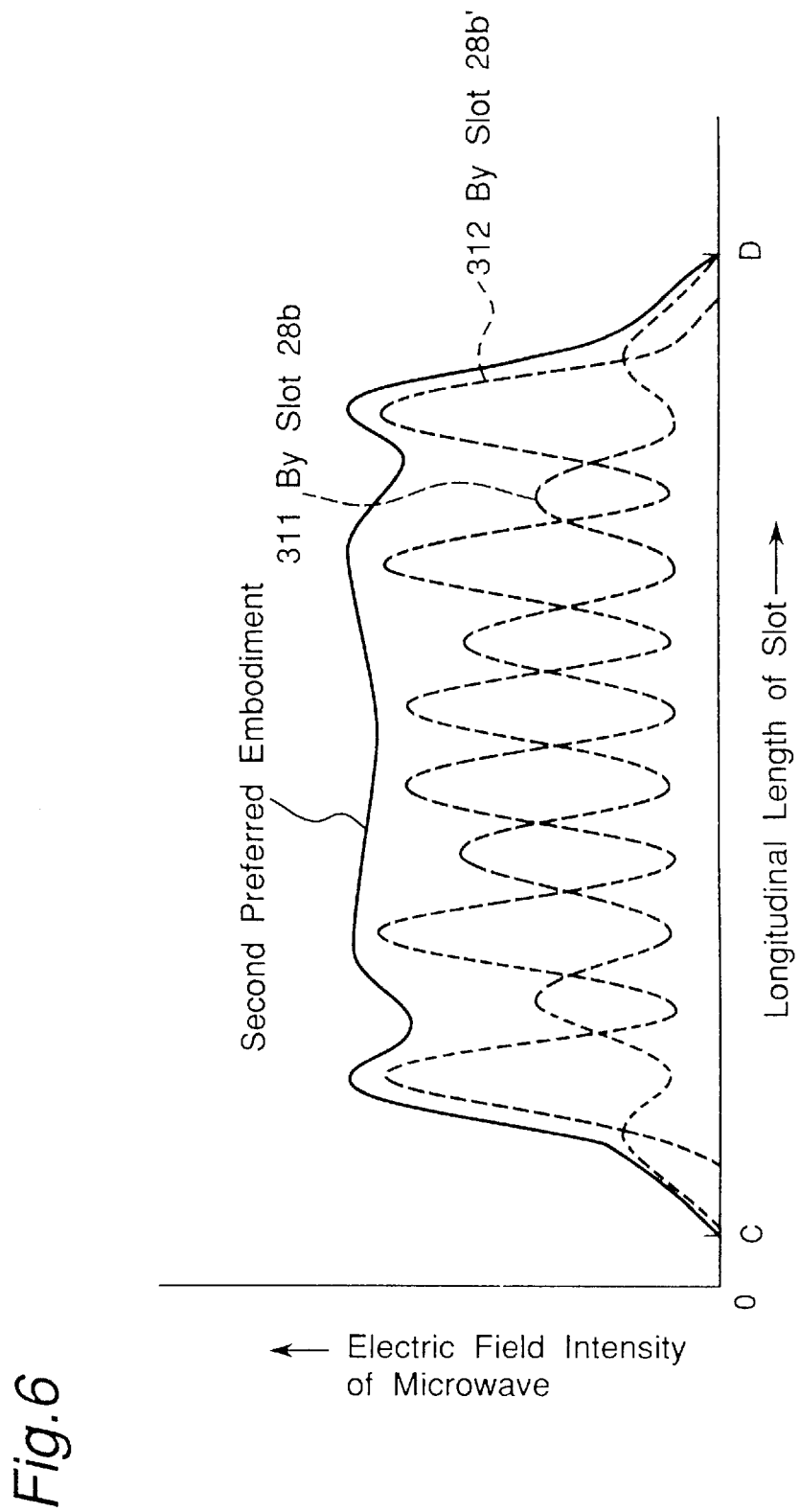
FIG. 6 is a graph showing an electric field intensity of a microwave relative to a longitudinal length of each of long slots in the plasma processing apparatus of FIG. 4.

In the plasma processing apparatus of the present preferred embodiment, the distribution of the electric field intensities of the microwaves radiated from the long slots 28b and 28b' is shown by a solid line of FIG. 6, so that the distribution of the electric field intensity of the combined microwave becomes more uniform over the entire longitudinal length of the long slots. Thus, the uniformity thereof is further improved. It is noted that broken lines 311 and 312 in FIG. 6 represent the distributions of the electric field intensities of the microwaves radiated from the long slots 28b and 28b', respectively.

<Third Preferred embodiment>

Figure 7:
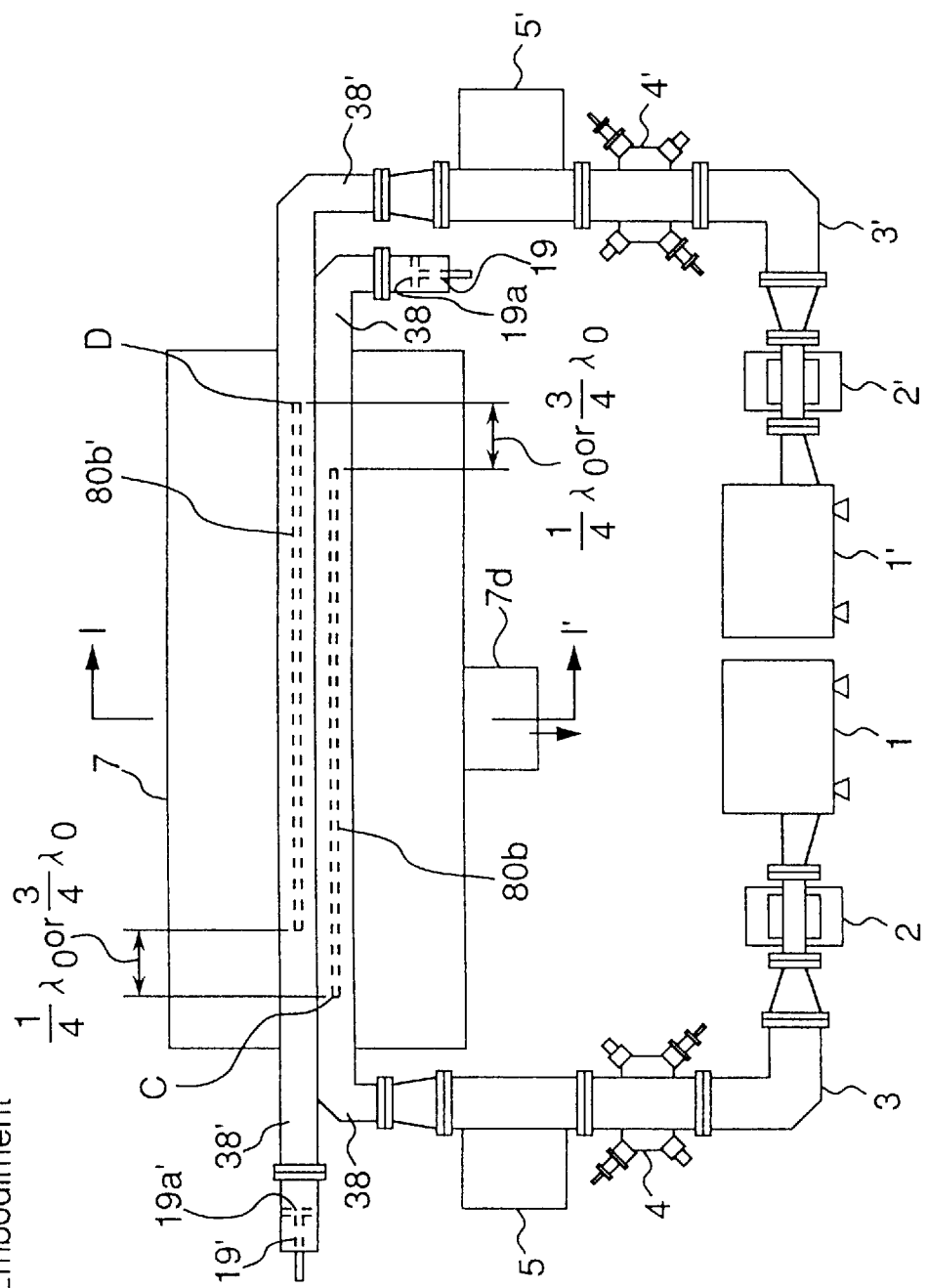
FIG. 7 is a plan view showing a general construction of a plasma processing apparatus of a third preferred embodiment according to the present invention.

FIG. 7 is a general construction view of a plasma processing apparatus showing a third preferred embodiment according to the present invention. The third preferred embodiment is arranged in a manner similar to that shown in FIG. 5 showing the second preferred embodiment, except that two rectangular waveguides 38 and 38' each provided for coupling with the plasma chamber 7, wherein the rectangular waveguides 38 and 38' have slot arrays 80b and 80b', respectively. In FIG. 7, the components similar to those shown in FIGS. 1 and 4 are designated by the same numerals as those shown in FIGS. 1 and 4.

Figure 8:
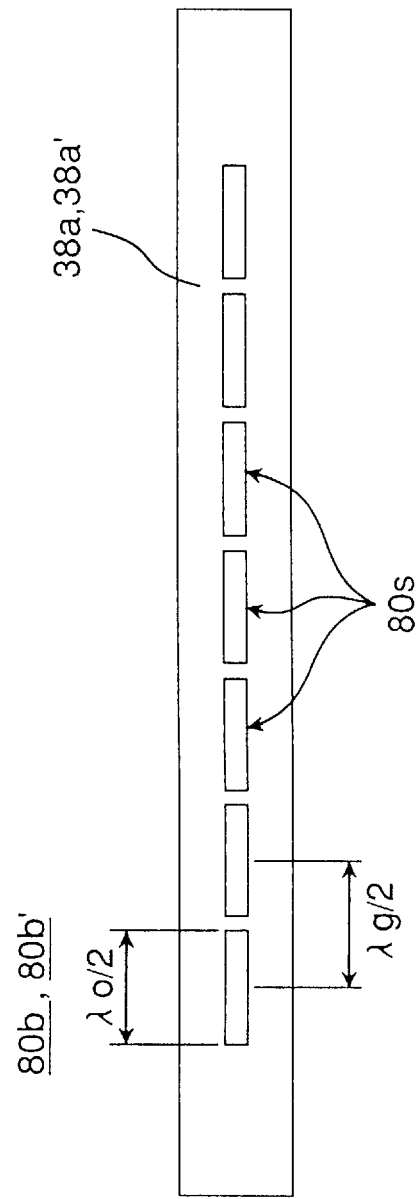
FIG. 8 is a front view of a slot array of FIG. 7.

Referring to FIG. 8, the slot arrays 80b and 80b' are provided on E-planes 38a and 38a' of the rectangular waveguides 38 and 38', respectively, along the waveguide-axis direction of the rectangular waveguides 38 and 38', and each of the slot arrays 80b and 80b' is made up from a plurality of small sub-slots 80s each formed so as to extend in the waveguide-axis direction of the rectangular waveguides 38 and 38', wherein the sub-slots 80s are arrayed in line or aligned in a gathered form. The longitudinal length of each sub-slot 80s is set to ½ of the free-space wavelength $\lambda_0$ of the microwave, and the sub-slots 80s are arrayed at intervals of ½ of the guide wavelength $\lambda g$ of each microwave propagating within the rectangular waveguides 38 and 38'. The slot arrays 80b and 80b' are positioned so as to be parallel to each other with an appropriate spacing and so as to be shifted from each other by ¼ or ¾ of the free-space wavelength $\lambda_0$ of the microwave along the waveguide-axis direction of the rectangular waveguides 38 and 38'. In the present preferred embodiment, $\lambda g > \lambda_0$.

In the plasma processing apparatus of the present preferred embodiment, if center portions of peaks of the voltage standing wave occurring within the rectangular waveguides 38 and 38' are brought so as to be each coincident with a longitudinal center portion of one sub-slot 80s of the slot arrays 80b and 80b' by moving the movable short-circuit plates 19a and 19a' of the terminating units 19 and 19' in the waveguide-axis direction of the rectangular waveguides 38 and 38', then the microwaves are radiated toward the plasma chamber 7 with a higher efficiency from the slot arrays 80b and 80b' and besides the peaks of the electric field intensities of the microwaves radiated from the sub-slots 80s of the slot arrays 80b and 80b' become substantially a constant. However, in one slot array 80b or 80b', the electric field intensities of the microwaves radiated therefrom have strong portions and weak portions alternately every halves of the free-space wavelength $\lambda_0$ of the microwave. Therefore, by shifting the slot arrays 80b and 80b' to each other by (¼)$\lambda_0$ or (¾)$\lambda_0$, two electric field intensities of the microwaves are combined or synthesized so that the strong and weak portions of the electric field intensity of the microwaves are superimposed on each other.

Figure 9:
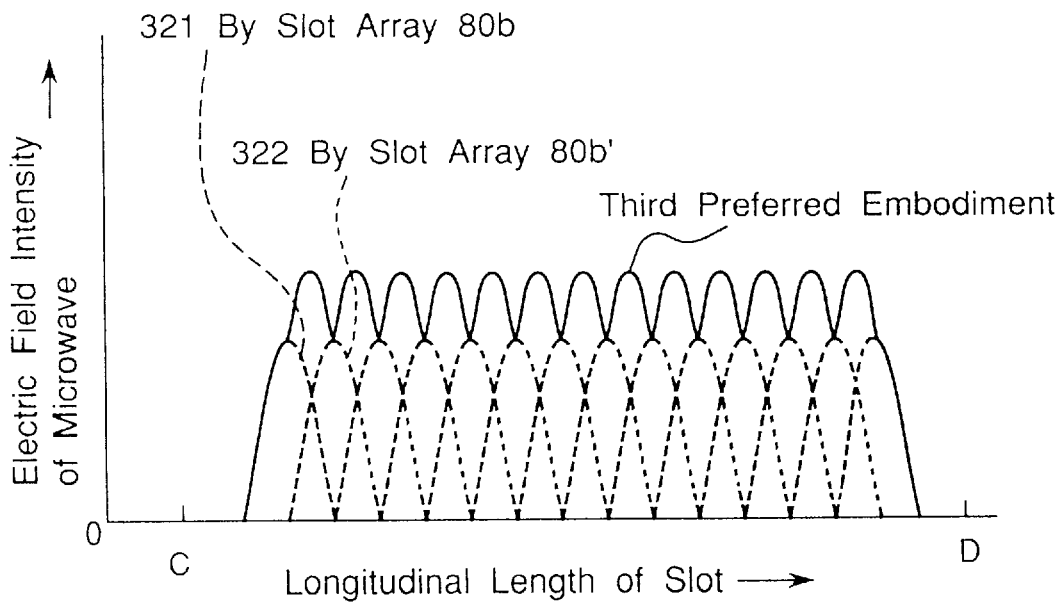
FIG. 9 is a graph showing an electric field intensity of a microwave relative to a longitudinal length of each of long slots in the plasma processing apparatus of FIG. 7.

The distributions of the electric field intensities of the microwaves radiated from the slot arrays 80b and 80b' are shown by broken lines 321 and 322, respectively, in FIG. 9. Accordingly, the distributions of the electric field intensities of the microwaves radiated from slots having a longitudinal length CD of the two slot arrays 80b and 80b' become substantially uniform over the entire longitudinal length of the slot arrays 80b and 80b' as shown by solid lines of FIG. 9. When a plasma is generated by using the resulting electric field intensity of the combined microwave, the strong portions and the weak portions of the plasma density with respect to the waveguide-axis direction of the rectangular waveguides 38 and 38'are reduced so that a more uniform plasma can be generated.

<Fourth Preferred embodiment>

FIG. 10 is a general construction view of a plasma processing apparatus showing a fourth preferred embodiment according to the present invention. This preferred embodiment is arranged in a manner similar to that as in FIG. 1 showing the first preferred embodiment, except that one rectangular waveguide 48 is provided with one slot array 80b. In FIG. 10, the components similar to those in FIG. 1 are designated by the same numerals as those shown in FIGS. 1.

The slot array 80b used in the present preferred embodiment is absolutely the same as the slot array 80b shown in FIG. 8. In a manner similar to that of FIG. 8, the longitudinal length of each sub-slot 80s illustrated in FIG. 8 is set to ½ of the free-space wavelength $\lambda_0$ of the microwave, and the sub-slots 80s are arranged at intervals of ½ of the guide wavelength $\lambda g$ of the microwave propagating within the rectangular waveguide 48.

In the plasma processing apparatus of the present preferred embodiment, if center portions of peaks of the voltage standing wave occurring within the rectangular waveguide 48 are brought so as to be coincident with longitudinal center portions of the individual sub-slots 80s of the slot array 80b by moving the movable short-circuit plate 19a of the terminating unit 19 in the waveguide-axis direction of the rectangular waveguide 48, then the microwaves are radiated toward the plasma chamber 7 with a higher efficiency from the slot array 80b and besides, peaks of the electric field intensity of the microwave radiated from the sub-slots 80s of the slot array 80b become substantially a constant.

Figure 11:
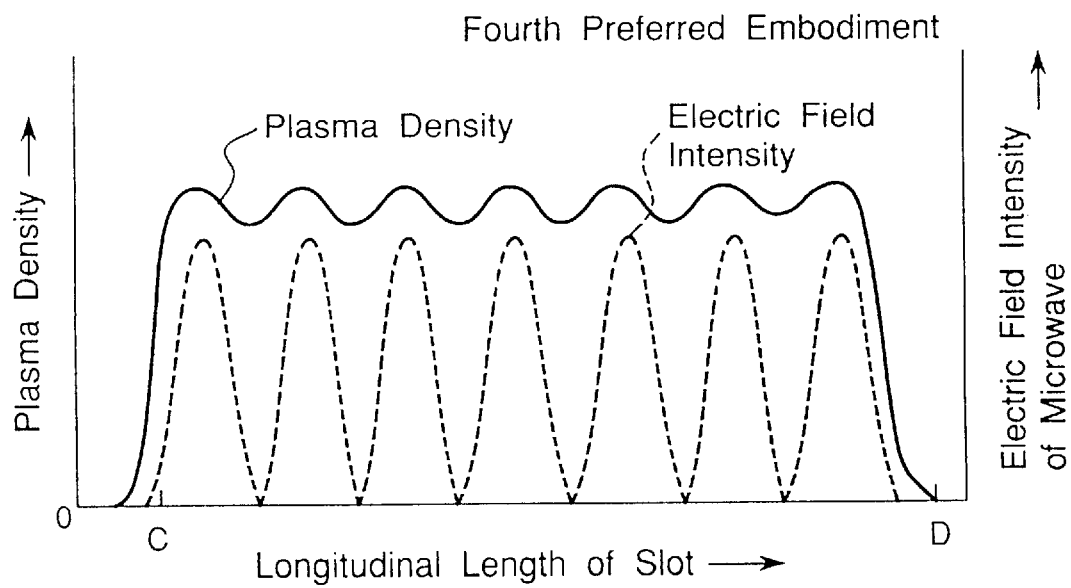
FIG. 11 is a graph showing a plasma density and an electric field intensity of a microwave relative to a longitudinal length of a long slot in the plasma processing apparatus of FIG. 10.

The distribution of the electric field intensity of the microwave radiated from the slot array 80b is such that, as shown by broken lines of FIG. 11, strong portions and weak portions of electric field intensities of the microwaves with respect to the waveguide-axis direction of the rectangular waveguide 48 are reduced over the entire longitudinal length of the slot array 80b. When a plasma is generated by using the resultant electric field intensity of the combined microwave, for example, with a relatively low gas pressure, the plasma density distribution becomes a state shown by a solid line of FIG. 11. Thus, a plasma with good uniformity can be generated despite the presence of the strong portions and the weak portions of the electric field intensities of the microwaves.

<Fifth Preferred embodiment>

Figure 13:
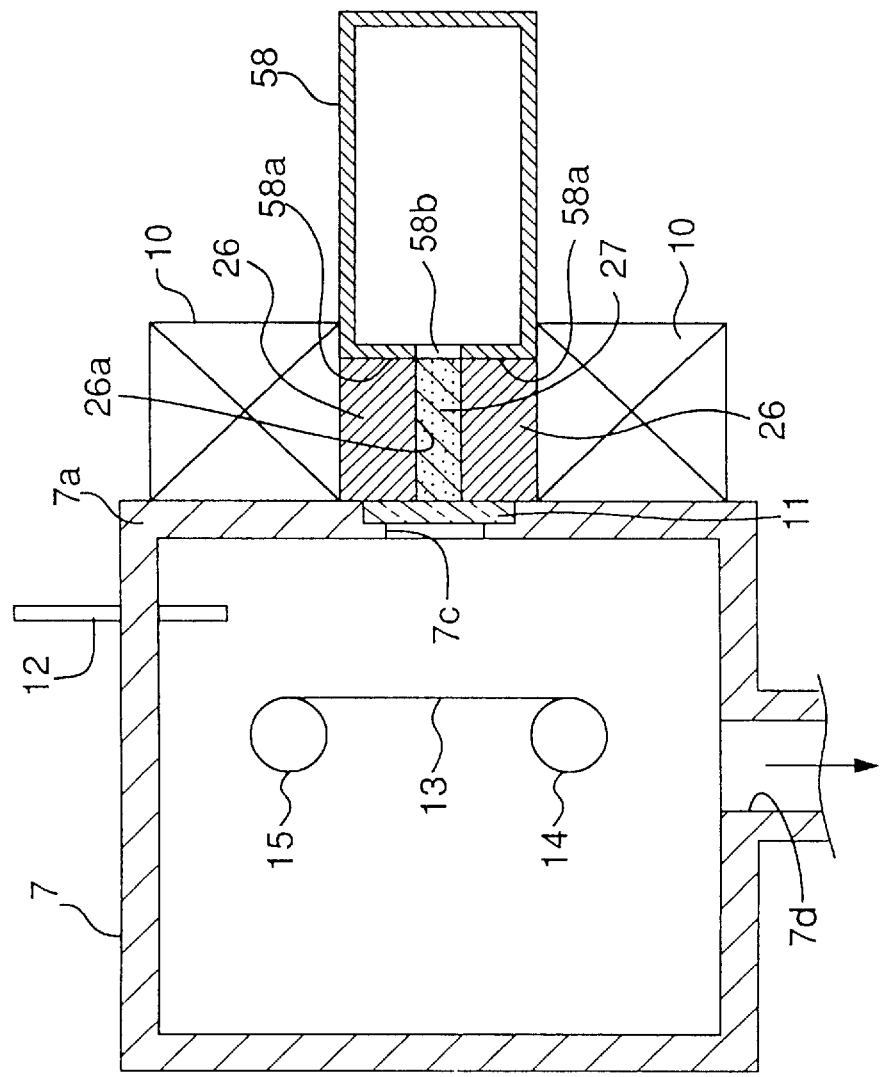
FIG. 13 is a cross-sectional view taken along a line I—I' of FIG. 12.

FIG. 12 is a general construction view showing a fifth preferred embodiment according to the present invention, and FIG. 13 is a partly cross-sectional view taken along a line I—I' of FIG. 12. In FIGS. 12 and 13, there are shown the followings:

(a) a microwave power supply 1;

(b) an isolator 2;

(c) corner rectangular waveguides 3 and 6;

(d) a directional coupler 4;

(e) an automatic impedance matching device 5;

(f) a plasma chamber 7; and (g) a terminating unit 19. These components are arranged in a manner similar to that in FIG. 1 showing the first preferred embodiment. Further, there is shown a rectangular waveguide 58 for coupling with the plasma chamber 7 wherein the rectangular waveguide 58 has a long slot 58b formed onto an E-plane 58a of the rectangular waveguide 58. Further, in FIG. 13, there are shown a microwave waveguide forming member 26 having a microwave waveguide 26a, and a solid dielectric 27 inserted in the microwave waveguide 26a. In FIGS. 12 and 13, the components similar to those shown in FIGS. 1 and 2 are designated by the same numerals as those shown in FIGS. 1 and 2.

In the present preferred embodiment, the microwave waveguide forming member 26 is composed of a good electrical conductor metal such as copper, aluminum or the like, and electrically connects the plasma chamber 7 with the rectangular waveguide 58. The cross section of the microwave waveguide forming member 26 is formed into a narrow rectangular shape, which is identical to that of the long slot 58b.

Figure 14:
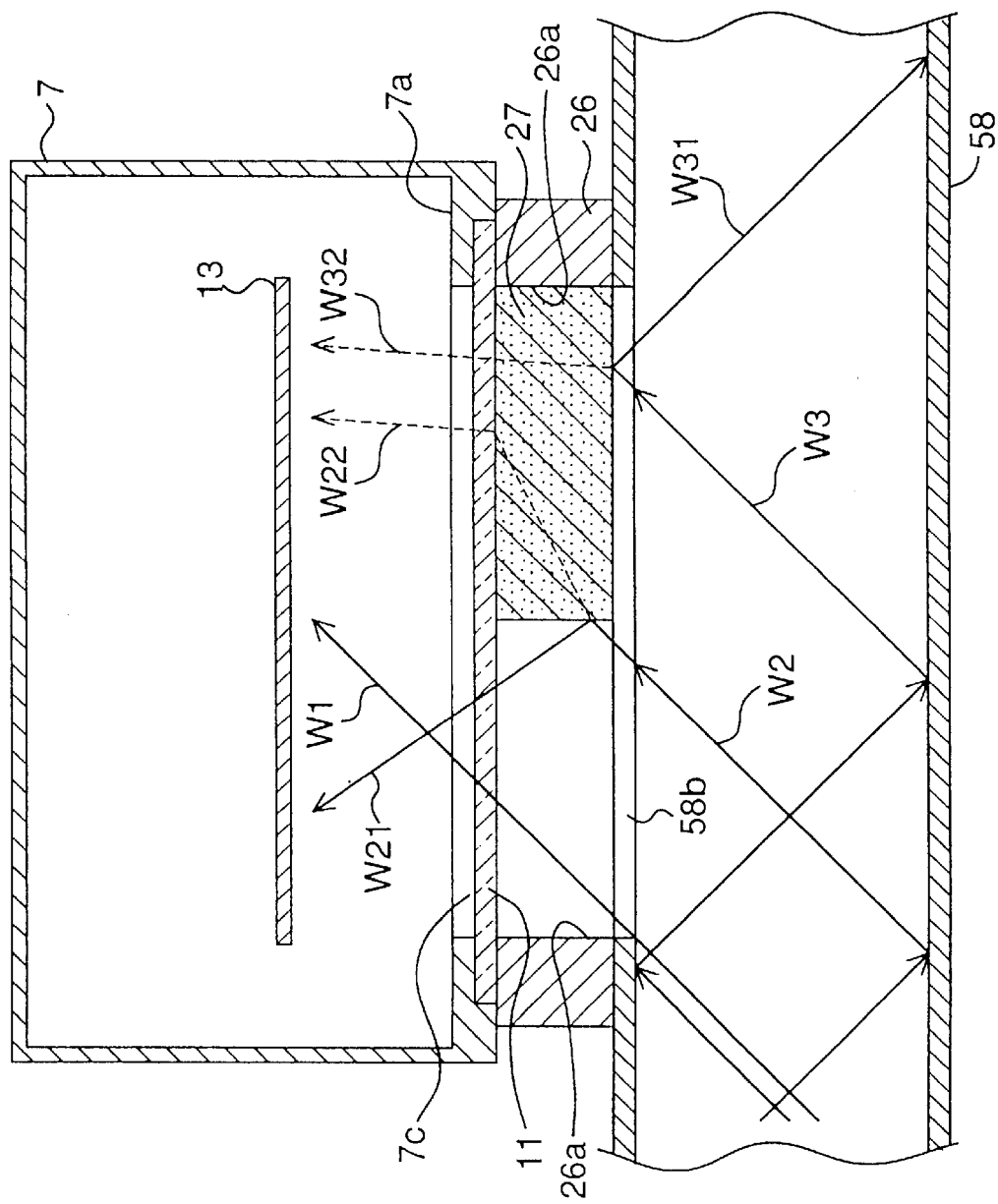
FIG. 14 is a cross-sectional view taken along a line T—T' of FIG. 12.

FIG. 14 is a partly cross-sectional view taken along a line T—T' of FIG. 12. Into the microwave waveguide 26a of the microwave waveguide forming member 26, the dielectric 27 of, for example, a rectangular parallelopiped shape is inserted, wherein the dielectric 27 is composed of a substance which does not absorb the microwave, for example, which is made of ceramics, synthetic resin or the like. By selecting as the dielectric 27 a substance that does not absorb the microwave, a microwave is partly reflected by the dielectric 27 and the remaining microwave is transmitted by the dielectric to reach the window 7c of the plasma chamber 7.

In the plasma processing apparatus of the present preferred embodiment, by inserting the dielectric 27 on the termination side of the rectangular waveguide 58, that is, at a position where the microwave electric field is relatively strong a microwave W2 is reflected by the dielectric 27, then the reflected microwave becomes a microwave W21, while the remaining microwave is transmitted through the dielectric 27 so as to become a microwave W22. The microwave W21 acts to intensify the originally weak portions of the electric field intensity of the microwave within the plasma chamber 7, whereas the microwave W22, conversely, has been attenuated so as to have a microwave power less than that of the microwave W2, acting to weaken the originally strong portions of the electric field intensity of the microwave in the plasma chamber 7. This being the case also with the microwave W3, a microwave W31 reflected by the dielectric 27 is reflected by the movable short-circuit plate 19a, and the reflected microwave is finally supplied to the plasma chamber 7. On the other hand, a microwave W32 which has passed through the dielectric 27 has been further attenuated so as to have a less microwave power in a manner similar to that of the microwave W22, so that the microwave W32 acts to weaken the originally strong portions of the electric field intensity of the microwave.

Figure 15:
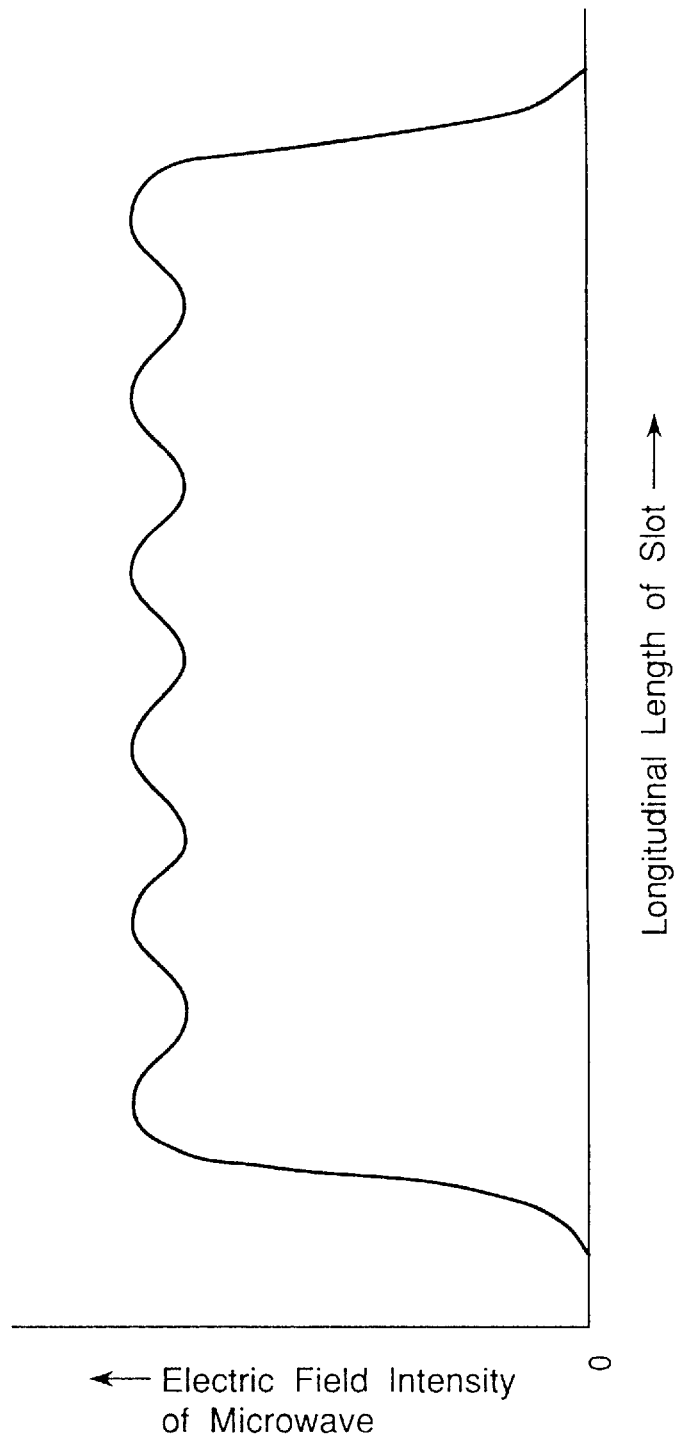
FIG. 15 is a graph showing an electric field intensity of a microwave relative to a longitudinal length of a long slot in the plasma processing apparatus of FIG. 12.

The distribution of the electric field intensity of the microwave radiated from the long slot 58b is, as shown in FIG. 15, substantially uniform along the longitudinal direction of the plasma chamber 7, so that the uniformity of the distribution of the electric field intensity of the microwave is further improved. Thus, a plasma with a higher density can be generated.

Figure 16:
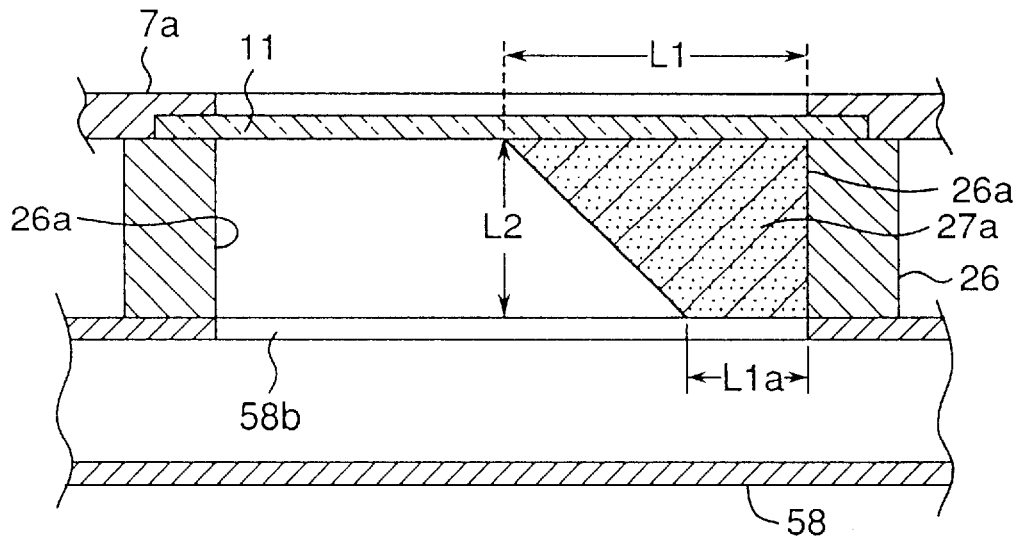
FIG. 16 is a cross-sectional view corresponding to part of FIG. 14, showing a plasma processing apparatus of a first modification of the fifth preferred embodiment according to the present invention.
Figure 17:
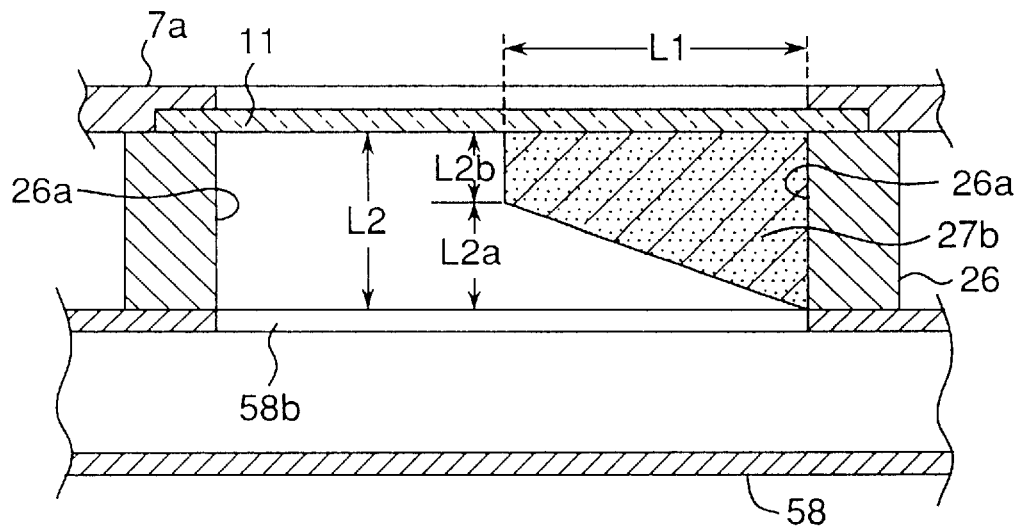
FIG. 17 is a cross-sectional view corresponding to a part of FIG. 14, showing a plasma processing apparatus of a second modification of the fifth preferred embodiment according to the present invention.

Dielectrics 27a and 27b shown in FIGS. 16 and 17 are modifications in the shape of the dielectric 27, and are designed for attaining more uniformity of the distribution of the electric field intensity of the microwave by gradually reducing the thickness of each of the dielectrics 27a and 27b over a range or area from the strong portions to the weak portions of the electric field intensity of the microwave. That is, in the case of FIG. 16, the cross-sectional shape of the dielectric 27a has a width L1a on the rectangular waveguide 58 side, a width L1 (>L1a) on the plasma chamber 7 side, and a thickness L2. Further, in the case of FIG. 17, the cross-sectional shape of the dielectric 27b has a maximum thickness L2 (=L2a+L2b) and a maximum width L1, wherein the thickness of the dielectric 27b is changed from 0 to L1 in a portion of thickness L2a on the rectangular waveguide 58 side.

Figure 18:
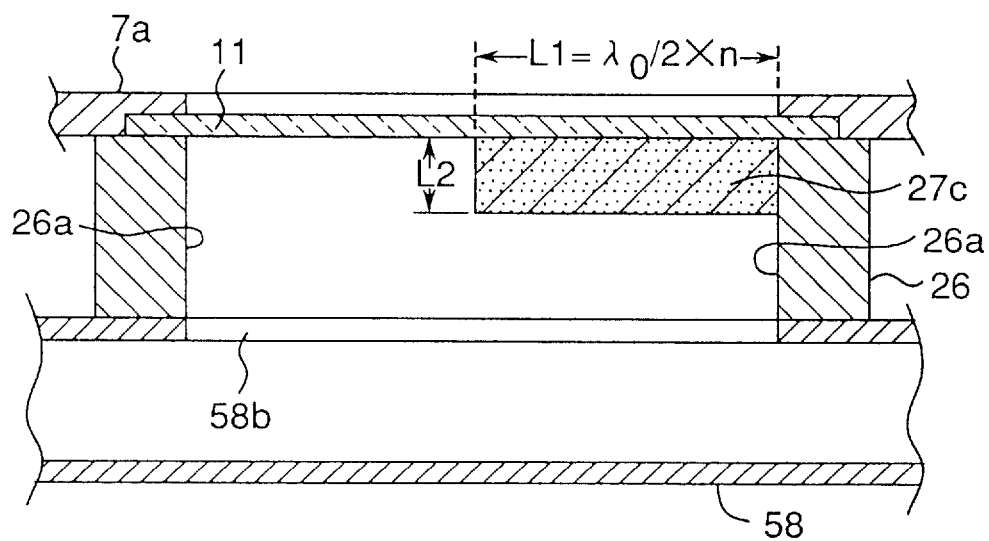
FIG. 18 is a cross-sectional view corresponding to a part of FIG. 14, showing a plasma processing apparatus of a third modification of the fifth preferred embodiment according to the present invention.

A dielectric 27c shown in FIG. 18 is predetermined in dimensions, so as to have a width L1 and a thickness L2. The electric field intensity of the microwave radiated into the plasma chamber 7, as shown in FIG. 43, has the strong portions and the weak portions alternating with a cycle corresponding to ½ of the free-space wavelength $\lambda_0$ of the microwave. Accordingly, by setting the longitudinal length L1 of the dielectric 27c along the longitudinal direction of the long slot 58b to n/2 (where n is a natural number) of the free-space wavelength $\lambda_0$ of the microwave, a better matching with the space on the plasma chamber 7 side can be obtained. Thus, the supply efficiency of the microwave is enhanced while the disturbance of the electric field intensities of the microwave radiated into the plasma chamber 7 can be minimized.

Figure 19:
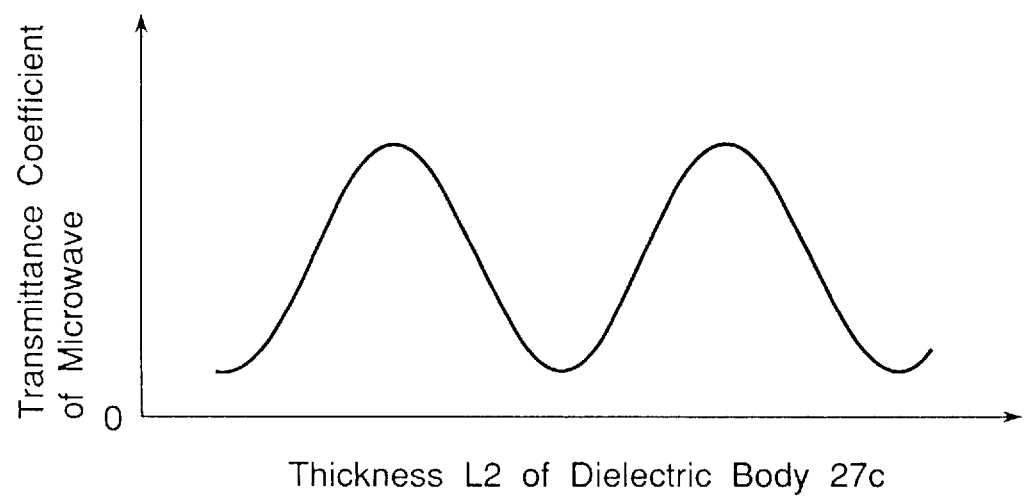
FIG. 19 is a graph showing a microwave transmittance coefficient relative to a thickness of a dielectric in the plasma processing apparatus of FIG. 18.

Further, based on FIG. 19, which shows the relationship between the thickness L2 and the microwave transmittance coefficient of the dielectric 27c, if the microwave transmittance coefficient of the dielectric 27c is adjusted by increasing or decreasing the insertion length L2 of the dielectric 27c into the microwave waveguide 26a over a range or area from the strong portion to the weak portion of the electric field intensity of the microwave, then the distribution of the electric field intensity of the microwave along the longitudinal direction of the plasma chamber 7 can be enhanced in uniformity. That is, the insertion length L2 is selectively set so that the transmittance coefficient of the dielectric 27c is reduced at regions where the electric field intensity of the microwave is relatively higher, while the transmittance coefficient of the dielectric 27c is increased at regions where the electric field intensity of the microwave is relatively lower. In other words, the insertion length L2 is set by adjusting the transmittance coefficient of the dielectric 27c so that a uniform field distribution can be attained along the longitudinal direction of the plasma chamber 7.

In order that the reflection of the microwave by the dielectrics 27, 27a, 27b and 27c is increased, a substance having a large dielectric constant $\epsilon_r$ may be selected for those dielectrics 27, 27a, 27b and 27c since the characteristic impedance in a dielectric medium depends on the dielectric constant $\epsilon_r$ thereof and is $1/(\epsilon_r)^{1/2}$ times the value in vacuum. In this case, for example, a dielectric material such as ceramics, alumina or the like may be used.

On the other hand, in order that the reflection of the microwaves by the dielectrics 27, 27a, 27b and 27c is decreased, a substance having a small dielectric constant $\epsilon_r$ may be selected for those dielectrics 27, 27a, 27b and 27c. For example, a synthetic resin such as polyethylene or Teflon may be used as the dielectrics. There is such an advantageous effect that synthetic resins are easy to process so that an arbitrary shape can be obtained.

<Sixth Preferred embodiment>

Figure 20:
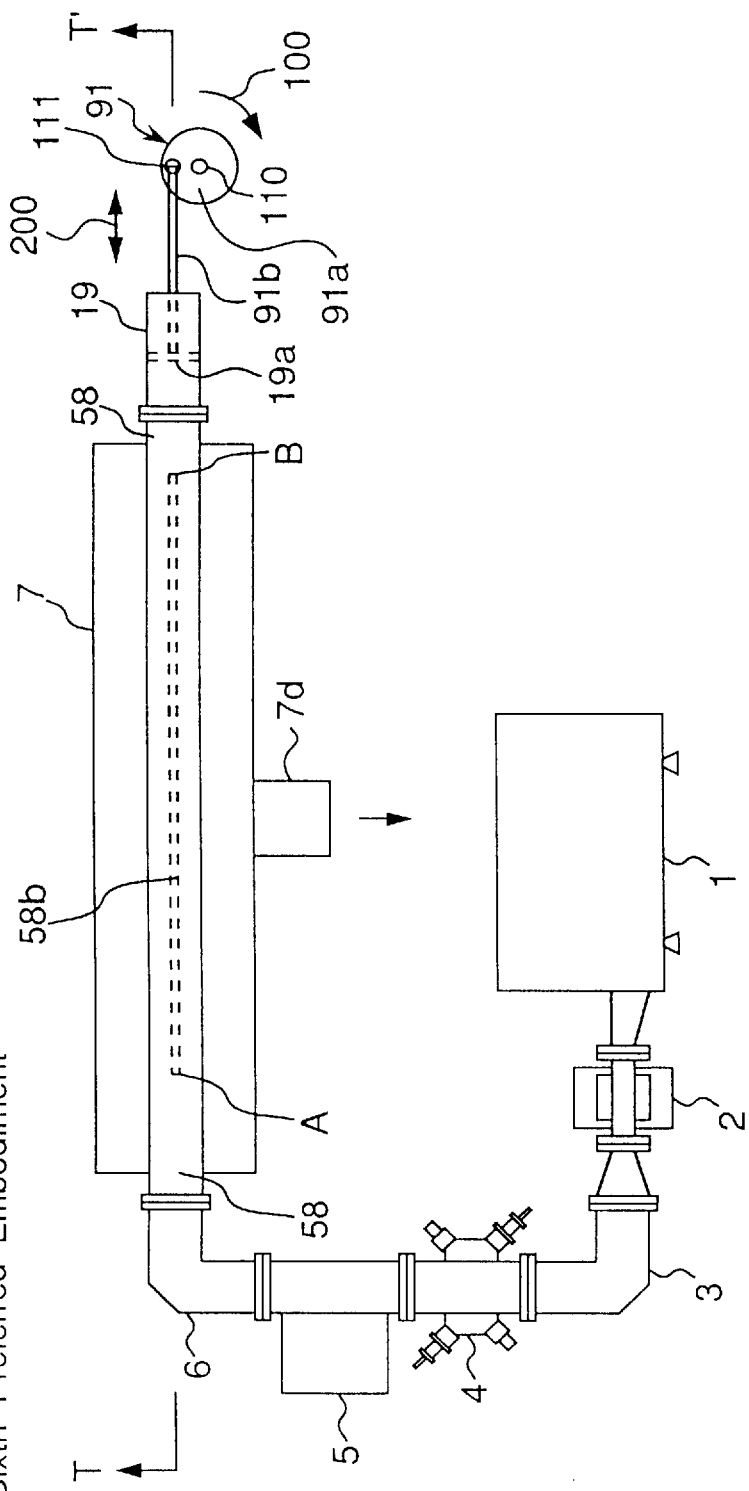
FIG. 20 is a plan view showing a general construction of a plasma processing apparatus of a sixth preferred embodiment according to the present invention.
Figure 21:
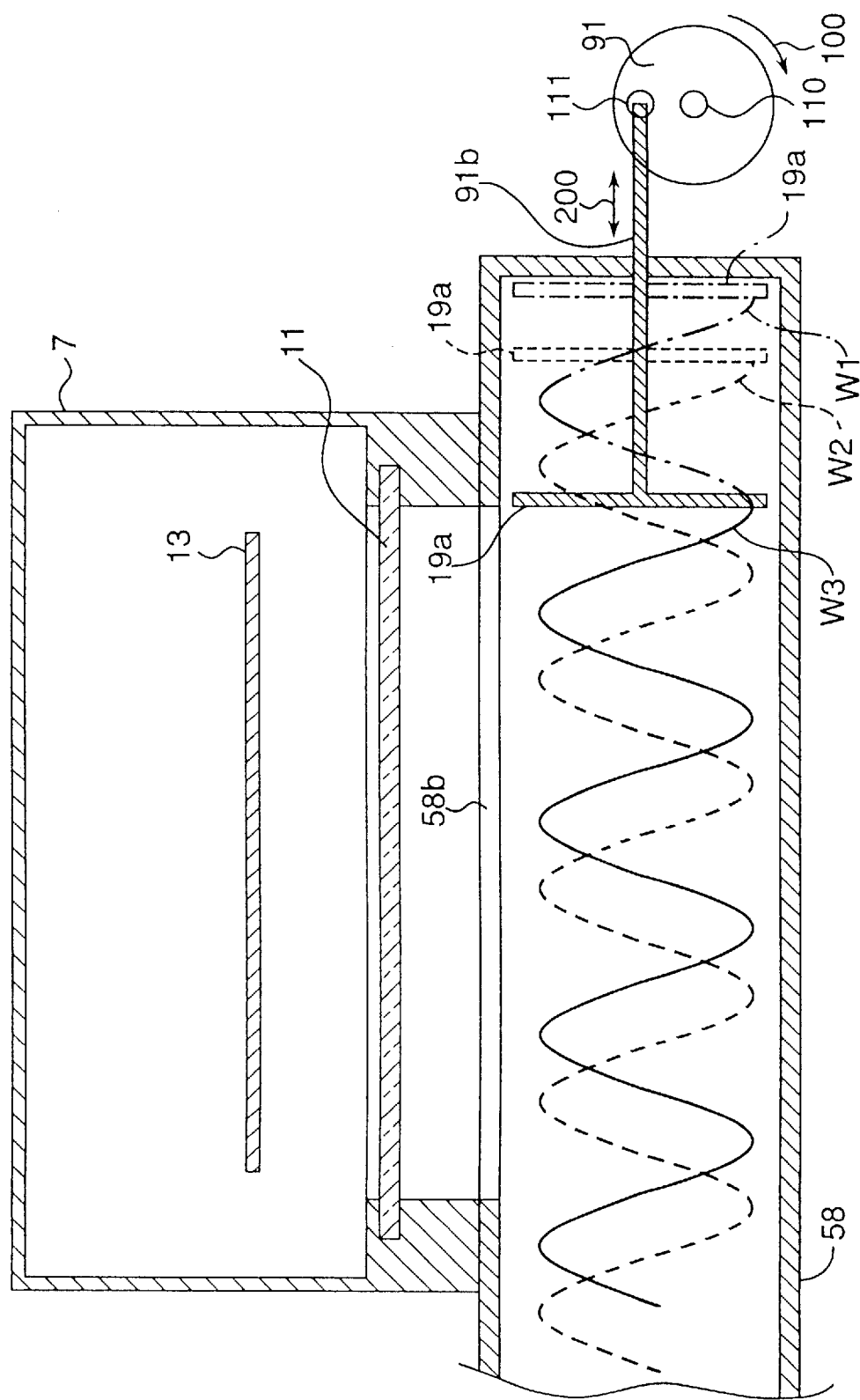
FIG. 21 is a cross-sectional view taken along a line T—T' of FIG. 20.

FIG. 20 is a general construction view showing a sixth preferred embodiment according to the present invention. FIG. 21 is a partly cross-sectional view taken along a line T—T' of FIG. 20. In FIG. 20, there are shown the followings:

(a) a microwave power supply 1;

(b) an isolator 2;

(c) corner rectangular waveguides 3 and 6;

(d) a directional coupler 4;

(e) an automatic impedance matching device 5;

(f) a plasma chamber 7;

(g) a rectangular waveguide 58 for coupling with the plasma chamber 7; and (h) a terminating unit 19. These components are arranged in a manner similar to that shown in FIG. 12 showing the fifth preferred embodiment. Further, there is shown in FIG. 20, a short-circuit plate driving unit 91 for driving a movable short-circuit plate 19a into reciprocating movement in the waveguide-axis direction of the rectangular waveguide 58.

The short-circuit plate driving unit 91 comprises a disc 91a supported by a shaft 110 at the center of the disc 91a and rotated in a rotational direction of arrow 100 by a stepping motor or the like, and a drive bar 91b whose one end is supported by a shaft 111 so that the drive bar 91b can be rotated about a peripheral end portion of the disc 91a away from the center thereof, whereas another end of the drive bar 91b is connected to the center portion of the movable short-circuit plate 19a. By controlling the rotation of the stepping motor, that is, the rotation of the disc 91a from external by a personal computer (not shown), the movable short-circuit plate 19a can be reciprocatingly moved automatically and yet periodically or non-periodically along the waveguide-axis direction of the rectangular waveguide 58, as indicated by arrow 200.

In the plasma processing apparatus of the present preferred embodiment, as shown in FIG. 21, as the movable short-circuit plate 19a is moved along the waveguide-axis direction of the rectangular waveguide 58, the standing wave occurring within the rectangular waveguide 58 also changes depending on the movement of the movable short-circuit plate 19a. Therefore, the standing wave changes as W1, W2, W3, W2, W1, W2, W3, . . . when reciprocatingly moving the movable short-circuit plate 19a along the waveguide-axis direction. In FIG. 21, the standing wave W1 is shown by a one-dot chain line, the standing wave W2 is shown by a broken line, and the standing wave W3 is shown by a solid line. In the present preferred embodiment, by moving the strong portions of the electric field intensity of the microwave radiated from the long slot 58b back and forth along the waveguide-axis direction of the rectangular waveguide 58, the plasma can be radiated apparently substantially uniformly to the individual sections of the object 13 to be processed.

Figure 22:
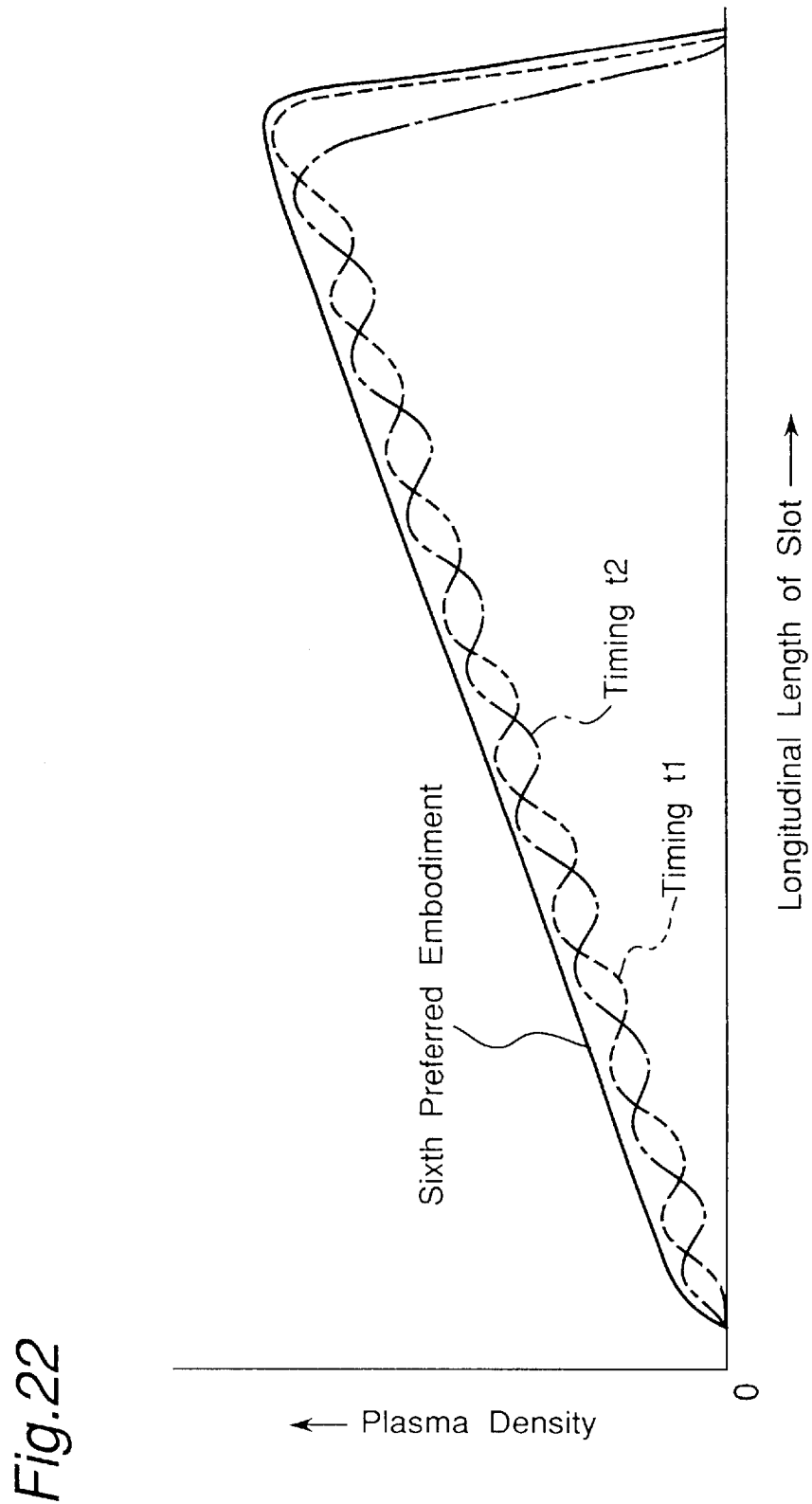
FIG. 22 is a graph showing a plasma density relative to a longitudinal length of a long slot in the plasma processing apparatus of FIG. 20.

The plasma density distribution due to the electric field intensity of the microwave radiated from the long slot 58b is, as shown by a solid line of FIG. 22, more uniform along the longitudinal direction of the plasma chamber 7. It is noted that the broken lines shown in FIG. 22 represent plasma density distributions at timings t1 and t2.

In the present preferred embodiment, it is preferable to set the moving distance of the movable short-circuit plate 19a to at least approximately ½ of the guide wavelength $\lambda$g of the rectangular waveguide 58, and so as to move the movable short-circuit plate 19a continuously over the distance thereof. It is preferable to set the moving cycle of the movable short-circuit plate 19a to a period, for example, not more than 1/10 of the processing time of the sheet-shaped object 13 to be processed.

<Seventh Preferred embodiment>

Figure 23:
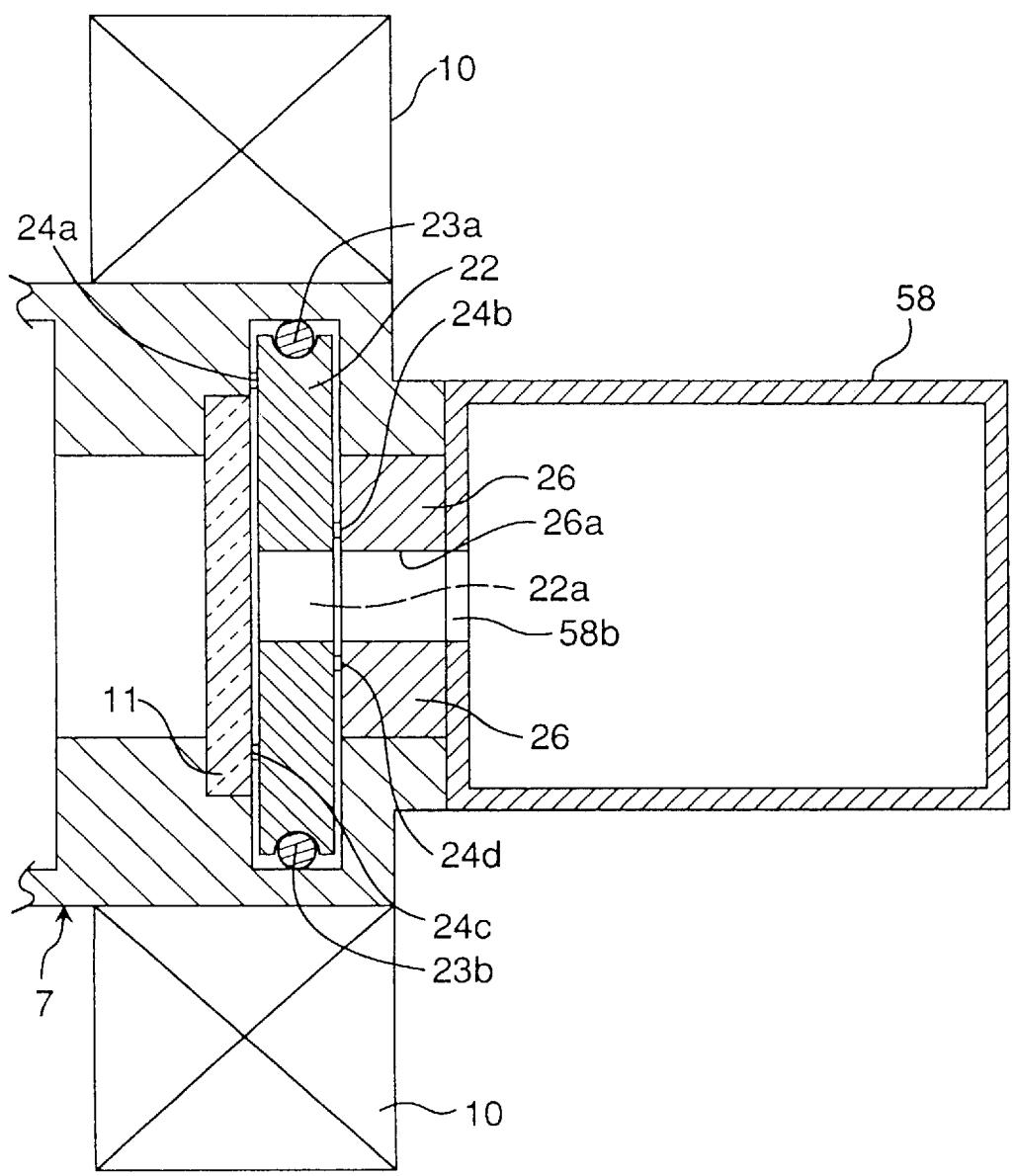
FIG. 23 is a cross-sectional view corresponding to a part of FIG. 14, showing a plasma processing apparatus of a seventh preferred embodiment according to the present invention.
Figure 24:
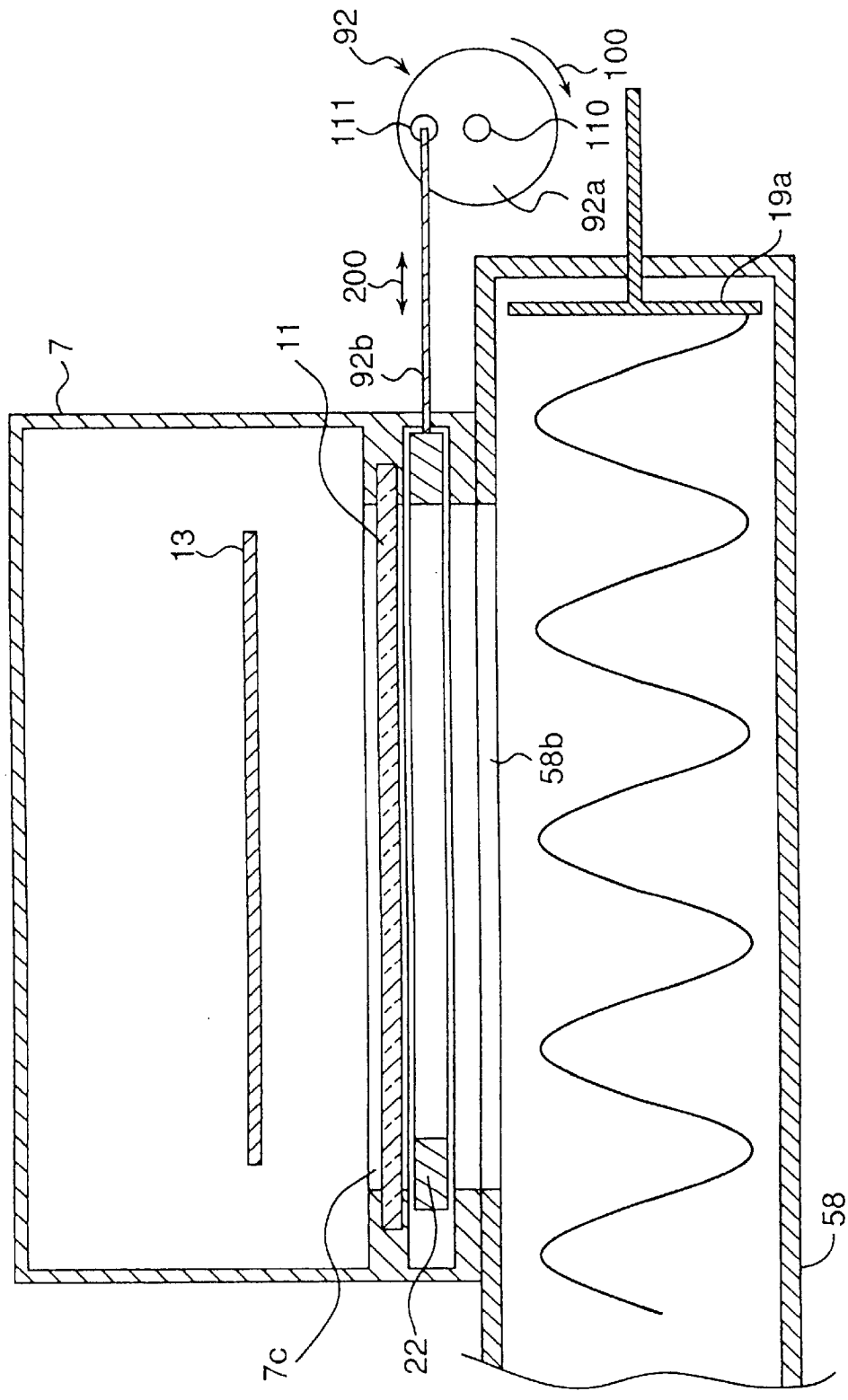
FIG. 24 is a cross-sectional view corresponding to FIG. 15, showing the plasma processing apparatus of FIG. 23.

FIG. 23, showing a seventh preferred embodiment according to the present invention, is a partly cross-sectional view taken along the line I—I' of FIG. 12 showing the fifth preferred embodiment. FIG. 24 is a cross-sectional view taken along a line equivalent to the line T—T' of FIG. 12. In FIGS. 23 and 24, there are shown a movable slot plate 22, bearings 23a and 23b, flexible conductors 24a, 24b, 24c and 24d, and a slot plate driving unit 92 for driving the movable slot plate 22. In FIGS. 23 and 24, the components similar to those shown in FIGS. 12 and 13 are designated by the same numerals as those shown in FIGS. 12 and 13.

The movable slot plate 22 is composed of a good electrical conductor metal such as aluminum, copper, stainless or the like, and is provided in a space between the long slot 58b and the microwave transmitting window 11 in such a way that the movable slot plate 22 can be moved along the waveguide-axis direction of the rectangular waveguide 58 periodically or non-periodically by the bearings 23a and 23b arranged above and below the movable slot plate 22 and the flexible conductors 24a, 24b, 24c and 24d arranged on side faces of the movable slot plate 22. In the movable slot plate 22, a rectangular opening 22a whose length along the waveguide-axis direction of the rectangular waveguide 58 is, for example, $\lambda_0/2$ shorter than the longitudinal length of the long slot 58b and whose width is equal to the width of the long slot 58b is provided, wherein the long slot 58b, the microwave waveguide 26a, and the opening 22a form a waveguide by which the microwave propagates from the rectangular waveguide 58 toward the plasma chamber 7. Still further, the plasma chamber 7 and the microwave waveguide forming member 26 are electrically connected to each other by the flexible conductors 24a, 24b, 24c and 24d. Further, the bearings 23a and 23b are provided so that the movable slot plate 22 can be smoothly moved along the waveguide-axis direction of the rectangular waveguide 58. In addition, the microwave waveguide forming member 26 electrically connects the plasma chamber 7 with the rectangular waveguide 58.

The slot plate driving unit 92 comprises a disc 92a supported by a shaft 110 at the center of the disc 92a and rotated in a rotational direction of arrow 100 by a stepping motor or the like, and a drive bar 92b whose one end is supported by a shaft 111 so that the drive bar 92b can be rotated about a peripheral end portion of the disc 92a away from the center thereof, wherein another end of the drive bar 92b is connected to the center portion of the movable slot plate 22. By controlling the rotation of the stepping motor, that is, the rotation of the disc 92a from an external personal computer (not shown), the movable slot plate 22 can be reciprocatingly moved automatically and yet periodically or non-periodically along the waveguide-axis direction of the rectangular waveguide 58, as indicated by arrow 200.

In the plasma processing apparatus of the present preferred embodiment, as shown in FIGS. 25 and 16, as the movable slot plate 22 is moved along the waveguide-axis direction of the rectangular waveguide 58, the electric field intensity of the microwave radiated from the long slot 58b also changes depending on the movement of the movable slot plate 22. Therefore, by periodically reciprocatingly moving the movable slot plate 22 in the waveguide-axis direction of the rectangular waveguide 58, the movable slot plate 22 is moved so as to be positioned at positions of a timing t1, a timing t2, a timing t3, a timing t2, a timing t1, a timing t2 . . . That is, by moving the strong portions of the electric field intensity of the microwave radiated from the long slot 58b back and forth in the waveguide-axis direction of the rectangular waveguide 58, the plasma can be radiated apparently substantially uniformly to the individual sections of the object 13 to be processed.

The plasma density distribution due to the electric field intensity of the microwave radiated from the long slot 58b is, as shown by a solid line of FIG. 22 in the sixth preferred embodiment, more further uniform along the longitudinal direction of the plasma chamber 7.

<Eighth Preferred embodiment>

FIG. 26, showing an eighth preferred embodiment according to the present invention, is a partly cross-sectional view taken along the line T—T' of FIG. 12 showing the fifth preferred embodiment, wherein designated by numerals 10a and 10b are magnetic-field generators.

The magnetic-field generators 10a and 10b each comprise an air-core coil connected to a power supply (not shown), and are placed around the connecting portion between the plasma chamber 7 and the rectangular waveguide 58, in such a relationship that the center axes of the aircore coils thereof are shifted from each other by an angle θ (rad) so that a magnetic field is generated around the microwave transmitting window 11. These magnetic-field generators 10a and 10b form divergent magnetic-field generating means, as will be detailed later.

In the plasma processing apparatus of the present preferred embodiment, when currents having different phases by 90° from each other and being half-wave-rectified are supplied to the magnetic-field generators 10a and 10b, there can be obtained an oscillating magnetic field whose magnitude is a constant and whose lines of magnetic force continuously change from a solid line 301 (H1) to a broken line 302 (H2). Then, electrons and ions in the plasma generated within the plasma chamber 7 are supplied to the object 13 under constraint by these lines of magnetic force. That is, by changing the lines of magnetic force with time and space, non-uniform plasma can be projected in an evenly equal amount of plasma radiation onto the object 13 to be processed, and then, the uniformity of plasma processing can be further improved.

The plasma density distribution due to the electric field intensity of the microwave radiated from the long slot 58b is, as shown by a solid line of FIG. 22 in the sixth preferred embodiment, more further uniform along the longitudinal direction of the plasma chamber 7.

The angle θ formed by the center axes of the magnetic-field generators 10a and 10b may be preferably set to about $(\lambda_0/2)/d$ since the interval between peaks and valleys of the standing wave of the electric field of the microwave radiated from the long slot 58b to the plasma chamber 7 is $\lambda_0/4$. In this case, d denotes the distance from the microwave transmitting window 11 to the object 13 to be processed, and $\lambda_0$ is the free-space wavelength of the microwave.

<Ninth Preferred embodiment>

FIG. 27 is a schematic construction view of a plasma processing apparatus showing a ninth preferred embodiment according to the present invention, in which the second preferred embodiment and the fifth preferred embodiment are combined together.

Referring to FIG. 27, there are shown a plasma chamber 7, and rectangular waveguides 58 and 58' each provided for coupling with the plasma chamber 7 wherein the rectangular waveguides 58 and 58' have long slots 58b and 58b', respectively, formed in the E-planes 58a and 58a' of the rectangular waveguides 58 and 58' so as to extend in the waveguide-axis direction. These long slots 58b and 58b' are arranged so as to be parallel to each other with an appropriate spacing and so as to be shifted in the waveguide-axis direction of the rectangular waveguides 58 and 58' from each other by ¼ or ¾ of the free-space wavelength $\lambda_0$ of the microwave. Further, the rectangular waveguides 58 and 58' are connected at one end thereof to a microwave power supply (not shown) so that the microwaves are supplied thereto in directions different from each other and parallel to each other, that is, for example as shown in FIG. 27, the microwave propagates in a direction from the front side toward the rear side of the paper sheet of the figure in the upper rectangular waveguide 58, and the other microwave propagates in the opposite direction in the lower rectangular waveguide 58'.

Further, the rectangular waveguides 58 and 58' are each connected at another end to a terminating unit provided with a short-circuit plate, as in the second preferred embodiment of FIG. 4. Thus, by adjusting the automatic impedance matching devices, which are provided between the rectangular waveguides 58 and 58' and the microwave power supply, and the above-mentioned short-circuit plate, the microwave can be supplied to the plasma chamber 7 with a higher efficiency.

A microwave waveguide forming member 36 electrically connects the rectangular waveguides 58 and 58' with the plasma chamber 7, and the cross section of each of the microwave waveguides 36a and 36a' has a narrow rectangular shape which is identical to that of the long slots 58b and 58b'.

Figure 28:
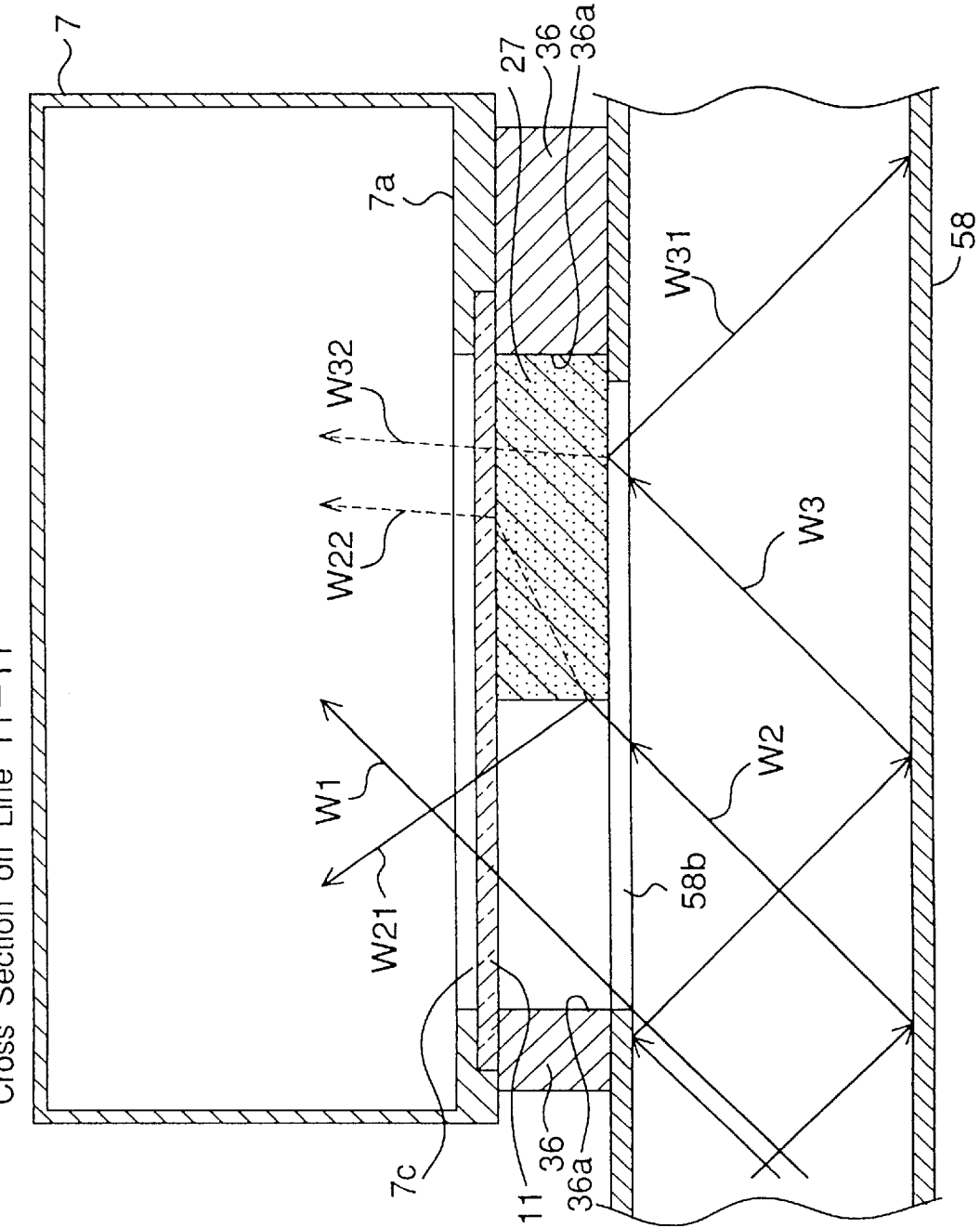
FIG. 28 is a cross-sectional view taken along a line T1—T1' of FIG. 27.
Figure 29:
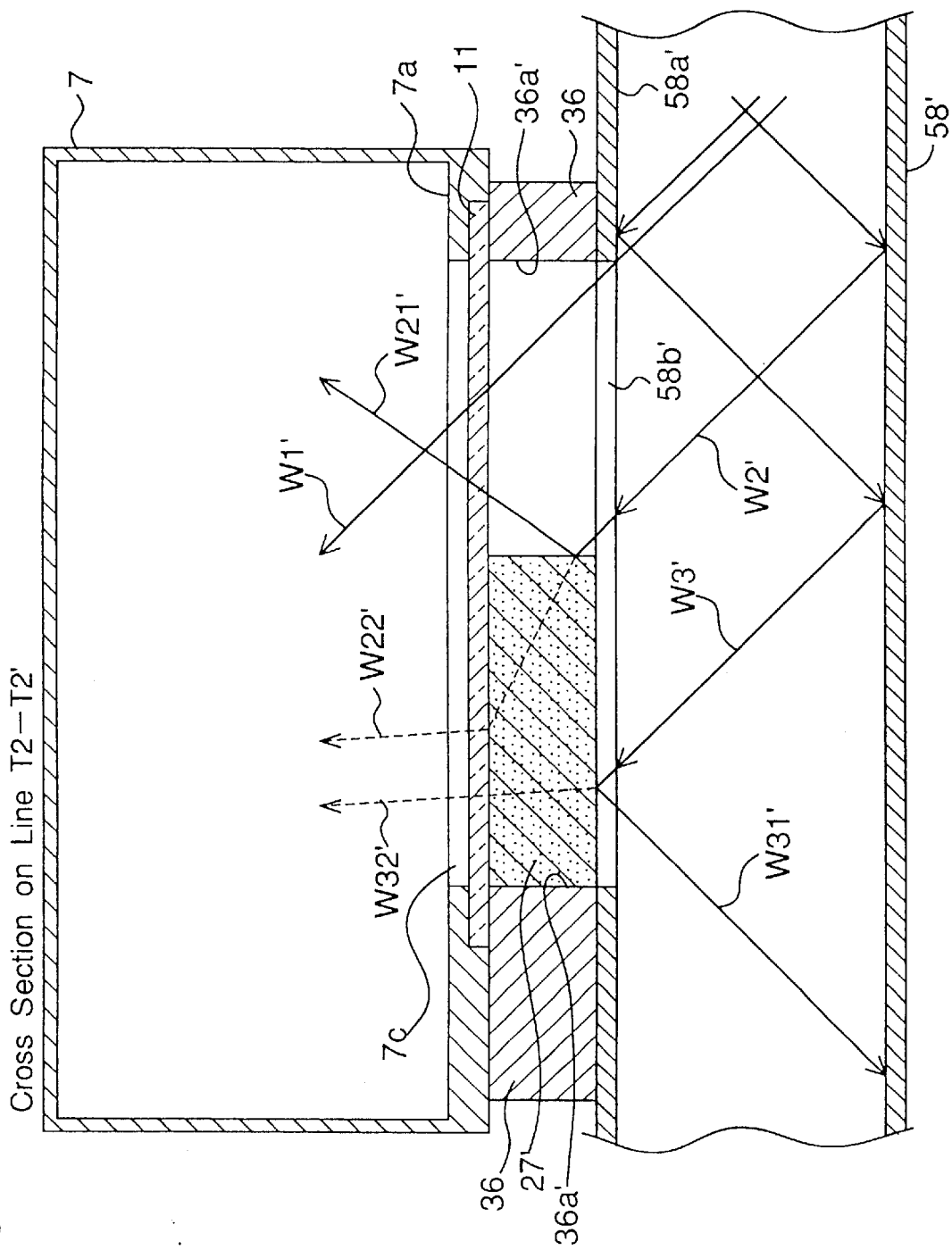
FIG. 29 is a cross-sectional view taken along a line T2—T2' of FIG. 27.

FIG. 28 shows a cross-sectional view taken along a line T1—T1' of FIG. 27, and FIG. 29 shows a cross-sectional view taken along a line T2—T2' of FIG. 27. In the present preferred embodiment, solid dielectrics 27 and 27' are inserted in the microwave waveguides 36a and 36a', respectively, on the termination side of the rectangular waveguides 58 and 58' where the radiation field of the microwave is relatively strong. By selecting as the dielectrics 27 and 27' a substance that does not absorb the microwave as described before, the microwave is partly reflected by the dielectrics 27 and 27' and the remaining microwave is transmitted through the dielectrics 27 and 27' so as to reach the window 7c of the plasma chamber 7.

Since the microwave propagates in an inclined or skew direction in the interior of the rectangular waveguides 58 and 58940 , the radiation field of microwave in the plasma chamber 7 results in a distribution showing higher intensities on the termination side of the rectangular waveguides 58 and 58'. Advantageous effects produced by inserting the dielectrics 27 and 27' at positions where the electric field intensity of the microwave is relatively strong are described below for the upper microwave waveguide 36a and the lower microwave waveguide 36a' separately.

In the upper microwave waveguide 36a, as shown in FIG. 28, a microwave W2 is reflected by the dielectric 27, the reflected microwave becomes a microwave W21, while the remaining microwave is transmitted through the dielectric 27 so as to become a microwave W22. The microwave W21 acts to intensify the originally weak portions of the microwave within the plasma chamber 7, whereas the microwave W22, conversely, has been attenuated to a microwave power less than that of the microwave W2, acting to weaken the originally strong portions of the microwave in the plasma chamber 7. This being the case also with the microwave W3, a microwave W31 reflected by the dielectric 27 is further reflected by the movable short-circuit plate provided in the terminating portion of the rectangular waveguide 58, and then the reflected microwave is finally supplied to the plasma chamber 7. On the other hand, a microwave W32 transmitted by the dielectric 27 has been attenuated to a less microwave power, like the microwave W22, so that the microwave W32 acts to weaken the originally strong portions of the microwave. Therefore, the distribution of the electric field of the microwave radiated into the plasma chamber 7 is a distribution shown by a broken line of FIG. 30, which is more uniform than that of when the dielectric 27 is not inserted.

In the lower microwave waveguide 36a', as shown in FIG. 29, a microwave W2' is reflected by the dielectric 27, the reflected microwave becomes a microwave W21', while the remaining microwave is transmitted through the dielectric so as to become a microwave W22'. The microwave W21' acts to intensify the originally weak portions of the microwave within the plasma chamber 7, whereas the microwave W22', conversely, has been attenuated to a microwave power less than that of the microwave W2', acting to weaken the originally strong portions of the microwave in the plasma chamber 7. This being the case also with the microwave W3', a microwave W31' reflected by the dielectric 27' is further reflected by the movable short-circuit plate provided in the terminating portion of the rectangular waveguide 58', and the reflected microwave is finally supplied to the plasma chamber 7. On the other hand, the microwave W32' transmitted through the dielectric 27' has been attenuated to a less microwave power, like the microwave W22', so that the microwave acts to weaken the originally strong portions of the microwaves. Therefore, the distribution of the electric field intensity of the microwaves radiated into the plasma chamber 7 is a distribution shown by a one-dotted chain line of FIG. 30, more uniform than that when the dielectric 27' is not inserted.

Figure 30:
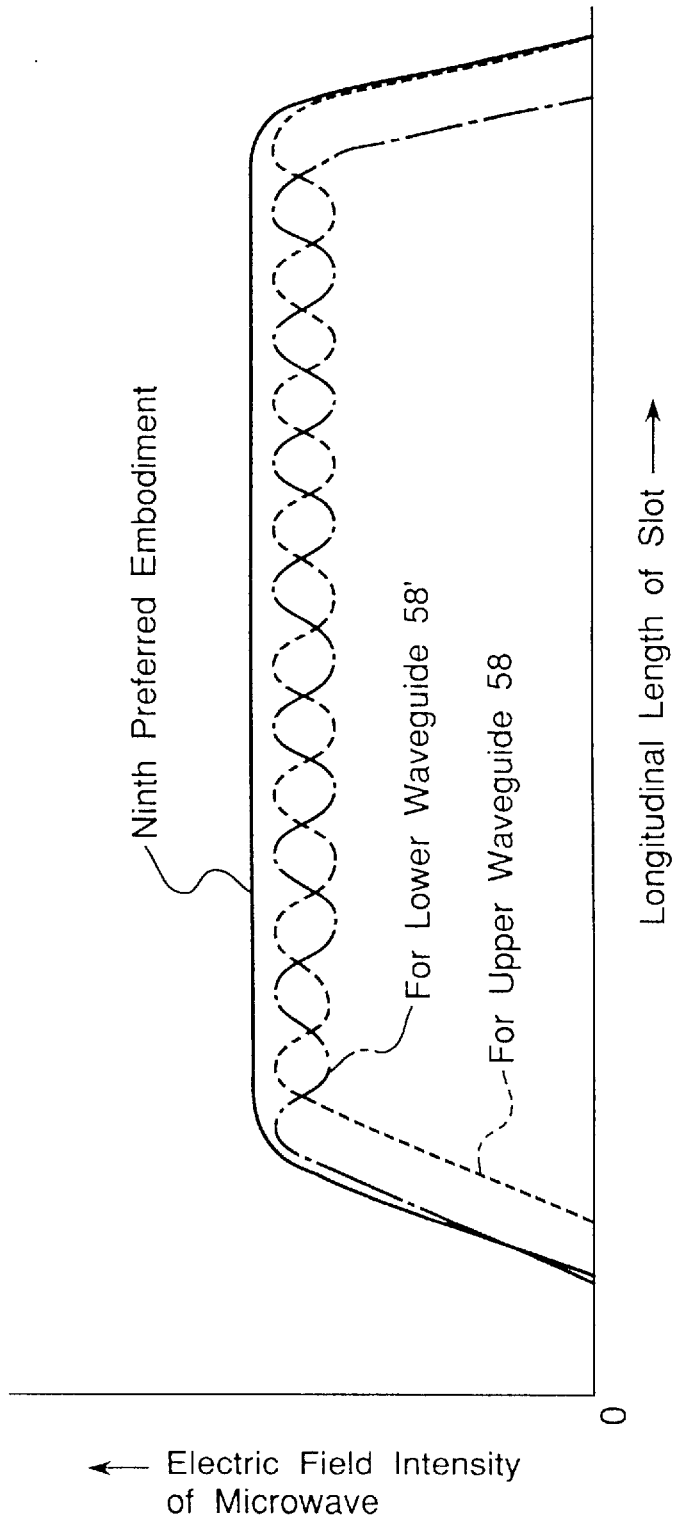
FIG. 30 is a graph showing an electric field intensity of a microwave relative to a longitudinal length of each of long slots in the plasma processing apparatus of FIG. 27.

Further, since the long slots 58b and 58b' provided in the rectangular waveguides 58 and 58', respectively, are shifted in the waveguide-axis direction from each other by $(1/2)\lambda_0$ or $(3/4)\lambda_0$, the resultant electric field distribution of the microwaves is substantially uniform in the waveguide-axis direction as shown by a solid line of FIG. 30.

<Tenth Preferred embodiment>

Figure 31:
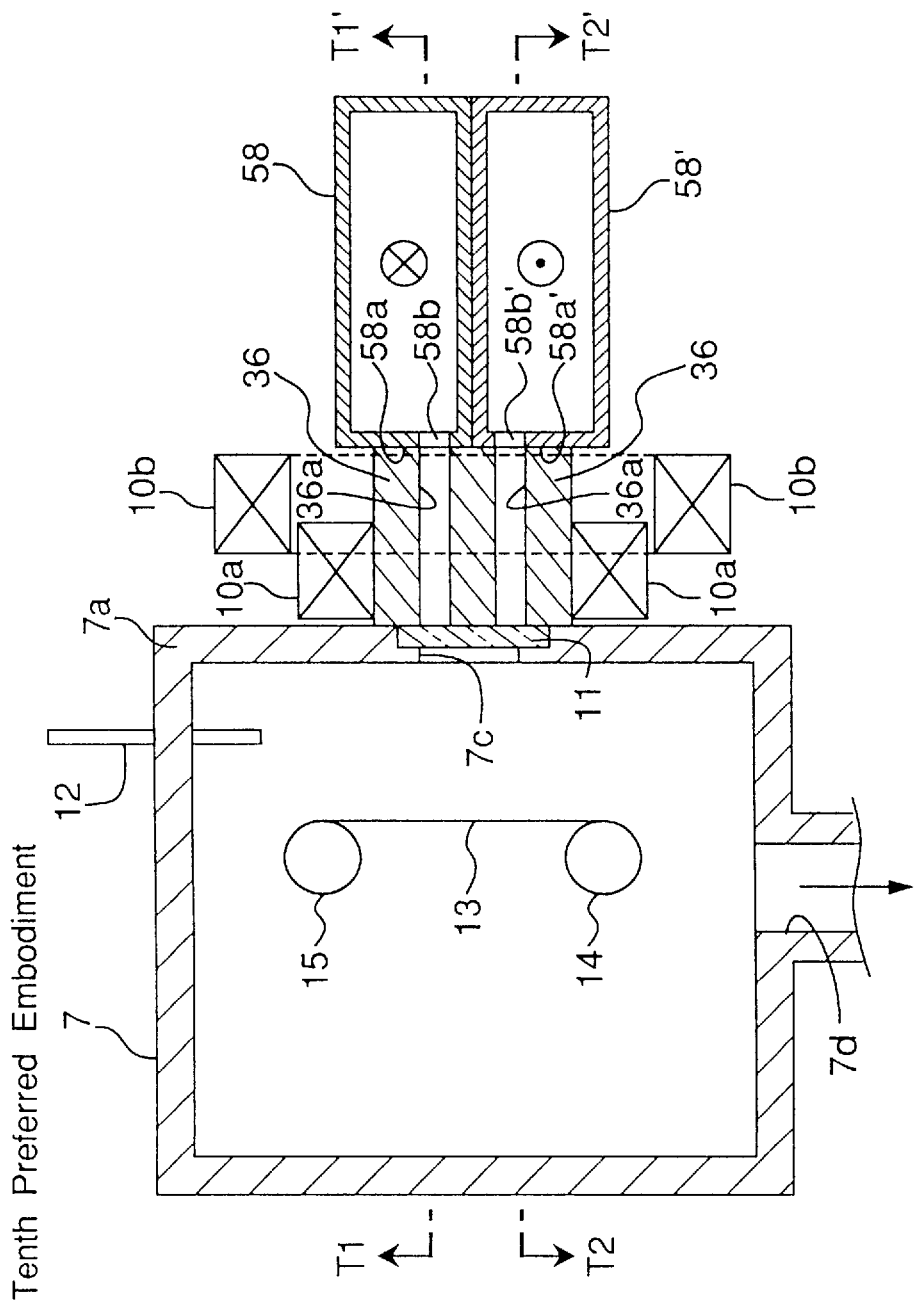
FIG. 31 is a cross-sectional view corresponding to FIGS. 23 and 27, showing a plasma processing apparatus of a tenth preferred embodiment according to the present invention.
Figure 32:
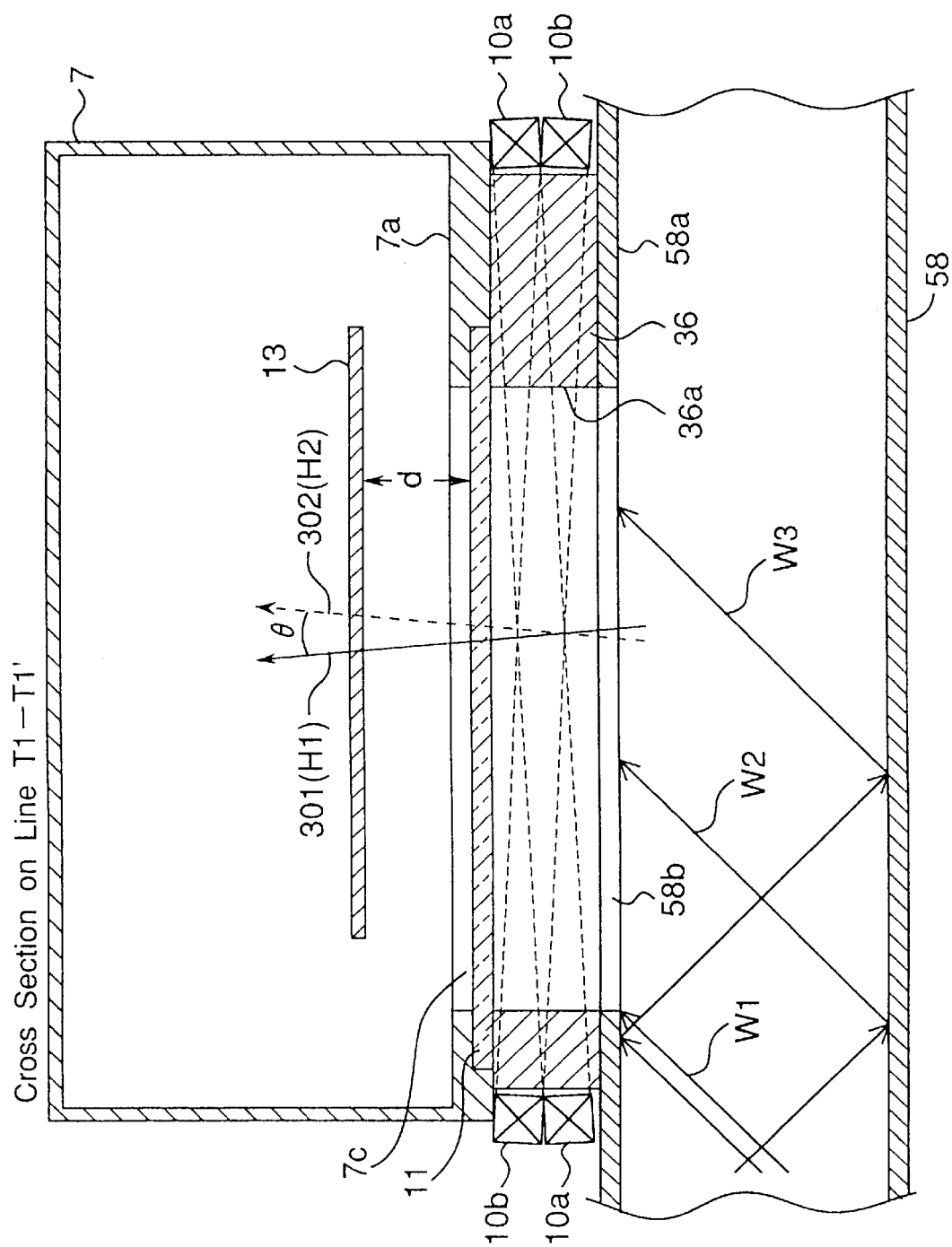
FIG. 32 is a cross-sectional view taken along a line T1—T1' of FIG. 31.
Figure 33:
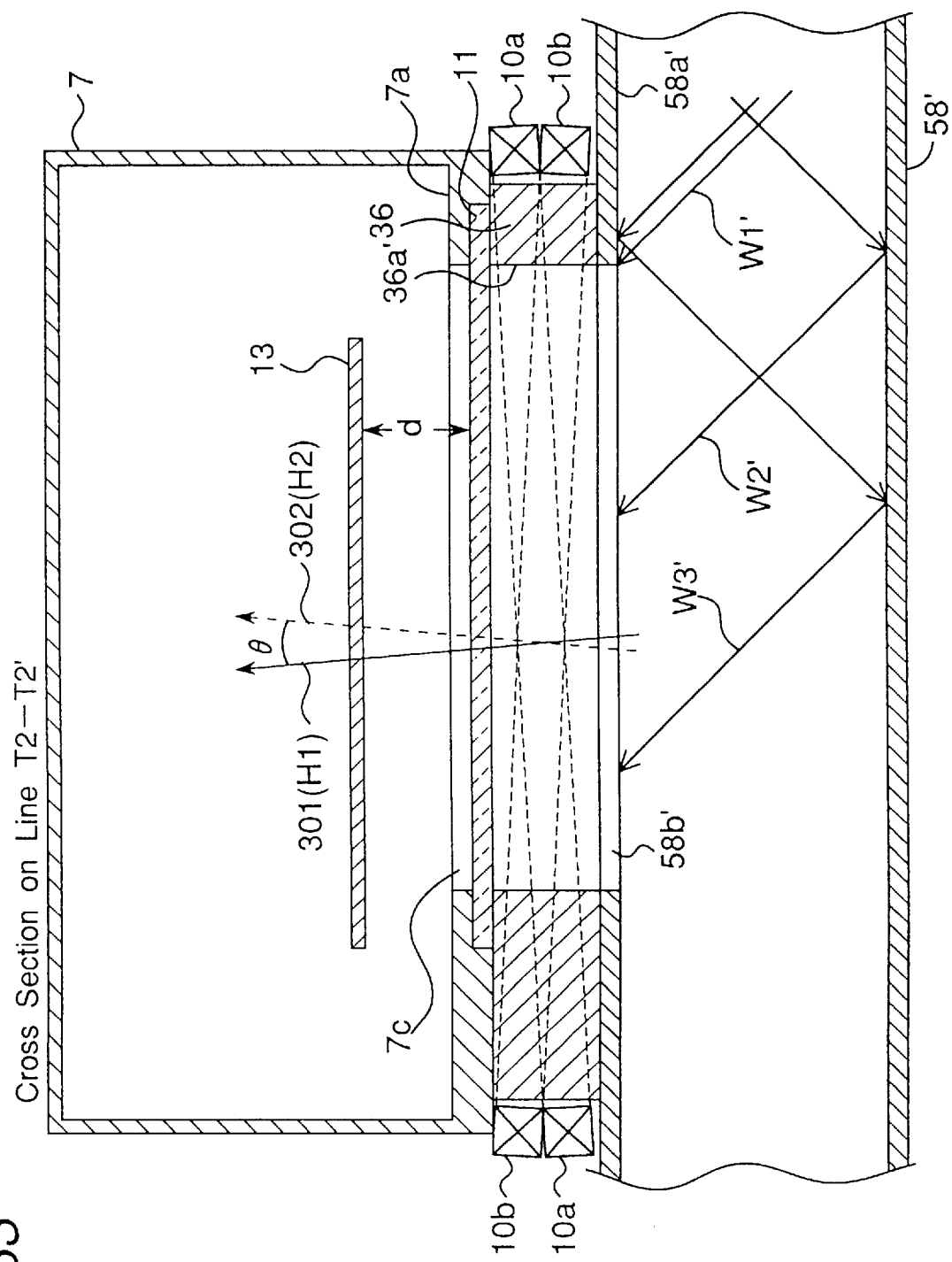
FIG. 33 is a cross-sectional view taken along a line T2—T2' of FIG. 31.

FIG. 31 is a schematic construction view showing a tenth preferred embodiment according to the present invention in which the second preferred embodiment and the eighth preferred embodiment are combined together. Rectangular waveguides 58 and 58', a microwave waveguide forming member 36, and a plasma chamber 7 are arranged in the same way as that in the second preferred embodiment, except for magnetic-field generators designated by 10a and 10b. FIGS. 32 and 33 show a cross-sectional view taken along the line T1—T1' of FIG. 31 and a cross-sectional view taken along the line T2—T2' of FIG. 31, respectively.

The magnetic-field generators 10a and 10b each comprise an air-core coil connected to a power supply, and are provided so as to surround the microwave waveguides 36a and 36a' in such a state that the center axes of the aircore coils of the magnetic-field generators 10a and 10b are intersected by each other by θ (rad). For example, when currents having different phases by 90° from each other and being half-wave-rectified are supplied to the magnetic-field generators 10a and 10b, a magnetic field whose magnitude is a constant and whose lines of magnetic force continuously change from a solid line 301 (H1) to broken line 302 (H2), that is, an oscillating magnetic field can be developed to a space between the window 7c of the plasma chamber 7 and the object 13 to be processed. Electrons and ions in the plasma generated within the plasma chamber 7 are supplied to the object 13 under constraint by these lines of magnetic force. That is, by changing the lines of magnetic force with time and space, non-uniform plasma can be projected in an evenly equal amount of plasma radiation onto the object 13 to be processed, and then, the uniformity of plasma processing can be further improved.

Taking into consideration the fact that the interval between peaks and valleys of radiation electric field intensities of the microwaves radiated from the long slots 58b and 58b' to the plasma chamber 7 is $\lambda_0/4$, in order that high and low plasma densities due to the abovementioned radiation electric fields of the microwaves are complemented by each other by the action of oscillating magnetic fields by means of the magnetic-field generators 10a and 10b, the angle θ (rad) formed by the center axes of the magnetic-field generators 10a and 10b is preferably set so as to meet the following relational equation:

$$d\theta \approx \lambda_0/2 \qquad (1),$$

where d is the distance from the microwave transmitting window 11 to the object 13 to be processed, and $\lambda_0$ is the free-space wavelength of the microwave.

Figure 34:
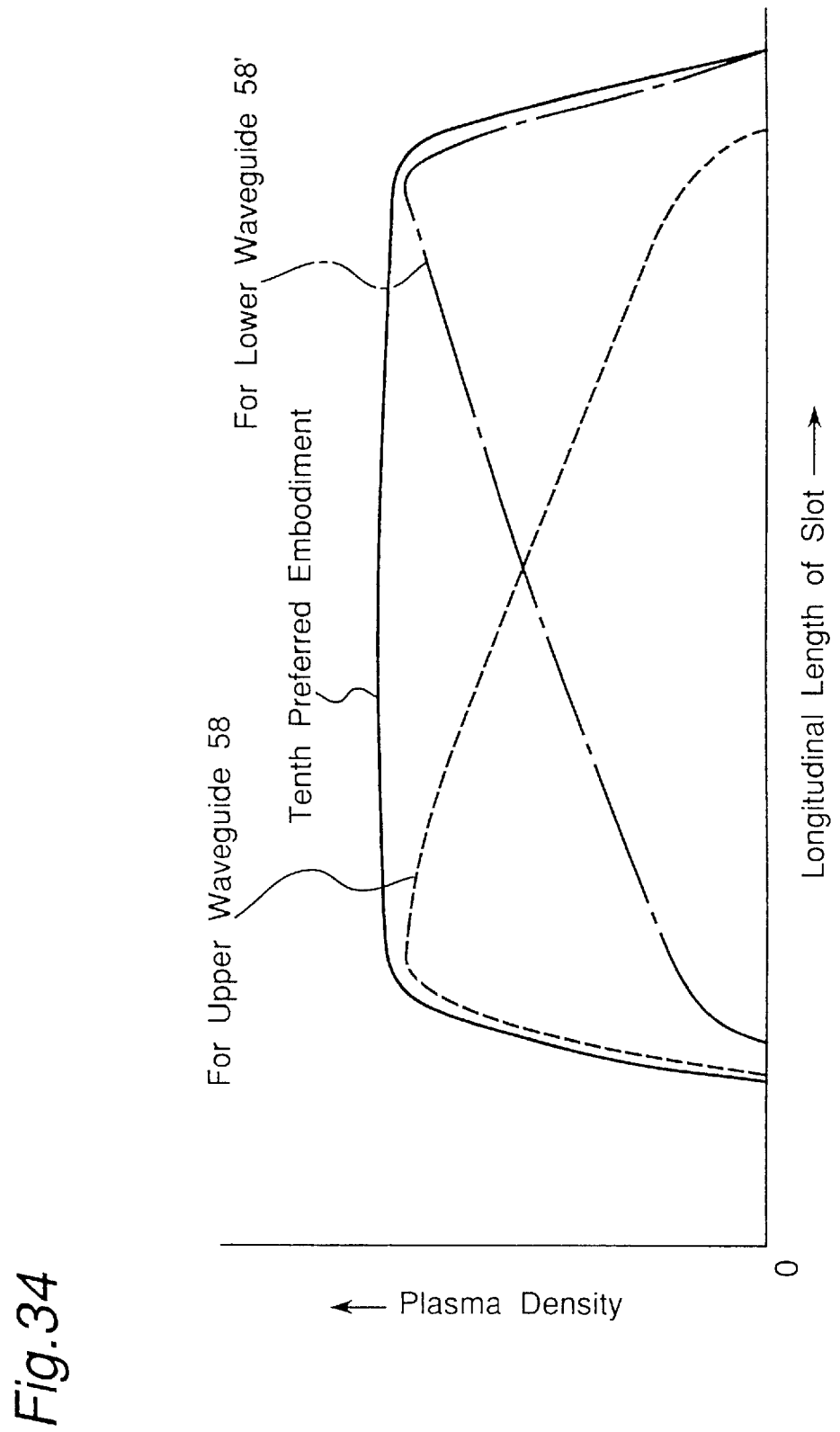
FIG. 34 is a graph showing a plasma density relative to a longitudinal length of each of long slots in the plasma processing apparatus of FIG. 31.
Figure 35:
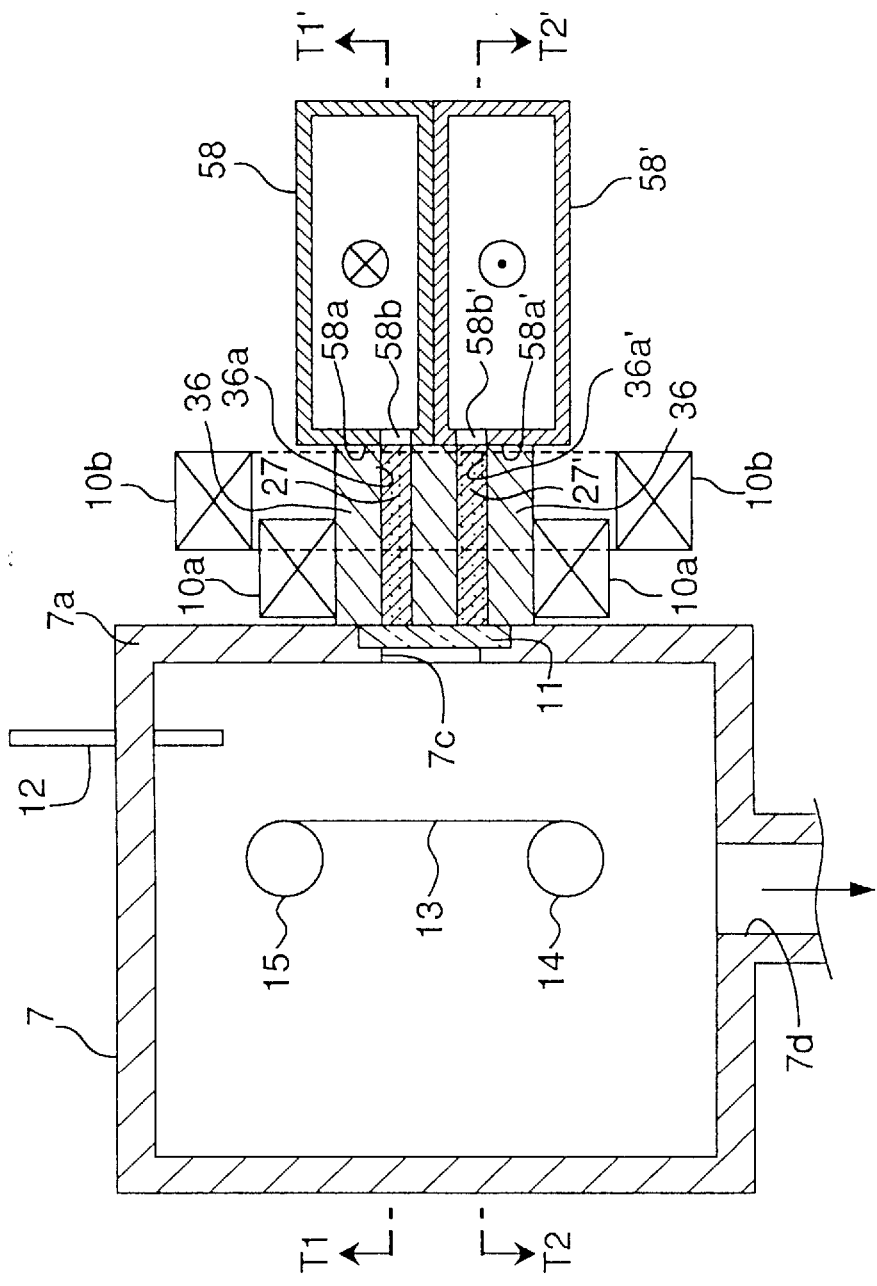
FIG. 35 is a cross-sectional view corresponding to FIGS. 23, 27 and 31, showing a plasma processing apparatus of an eleventh preferred embodiment according to the present invention.

Referring to FIGS. 34 and 35, a plasma density distribution due to a microwave radiated from the long slot 58b of the upper rectangular waveguide 58 and an oscillating magnetic field is shown by a broken line, and a plasma density distribution due to a microwave radiated from the long slot 58b' of the lower rectangular waveguide 58' and an oscillating magnetic field is shown by a one-dot chain line. Further, a plasma density distribution as a result of the present preferred embodiment using the two long slots 58b and 58b' is shown by a solid line. As is apparent from FIG. 34, a plasma density distribution which is more uniform along the longitudinal direction of the plasma chamber 7 can be obtained.

<Eleventh Preferred embodiment>

FIG. 35 is a schematic construction view of a plasma processing apparatus of an eleventh preferred embodiment according to the present invention in which the second preferred embodiment, the fifth preferred embodiment, and the eighth preferred embodiment are combined together.

A microwave waveguide forming member 36 electrically connects the rectangular waveguides 58 and 58' with the plasma chamber 7, and the cross section of each of the microwave waveguides 36a and 36a' is a narrow rectangular shape, which is identical to that of the long slots 58b and 58b'.

In the microwave waveguides 36a and 36a', solid dielectrics 27 and 27' are inserted on the termination side of the rectangular waveguides 58 and 58', respectively, where the radiation electric field intensities of the microwave are relatively strong. The dielectrics 27 and 27' are constructed and arranged in the same way as that in the fifth preferred embodiment.

The magnetic-field generators 10a and 10b each comprise an air-core coil connected to a power supply, and are provided so as to surround the microwave waveguides 36a and 36a' such that the center axes of the generators 10a and 10b are intersected by each other by θ (rad). The magnetic-field generators 10a and 10b are used for attaining more uniformity of the plasma density distribution. The principle for making the plasma density uniform and the method of setting the angle θ (rad) effective to the uniformity are similar to those in the eighth preferred embodiment.

A plasma density distribution obtained by the present preferred embodiment is similar to the distribution shown by a solid line of FIG. 34. Thus, a plasma density distribution with a good uniformity can be obtained.

<Twelfth Preferred embodiment>

Figure 36:
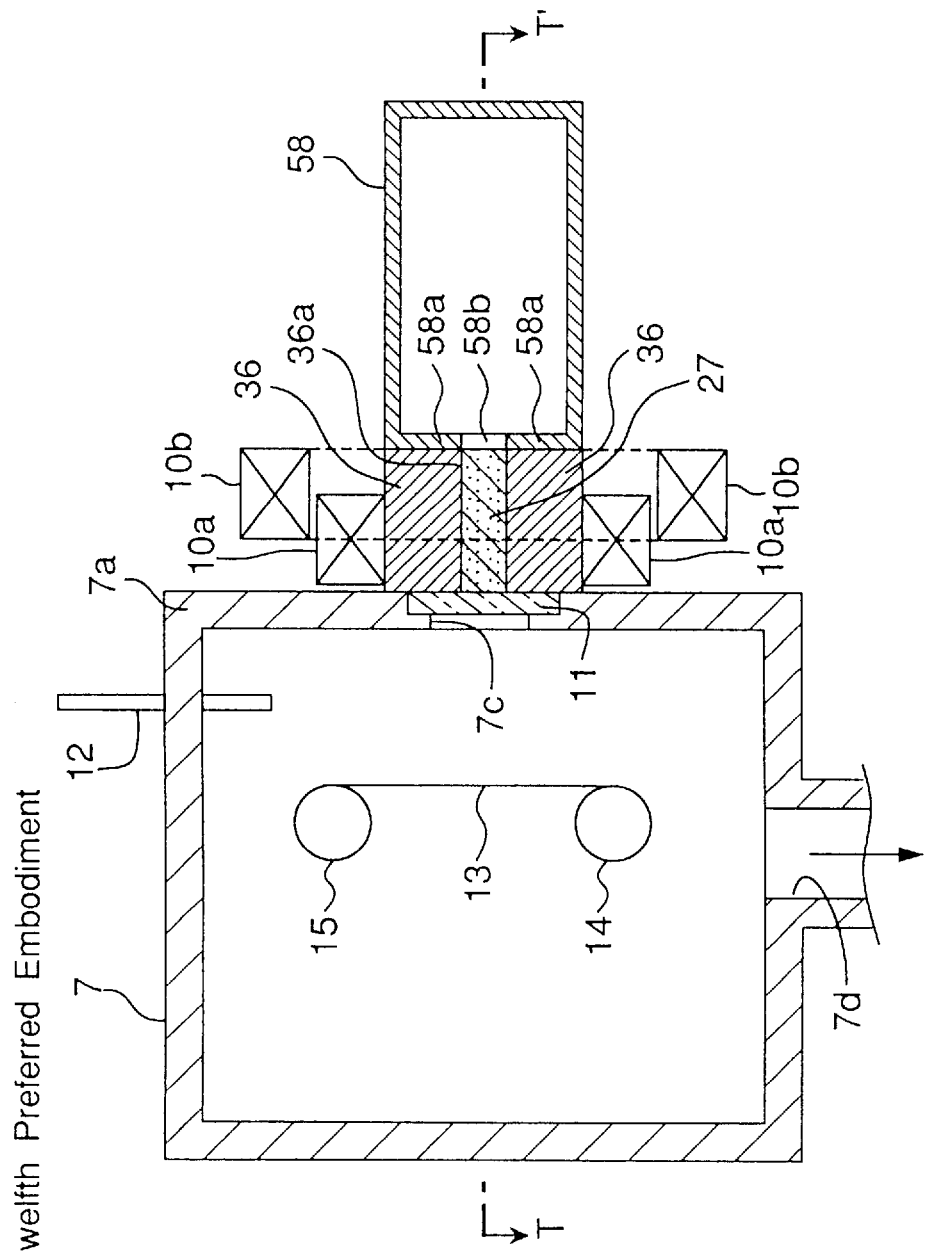
FIG. 36 is a cross-sectional view corresponding to FIGS. 23, 27, 31 and 35, showing a plasma processing apparatus of a twelfth preferred embodiment according to the present invention.

FIG. 36 is a longitudinal cross-sectional view of a plasma chamber 7 and a rectangular waveguide 58 for coupling with the plasma chamber 7, showing a twelfth preferred embodiment according to the present invention, in which the fifth preferred embodiment and the eighth preferred embodiment are combined together.

Referring to FIG. 36, a microwave is introduced to the rectangular waveguide 58 from a microwave power supply through an isolator, a directional coupler, an automatic impedance matching device, and a corner rectangular waveguide. Further, a terminating unit equipped with a movable short-circuit plate is provided at a terminating end of the rectangular waveguide 58. A microwave circuit of this twelfth preferred embodiment has the same constitution as that of FIG. 1 showing the first preferred embodiment.

A microwave waveguide forming member 36 electrically connects the rectangular waveguide 58 with the plasma chamber 7, and the cross section of each of the microwave waveguide 36a is a narrow rectangular shape, which is identical to that of the long slot 58b.

Figure 37:
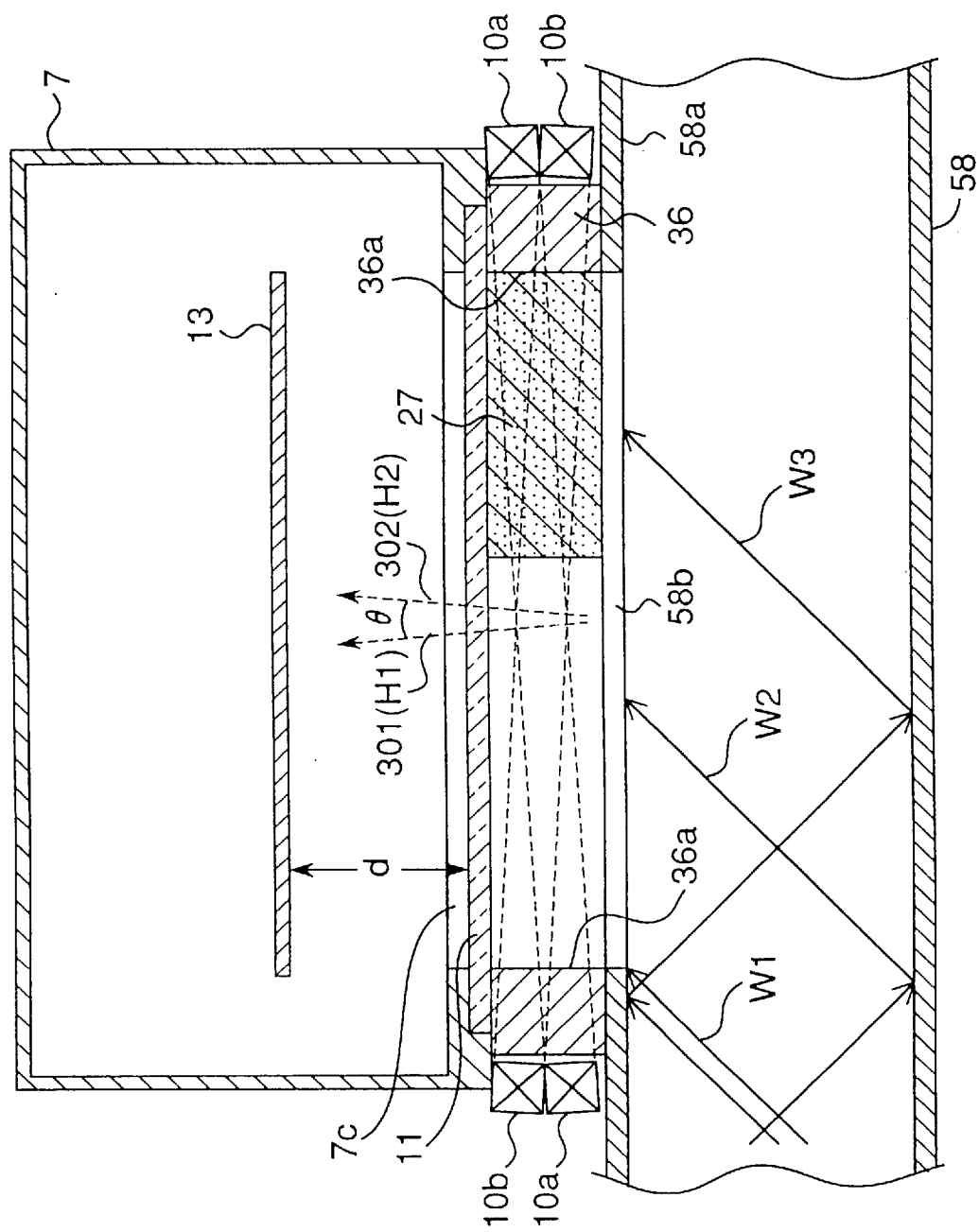
FIG. 37 is a cross-sectional view taken along a line T—T' of FIG. 36.

FIG. 37 is a cross-sectional view taken along a line T—T' of FIG. 36. A solid dielectric 27 is inserted into the microwave waveguide 36a at a portion where the radiation field of the microwave radiated toward the plasma chamber 7 is relatively strong, that is, on the termination side of the rectangular waveguide 58. By selecting as the dielectric 27 a substance that does not absorb the microwave as described before, a microwave is partly reflected by the dielectric 27, while the remaining microwave is transmitted through the dielectric 27 so as to reach the window 7c of the plasma chamber 7. Therefore, the dielectric 27 functions to intensify the originally weak portions of the microwaves in the plasma chamber 7 and to weaken the originally strong portions of the microwaves. The principle for obtaining a uniform electric field intensity distribution of the microwaves in the plasma chamber 7 by the insertion of the dielectric 27 is the same as that in the fifth preferred embodiment.

The magnetic-field generators 10a and 10b each comprise an air-core coil connected to a power supply, and are provided on the outer periphery of the microwave waveguide 36a in such a state that the center axes of the generators 10a and 10b are intersected by each other by θ (rad). For example, when currents having different phases by 90° from each other and being half-wave-rectified as predetermined in the eighth preferred embodiment are passed through the magnetic-field generators 10a and 10b, a magnetic field whose magnitude is a constant and whose lines of magnetic force continuously change from a solid line 301 (H1) to a broken line 302 (H2), that is, an oscillating magnetic field can be developed to a space between the window 7c of the plasma chamber 7 and the object 13 to be processed. Electrons and ions in the plasma generated within the plasma chamber 7 are supplied to the object 13 under constraint by these lines of magnetic force. That is, by changing the lines of magnetic force with time and space, non-uniform plasma can be projected in an evenly equal amount of plasma radiation onto the object 13 to be processed, and then the uniformity of plasma processing can be further improved.

Figure 38:
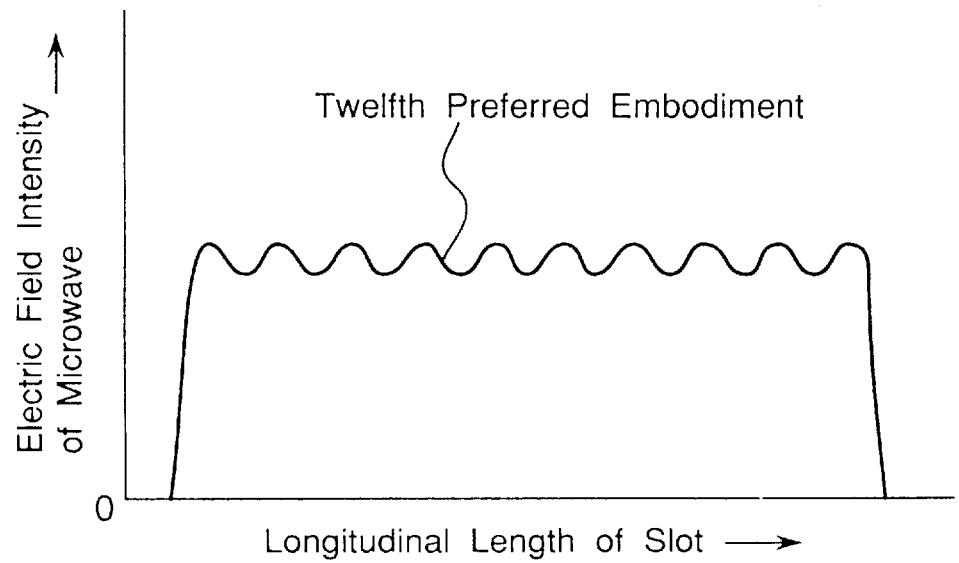
FIG. 38 is a graph showing an electric field intensity of a microwave relative to a longitudinal length of each of long slots in the plasma processing apparatus of FIG. 36.

FIG. 38 shows an electric field intensity of a microwave radiated to the plasma chamber 7. As shown in FIGS. 35 and 38, taking into consideration the fact that the interval between peaks and valleys of the radiation field of the microwave radiated from the long slot 58b to the plasma chamber 7 is $\lambda_0/4$, in order that high and low plasma densities due to the above-mentioned radiation electric field of the microwave are complemented by each other by the action of the oscillating magnetic field due to the magnetic-field generators 10a and 10b, the angle θ (rad) formed by the center axes of the magnetic-field generators 10a and 10b is preferably set so as to meet the following relational equation:

$$d\theta \approx \lambda_0/2 \qquad (2),$$

where d is the distance from the microwave transmitting window 11 to the object 13 to be processed, and $\lambda_0$ is the free-space wavelength of the microwaves.

Figure 39:
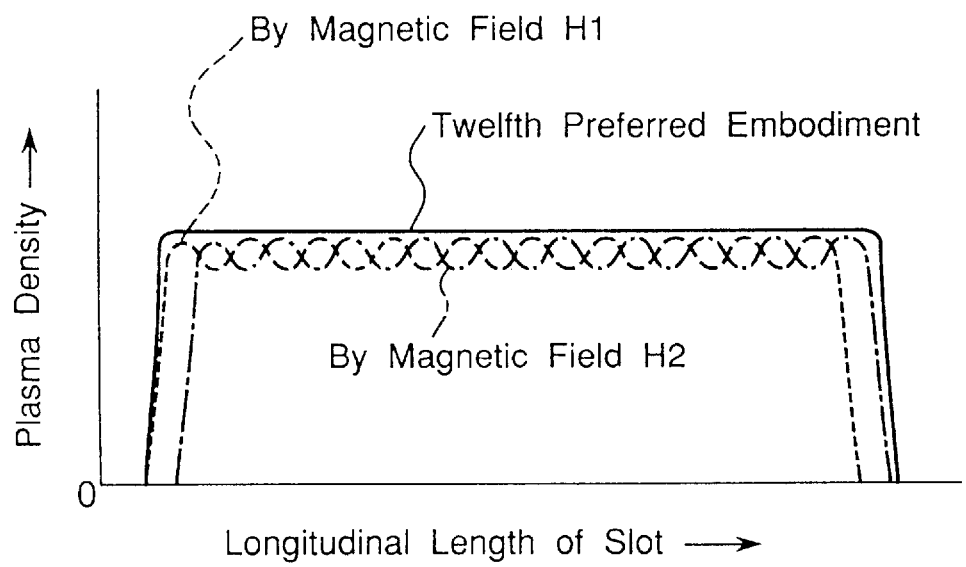
FIG. 39 is a graph showing a plasma density relative to a longitudinal length of each of long slots in the plasma processing apparatus of FIG. 36.

By the magnetic fields 301 (H1) and 302 (H2) of FIG. 37, plasma density distributions on the object 13 to be processed are shown by the broken line and the one-dot chain line of FIG. 39, respectively. Thus, by providing an oscillating magnetic field whose lines of magnetic force continuously change in direction, the resultant plasma density distribution can be leveled as shown by the solid line. Therefore, a uniform plasma density distribution can be obtained over the entire range or area of the object 13 to be processed.

<Other Preferred embodiments>

In the first preferred embodiment, the microwave is supplied to one end of the rectangular waveguide 18. However, the present invention is not limited to this, however, it may be possible that the terminating unit 19 connected to another end of the rectangular waveguide 18 is removed and, instead of this, another microwave power supply is also connected to another end thereof, and then the microwave is supplied to both ends of the rectangular waveguide 18. In this case, the same function and advantageous effects as those in the second preferred embodiment can be obtained.

In the first and second preferred embodiments, two long slots 18b and 18c or 28b and 28b' are provided in one rectangular waveguide 18 or two rectangular waveguides 28 and 28', respectively. However, the present invention is not limited to this, however, three or more long slots may be provided. In this case, adjacent long slots are positioned so as to be shifted from each other by $\{(2n-1)/4\}\lambda_0$ (where n is a natural number).

Further, three or more rectangular waveguides may be provided. In this case, adjacent long slots are positioned so as to be shifted from each other by $\{(2n-1)/4\}\lambda_0$ (where n is a natural number), and yet a microwave power supply, an isolator, a corner rectangular waveguide, a directional coupler, and an automatic impedance matching device are provided so that the microwaves are supplied to adjacent rectangular waveguides in directions different from each other and parallel to each other.

In the third preferred embodiment, two rectangular waveguides 38 and 38' are provided. However, the present invention is not limited to this, however, three or more rectangular waveguides may be provided.

In the fourth preferred embodiment, one rectangular waveguide 48 is provided. However, the present invention is not limited to this, however, two or more rectangular waveguides may be provided.

In the ninth to eleventh preferred embodiments, one long slot is provided in one rectangular waveguide. However, the present invention is not limited to this, however, two or more long slots may be also provided in one rectangular waveguide. Further, in such a case, the number of rectangular waveguides may be three or more.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing apparatus comprising:

a plasma chamber having a narrow window formed in a side wall thereof, an object to be processed being provided inside said narrow window;

a rectangular waveguide for coupling with said plasma chamber, said rectangular waveguide having a long slot disposed in an E-plane thereof so as to oppose to said narrow window of said plasma chamber and to extend along a waveguide-axis direction of said rectangular waveguide, said rectangular waveguide being provided so that the waveguide-axis direction of said rectangular waveguide is parallel to a longitudinal direction of said narrow window of said plasma chamber; and microwave power supply means for supplying a microwave to said rectangular waveguide, wherein the microwave is radiated from said rectangular waveguide to said plasma chamber through said long slot, said plasma processing apparatus being characterized in further comprising:

at least two said long slots disposed in at least one said rectangular waveguide;

wherein the longitudinal length of said each long slot is set to ½ or more of a free-space wavelength of the microwave; and wherein said long slots are disposed so as to be parallel to each other such that adjacent said long slots are shifted from each other by (2n-1)/4 of the free-space wavelength of the microwave in the waveguide-axis direction of said rectangular waveguide, where n is a natural number.

2. The plasma processing apparatus as claimed in claim 1, comprising:

at least two said rectangular waveguides each having at least one said long slot; and further microwave power supply means for supplying a microwave to another one of said rectangular waveguides in a direction different from the direction of one of said rectangular waveguides adjacent to the another one of said rectangular waveguides.

3. The plasma processing apparatus as claimed in claim 2, wherein each of said long slots is a slot array composed of a plurality of sub-slots disposed by equally dividing said long slot in the waveguide-axis direction of said rectangular waveguide, said plasma processing apparatus further comprising:

a terminating unit provided at a terminating end of said rectangular waveguides and having a movable short-circuit plate provided so as to move along the waveguide-axis direction of said rectangular waveguide, wherein said movable short-circuit plate is positioned so that center portions of peaks of a voltage standing wave generated in said rectangular waveguides are coincident with longitudinal center portions of said sub-slots, respectively.

4. The plasma processing apparatus as claimed in claim 1, further comprising:

one said rectangular waveguide having one long slot, said long slot being a slot array composed of a plurality of sub-slots disposed by equally dividing said long slot in the waveguide-axis direction of said rectangular waveguide; and a terminating unit provided at a terminating end of said rectangular waveguide and having a movable short-circuit plate provided so as to move along the waveguide-axis direction of said rectangular waveguide, wherein said movable short-circuit plate is positioned so that center portions of peaks of a voltage standing wave generated in said rectangular waveguide are coincident with longitudinal center portions of said sub-slots, respectively.

5. A plasma processing apparatus comprising:

a plasma chamber having a narrow window disposed in a side wall thereof, an object to be processed being provided inside said narrow window;

a rectangular waveguide for coupling with said plasma chamber, said rectangular waveguide having a long slot disposed in an E-plane thereof so as to oppose to said narrow window of said plasma chamber and to extend along a waveguide-axis direction of said rectangular waveguide, said rectangular waveguide being provided so that the waveguide-axis direction of said rectangular waveguide is parallel to a longitudinal direction of said narrow window of said plasma chamber; and microwave power supply means for supplying a microwave to said rectangular waveguide, wherein the microwave is radiated from the rectangular waveguide to said plasma chamber through said long slot, said plasma processing apparatus being characterized in that:

a longitudinal length of said long slot is set to ½ or more of a free-space wavelength of the microwave, said plasma processing apparatus further comprising:

a microwave waveguide forming member provided between said long slot and said narrow window of said plasma chamber, said microwave waveguide forming member having a microwave waveguide having a cross section identical to an opening shape of said long slot; and a dielectric made of a material that does not absorb any microwave, said dielectric being inserted into said microwave waveguide at a position near a terminating end of said rectangular waveguide along the waveguide-axis direction of said rectangular waveguide, said dielectric reflecting a part of the microwave and transmitting another part of the microwave.

6. The plasma processing apparatus as claimed in claim 5, wherein the length of said dielectric in the longitudinal direction of said long slot is set to n/2 of a free-space wavelength of the microwave where n is a natural number, and wherein an insertion length of said dielectric into said microwave waveguide is set by adjusting a microwave transmittance coefficient of said dielectric so that an electric field intensity of the microwave along the longitudinal direction of said plasma chamber becomes substantially uniform.

7. A plasma processing apparatus comprising:

a plasma chamber having a narrow window disposed in a side wall thereof, an object to be processed being provided inside said narrow window;

a rectangular waveguide for coupling with said plasma chamber, said rectangular waveguide having a long slot disposed in an E-plane thereof so as to oppose to said narrow window of said plasma chamber and to extend along a waveguide-axis direction of said rectangular waveguide, said rectangular waveguide being provided so that the waveguide-axis direction of said rectangular waveguide is parallel to a longitudinal direction of said narrow window of said plasma chamber; and microwave power supply means for supplying a microwave to said rectangular waveguide, wherein the microwave is radiated from the rectangular waveguide to said plasma chamber through said long slot, said plasma processing apparatus being characterized in that:

a longitudinal length of said long slot is set to ½ or more of a free-space wavelength of the microwave, said plasma processing apparatus further comprising:

a movable short-circuit plate provided at a terminating end of said rectangular waveguide so as to move along the waveguide-axis direction of said rectangular waveguide over a length of ½ or more of a guide wavelength of the microwave; and movement driving means for moving said movable short-circuit plate periodically or non-periodically along the waveguide-axis direction of said rectangular waveguide.

8. A plasma processing apparatus comprising:

a plasma chamber having a narrow window disposed in a side wall thereof, an object to be processed being provided inside said narrow window;

a rectangular waveguide for coupling with said plasma chamber, said rectangular waveguide having a long slot disposed in an E-plane thereof so as to oppose to said narrow window of said plasma chamber and to extend along a waveguide-axis direction of said rectangular waveguide, said rectangular waveguide being provided so that the waveguide-axis direction of said rectangular waveguide is parallel to a longitudinal direction of said narrow window of said plasma chamber; and microwave power supply means for supplying a microwave to said rectangular waveguide, wherein the microwave is radiated from the rectangular waveguide to said plasma chamber through said long slot, said plasma processing apparatus being characterized in that:

a longitudinal length of said long slot is set to ½ or more of a free-space wavelength of the microwave, said plasma processing apparatus further comprising:

a movable slot plate having an opening having a length shorter than a longitudinal length of said long slot in the waveguide-axis direction and having a width equal to a width of said long slot, said movable slot plate being disposed in a space between said long slot of said rectangular waveguide and said narrow window of said plasma chamber so as to move along the waveguide-axis direction of said rectangular waveguide so that said opening opposes to said long slot; and movement driving means for moving said movable slot plate periodically or non-periodically over a length of ½ or more of the free-space wavelength of the microwave.

9. A plasma processing apparatus comprising:

a plasma chamber having a narrow window disposed in a side wall thereof, an object to be processed being provided inside said narrow window;

a rectangular waveguide for coupling with said plasma chamber, said rectangular waveguide having a long slot disposed in an E-plane thereof so as to oppose to said narrow window of said plasma chamber and to extend along a waveguide-axis direction of said rectangular waveguide, said rectangular waveguide being provided so that the waveguide-axis direction of said rectangular waveguide is parallel to a longitudinal direction of said narrow window of said plasma chamber; and microwave power supply means for supplying a microwave to said rectangular waveguide, wherein the microwave is radiated from the rectangular waveguide to said plasma chamber through said long slot, said plasma processing apparatus being characterized in that:

a longitudinal length of said long slot is set to ½ or more of a free-space wavelength of the microwave, said plasma processing apparatus further comprising:

magnetic-field generating means for generating a magnetic field in a space between said object provided in said plasma chamber and said narrow window, and for changing a direction and an intensity of the generated magnetic field.

10. The plasma processing apparatus as claimed in claim 2, further comprising:

a microwave waveguide forming member provided between each said long slot and said narrow window of said plasma chamber and having at least two microwave waveguides each having a cross section identical to an opening shape of each said long slot; and a dielectric made of a material that does not absorb any microwave, and said dielectric being inserted into each of said microwave waveguides at a position near a terminating end of each of said rectangular waveguides along the waveguide-axis direction of said rectangular waveguide, said dielectric reflecting a part of the microwave and transmitting another part of the microwave, wherein the length of each said dielectric in the longitudinal direction of each said long slot is set to n/2 of a free-space wavelength of the microwave where n is a natural number, and wherein an insertion length of each said dielectric into each said microwave waveguide is set by adjusting a microwave transmittance coefficient of each said dielectric so that an electric field intensity of the microwave along the longitudinal direction of said plasma chamber becomes substantially uniform.

11. The plasma processing apparatus as claimed in claim 9, further comprising:

at least two said rectangular waveguides each having at least one said long slot; and further microwave power supply means for supplying a microwave to another one of said rectangular waveguides in a direction different from the direction of one of said rectangular waveguides adjacent to the another one of said rectangular waveguides, and wherein said long slots are disposed so as to be parallel to each other such that adjacent said long slots are shifted from each other by (2n-1)/4 of the free-space wavelength of the microwave in the waveguide-axis direction of said rectangular waveguide, where n is a natural number.

12. The plasma processing apparatus as claimed in claim 11, further comprising:

a microwave waveguide forming member provided between said long slot and said narrow window of said plasma chamber, said microwave waveguide forming member having a microwave waveguide having a cross section identical to an opening shape of said long slot; and a dielectric made of a material that does not absorb any microwave, said dielectric being inserted into said microwave waveguide at a position near a terminating end of said rectangular waveguide along the waveguide-axis direction of said rectangular waveguide, said dielectric reflecting a part of the microwave and transmitting another part of the microwave.

13. The plasma processing apparatus as claimed in claim 9, further comprising:

a microwave waveguide forming member provided between said long slot and said narrow window of said plasma chamber, said microwave waveguide forming member having a microwave waveguide having a cross section identical to an opening shape of said long slot; and a dielectric made of a material that does not absorb any microwave, said dielectric being inserted into said microwave waveguide at a position near a terminating end of said rectangular waveguide along the waveguide-axis direction of said rectangular waveguide, said dielectric reflecting a part of the microwave and transmitting another part of the microwave, wherein a length of said dielectric in the longitudinal direction of said long slot is set to n/2 of a free-space wavelength of the microwave where n is a natural number, and wherein an insertion length of said dielectric into said microwave waveguide is set by adjusting a microwave transmittance coefficient of said dielectric so that an electric field intensity of the microwave along the longitudinal direction of said plasma chamber becomes substantially uniform.

* * * * *